United States Patent
Sim et al.

(10) Patent No.: US 11,839,151 B2
(45) Date of Patent: *Dec. 5, 2023

(54) ORGANIC ELECTROLUMINESCENCE DEVICE AND FUSED POLYCYCLIC COMPOUND FOR ORGANIC ELECTROLUMINESCENCE DEVICE

(71) Applicant: Samsung Display Co., Ltd., Yongin-si (KR)

(72) Inventors: Mun-Ki Sim, Seoul (KR); Hankyu Pak, Suwon-si (KR); Seokhwan Hwang, Suwon-si (KR); Sun Young Pak, Suwon-si (KR); Junha Park, Gwacheon-si (KR); Jang Yeol Baek, Yongin-si (KR); Chanseok Oh, Seoul (KR); Hyoyoung Lee, Suwon-si (KR); Minjung Jung, Gangwon-do (KR)

(73) Assignee: Samsung Display Co., Ltd., Yongin-si (KR)

( * ) Notice: Subject to any disclaimer, the term of this patent is extended or adjusted under 35 U.S.C. 154(b) by 557 days.

This patent is subject to a terminal disclaimer.

(21) Appl. No.: 16/878,338

(22) Filed: May 19, 2020

(65) Prior Publication Data
US 2021/0050525 A1    Feb. 18, 2021

(30) Foreign Application Priority Data
Aug. 12, 2019    (KR) ........................ 10-2019-0098127

(51) Int. Cl.
| | |
|---|---|
| H10K 85/60 | (2023.01) |
| C07F 5/02 | (2006.01) |
| C09K 11/06 | (2006.01) |
| H10K 50/11 | (2023.01) |
| H10K 101/10 | (2023.01) |
| H10K 101/30 | (2023.01) |

(52) U.S. Cl.
CPC ............ *H10K 85/636* (2023.02); *C07F 5/02* (2013.01); *C07F 5/027* (2013.01); *C09K 11/06* (2013.01); *H10K 85/6572* (2023.02); *H10K 85/6576* (2023.02); *H10K 50/11* (2023.02); *H10K 2101/10* (2023.02); *H10K 2101/30* (2023.02)

(58) Field of Classification Search
CPC .................................. C07F 5/02; C07F 5/027
See application file for complete search history.

(56) References Cited

U.S. PATENT DOCUMENTS

| | | |
|---|---|---|
| 2015/0236274 A1 | 8/2015 | Hatakeyama et al. |
| 2016/0172602 A1 | 6/2016 | Ogiwara et al. |
| 2018/0366653 A1 | 12/2018 | He et al. |
| 2019/0027694 A1 | 1/2019 | Hatakeyama et al. |
| 2020/0203651 A1 | 6/2020 | Duan et al. |
| 2021/0126195 A1* | 4/2021 | Kuwabara ........... H01L 51/0072 |

FOREIGN PATENT DOCUMENTS

| | | | |
|---|---|---|---|
| CN | 109192874 A | | 1/2019 |
| JP | 2016-27606 | | 2/2016 |
| KR | 10-2016-0119683 A | | 10/2016 |
| KR | 10-2018-0108559 A | | 10/2018 |
| WO | WO 2020/242165 | * | 12/2020 |

OTHER PUBLICATIONS

Hertz et al., Boron-Containing Polycyclic Aromatic Hydrocarbons: Facile Synthesis of Stable, Redox-Active Luminophores**, Angew. Chem. Int. Ed. 2015, vol. 54, pp. 1-6.

Pershin, Anton et al.; "Highly emissive excitons with reduced exchange energy in thermally activated delayed fluorescent molecules"; Nature Communications; Feb. 5, 2019; 5pp.

* cited by examiner

*Primary Examiner* — Alicia L Otton
(74) *Attorney, Agent, or Firm* — Lewis Roca Rothgerber Christie LLP

(57) ABSTRACT

An organic electroluminescence device of an embodiment includes a first electrode and a second electrode which face each other, and a plurality of organic layers disposed between the first electrode and the second electrode. At least one organic layer selected from the plurality of organic layers includes a fused polycyclic compound represented by Formula 1, and thus the organic electroluminescence device can exhibit improved luminous efficiency.

21 Claims, 2 Drawing Sheets

[Formula 1]

ORGANIC ELECTROLUMINESCENCE DEVICE AND FUSED POLYCYCLIC COMPOUND FOR ORGANIC ELECTROLUMINESCENCE DEVICE

CROSS-REFERENCE TO RELATED APPLICATION

This application claims priority to and the benefit of Korean Patent Application No. 10-2019-0098127, filed on Aug. 12, 2019, the entire content of which is hereby incorporated by reference.

BACKGROUND

1. Field

One or more aspects of embodiments of the present disclosure relate to an organic electroluminescence device and a fused polycyclic compound used for the same, and for example, to a fused polycyclic compound used as a luminescence material and an organic electroluminescence device including the same.

2. Description of the Related Art

Organic electroluminescence displays are being actively developed as image displays. An organic electroluminescence display is so-called a self-luminescent display, different from a liquid crystal display, in which holes and electrons injected from a first electrode and a second electrode recombine in an emission layer, and a light emission material including an organic compound in the emission layer emits light to thereby attain display.

In the application of an organic electroluminescence device to a display, a low driving voltage, high luminous efficiency, and long service life of the organic electroluminescence device are desired, and continuous development of materials for the organic electroluminescence device that are capable of stably attaining these requirements is also desired.

Recently, technology using phosphorescent luminescence from energy in a triplet state, or delayed fluorescence emission according to a phenomenon that generates singlet excitons by colliding triplet excitons (Triplet-triplet annihilation, TTA) is being developed to implement a high-efficient organic electroluminescence display; and thermally activated delayed fluorescence (TADF) materials capable of delayed fluorescent luminescence phenomena are also being developed.

SUMMARY

One or more aspects of embodiments of the present disclosure are directed toward an organic electroluminescence device with improved luminous efficiency.

One or more aspects of embodiments of the present disclosure are directed toward a fused polycyclic compound that can improve the luminous efficiency of an organic electroluminescence device.

One or more example embodiments of the present disclosure provide an organic electroluminescence device including a first electrode, a second electrode facing the first electrode, and a plurality of organic layers disposed between the first electrode and the second electrode. At least one organic layer selected from the plurality of organic layers includes a fused polycyclic compound represented by Formula 1:

[Formula 1]

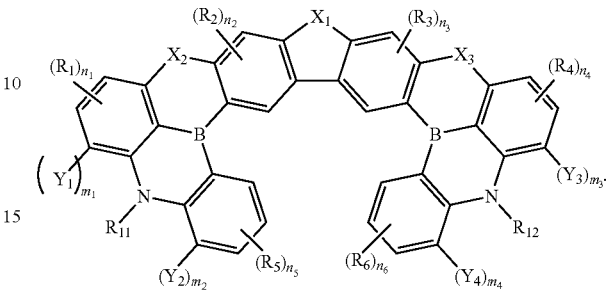

In Formula 1, $X_1$ to $X_3$ may each independently be $NR_9$, O, or S, $Y_1$ to $Y_4$ may each independently be a direct linkage, O, or S, $R_1$ to $R_6$ may each independently be a hydrogen atom, a deuterium atom, a halogen atom, a boron group, a phosphine oxide group, a cyano group, a substituted or unsubstituted amine group, a substituted or unsubstituted silyl group, a substituted or unsubstituted alkyl group having 1 to 20 carbon atoms, a substituted or unsubstituted aryl group having 6 to 60 carbon atoms to form a ring, or a substituted or unsubstituted heteroaryl group having 2 to 60 carbon atoms to form a ring, or may be combined with an adjacent group to form a ring, $R_{11}$ and $R_{12}$ may each independently be a substituted or unsubstituted alkyl group having 1 to 20 carbon atoms, a substituted or unsubstituted aryl group having 6 to 60 carbon atoms to form a ring, or a substituted or unsubstituted heteroaryl group having 2 to 60 carbon atoms to form a ring, or may be combined with an adjacent group to form a ring, $R_9$ may be a substituted or unsubstituted alkyl group having 1 to 20 carbon atoms, a substituted or unsubstituted aryl group having 6 to 60 carbon atoms to form a ring, or a substituted or unsubstituted heteroaryl group having 2 to 60 carbon atoms to form a ring, $n_1$ to $n_4$ may each independently be an integer of 0 to 2, $n_5$ and $n_6$ may each independently be an integer of 0 to 3, and $m_1$ to $m_4$ may each independently be 0 or 1.

In an embodiment, the organic layers may include a hole transport region disposed on the first electrode, an emission layer disposed on the hole transport region, and an electron transport region disposed on the emission layer. The emission layer may include a fused polycyclic compound represented by Formula 1.

The emission layer may be to emit delayed fluorescence.

The emission layer may be a delayed fluorescence emission layer including a host and a dopant. The dopant may include a fused polycyclic compound represented by Formula 1.

The emission layer may include a host having a first lowest triplet exciton energy level, a first dopant having a second lowest triplet exciton energy level lower than the first lowest triplet exciton energy level, and a second dopant having a third lowest triplet exciton energy level lower than the second lowest triplet exciton energy level, wherein the first dopant may include a fused polycyclic compound represented by Formula 1.

The first dopant may be a delayed fluorescence dopant. The second dopant may be a fluorescence dopant.

In Formula 1, at least one selected from $Y_1$ to $Y_4$ is a direct linkage, and when $Y_1$ is a direct linkage, $m_1$ may be 1, when $Y_2$ may be a direct linkage, $m_2$ may be 1, when $Y_3$ is a direct linkage, $m_3$ may be 1, and when $Y_4$ is a direct linkage, $m_4$ is 1.

In an embodiment, a fused polycyclic compound represented by Formula 1 may be represented by Formula 1-1:

[Formula 1-1]

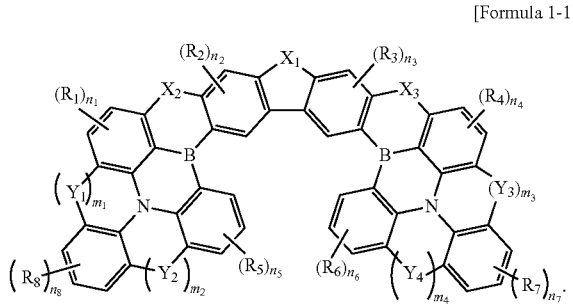

In Formula 1-1, $R_7$ and $R_8$ may each independently be a hydrogen atom, a deuterium atom, a halogen atom, a boron group, a phosphine oxide group, a cyano group, a substituted or unsubstituted amine group, a substituted or unsubstituted silyl group, a substituted or unsubstituted alkyl group having 1 to 20 carbon atoms, a substituted or unsubstituted aryl group having 6 to 60 carbon atoms to form a ring, or a substituted or unsubstituted heteroaryl group having 2 to 60 carbon atoms to form a ring, or may be combined with an adjacent group to form a ring, and $n_7$ and $n_8$ may each independently be an integer of 0 to 3. In Formula 1-1 $X_1$ to $X_3$, $Y_1$ to $Y_4$, $R_1$ to $R_6$, $n_1$ to $n_6$, and $m_1$ to $m_4$ may be the same as described in Formula 1.

The fused polycyclic compound represented by Formula 1-1 may be represented by Formula 2-1 or Formula 2-2.

[Formula 2-1]

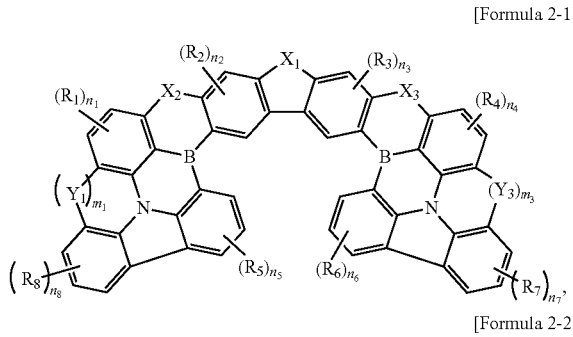

[Formula 2-2]

In Formula 2-1 and Formula 2-2, $X_1$ to $X_3$, $Y_1$ to $Y_4$, $R_1$ to $R_8$, $n_1$ to $n_8$, and $m_1$ to $m_4$ may be the same as described in Formula 1-1.

The fused polycyclic compound represented by Formula 1-1 may be represented by Formula 3-1 or Formula 3-2.

[Formula 3-1]

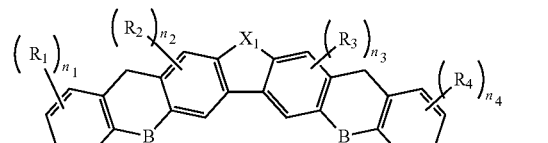

[Formula 3-2]

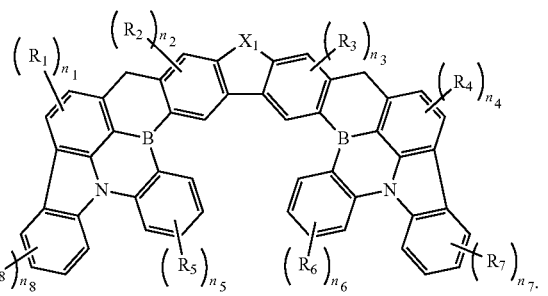

In Formula 3-1 and Formula 3-2, $X_1$ to $X_3$, $R_1$ to $R_8$, and $n_1$ to $n_8$ may be the same as described in Formula 1-1.

The fused polycyclic compound represented by Formula 1-1 may be represented by Formula 4:

[Formula 4]

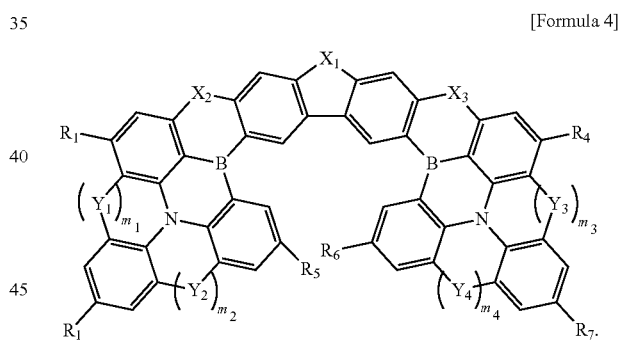

In Formula 4, $X_1$ to $X_3$, $Y_1$ to $Y_4$, $R_1$, $R_4$, and $m_1$ to $m_4$ may be the same as described in Formula 1-1.

In Formula 1, $X_2$ and $X_3$ may be the same, $Y_1$ and $Y_3$ may be the same, $Y_2$ and $Y_4$ may be the same, $m_1$ and $m_3$ may be the same, and $m_2$ and $m_4$ may be the same.

In Formula 1, when $X_1$ to $X_3$ are $NR_9$, $R_9$ may be a substituted or unsubstituted phenyl group.

In an embodiment, the first electrode and the second electrode may each independently include at least one selected from Ag, Mg, Cu, Al, Pt, Pd, Au, Ni, Nd, Ir, Cr, Li, Ca, LiF/Ca, LiF/Al, Mo, Ti, In, Sn, and Zn, a compound of two or more thereof, a mixture of two or more thereof, and an oxide thereof.

The fused polycyclic compound according to an embodiment of the inventive concept may be represented by Formula 1.

In the fused polycyclic compound represented by Formula 1, the absolute value of a difference between a lowest singlet exciton energy level (S1) and a lowest triplet exciton energy level (T1) may be 0.33 eV or less.

BRIEF DESCRIPTION OF THE DRAWINGS

The accompanying drawings are included to provide a further understanding of the inventive concept, and are incorporated in and constitute a part of this specification. The drawings illustrate exemplary embodiments of the inventive concept and, together with the description, serve to explain principles of the inventive concept. In the drawings.

DETAILED DESCRIPTION

Figure 1:
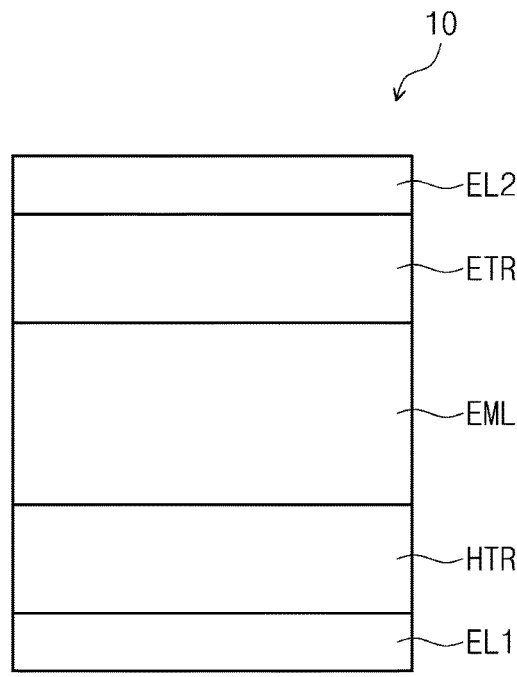
FIG. 1 is a cross-sectional view schematically illustrating an organic electroluminescence device according to an embodiment of the present disclosure.

The present disclosure may have various modifications and may be embodied in different forms, and thus specific embodiments will be exemplified in the drawings and described in the detailed description. It should be understood, however, that it is not intended to limit the present disclosure to any particularly disclosed forms, but rather, that the present disclosure covers all modifications, equivalents, and replacements within the spirit and technical scope of the present disclosure.

In the description, it will also be understood that when a component (a region, a layer, a portion, or the like) is referred to as "being on", "being connected to", or "being coupled to" another component, it may be directly disposed/connected/coupled to the another component, or intervening component(s) may be also disposed therebetween.

Like reference symbols refer to like elements throughout, and redundant descriptions thereof may be omitted. The thicknesses, dimensions, and ratios of components in the drawings may be exaggerated for effectively describing the technical features.

"And/or" include one or more combinations in which the associated components may define.

Although terms such as "first" and "second" are used herein to describe various components, these components should not be limited by these terms. The terms are only used to distinguish one component from other components. For example, a first component may be alternatively referred to as a second component, and similarly a second component may be alternatively referred to as a first component without departing from the scope of the present disclosure. The expression of a singular form may include plural forms unless definitely indicating a particular case in terms of the context.

Also, terms such as "below", "in lower side", "above", "in upper side", and/or the like may be used to describe the relationships of the components illustrated in the drawings. These terms are relative concepts, and are described on the basis of the directions illustrated in the drawings.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art, and will not be interpreted in an idealized or overly formal sense unless expressly stated or defined herein.

It will be understood that the meaning of "comprise" or "have" specifies the presence of a feature, a fixed number, a step, a process, an element, a component, or a combination thereof disclosed in the specification, but does not exclude the possibility of presence or addition of one or more other features, fixed numbers, steps, processes, elements, components, or combinations thereof.

Hereinafter, an organic electroluminescence device according to an embodiment of the present disclosure will be described with reference to the drawings.

FIGS. 1 to 4 are cross-sectional views, each schematically illustrating an organic electroluminescence device according to an embodiment of the present disclosure. Referring to FIGS. 1 to 4, in an organic electroluminescence device 10 according to an embodiment of the present disclosure, a first electrode EL1 and a second electrode EL2 are disposed to face each other, and a plurality of organic layers may be disposed between the first electrode EL1 and the second electrode EL2. The plurality of organic layers may include a hole transport region HTR, an emission layer EML, and an electron transport region ETR. That is, the organic electroluminescence device 10 according to an embodiment of the present disclosure may include a first electrode EL1, a hole transfer region HTR, an emission layer EML, an electron transfer region ETR, and a second electrode EL2, laminated sequentially. A capping layer CPL may be disposed on the second electrode EL2.

The organic electroluminescence device 10 of an embodiment may include a fused polycyclic compound according to an embodiment of the present disclosure (as described below) in at least one organic layer of the plurality of organic layers disposed between the first electrode EL1 and the second electrode EL2. For example, the organic electroluminescence device 10 of an embodiment may include a fused polycyclic compound according to an embodiment described below in the emission layer EML disposed between the first electrode EL1 and the second electrode EL2. However, embodiments are not limited thereto, and the organic electroluminescence device 10 of an embodiment may include a fused polycyclic compound according to an embodiment described below in at least one organic layer included in the hole transport region HTR and the electron transfer region ETR, which are among the plurality of organic layers disposed between the first electrode EU and the second electrode EL2, or may include a fused polycyclic compound according to an embodiment of the present disclosure in the capping layer CPL disposed on the second electrode EL2.

Figure 2:
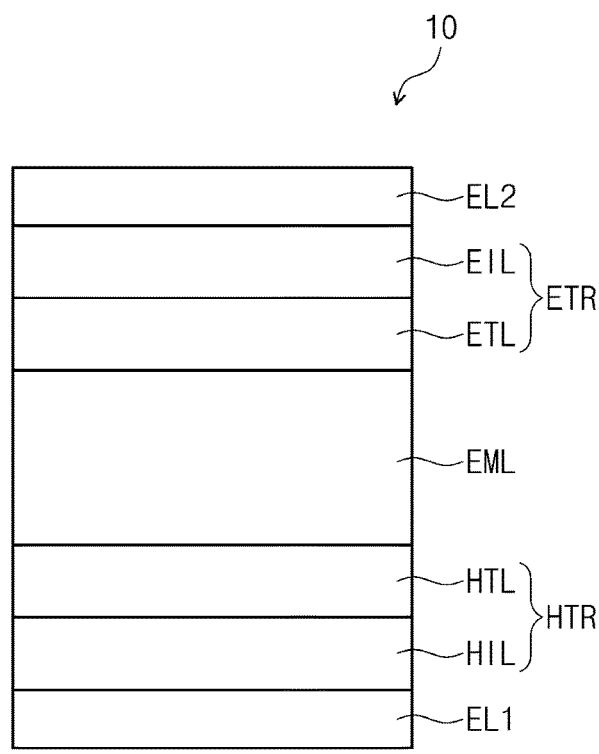
FIG. 2 is a cross-sectional view schematically illustrating an organic electroluminescence device according to an embodiment of the present disclosure.
Figure 3:
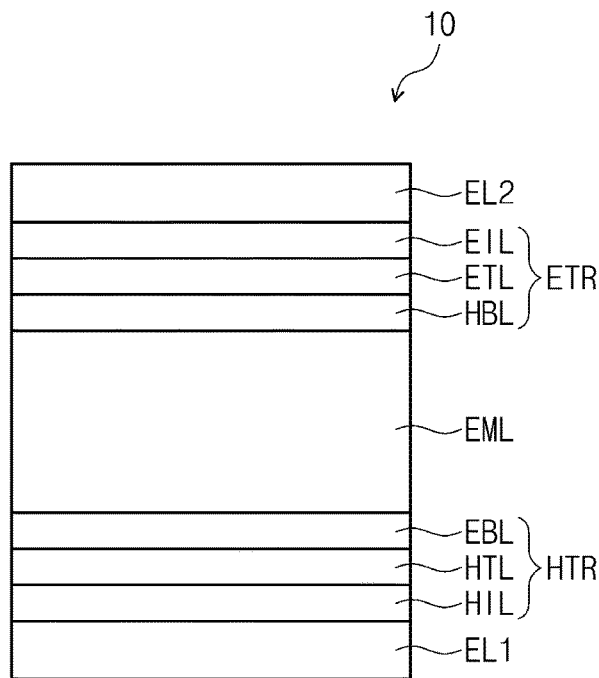
FIG. 3 is a cross-sectional view schematically illustrating an organic electroluminescence device according to an embodiment of the present disclosure.
Figure 4:
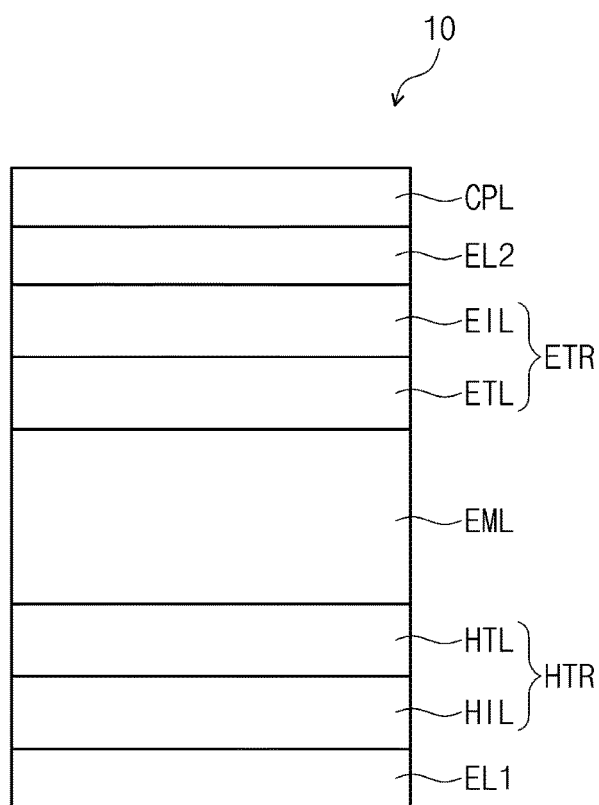
FIG. 4 is a cross-sectional view schematically illustrating an organic electroluminescence device according to an embodiment of the present disclosure.

Compared with FIG. 1, FIG. 2 shows a cross-sectional view of an organic electroluminescence device 10 of an embodiment, wherein the hole transfer region HTR includes a hole injection layer HIL and a hole transport layer HTL, and the electron transfer region ETR includes an electron injection layer EIL and an electron transport layer ETL. Compared with FIG. 1, FIG. 3 shows a cross-sectional view of an organic electroluminescence device 10 of an embodiment, wherein the hole transfer region HTR includes a hole injection layer HIL, a hole transport layer HTL, and an electron blocking layer EBL, and the electron transfer region ETR includes an electron injection layer EIL, an electron transport layer ETL, and a hole blocking layer HBL. Compared with FIG. 2, FIG. 4 shows a cross-sectional view of an organic electroluminescence device 10 of an embodiment including the capping layer CPL disposed on the second electrode EL2.

Hereinafter, in the description of the organic electroluminescence device 10 of an embodiment, the organic electroluminescence device 10 includes a fused polycyclic compound according to embodiments of the present disclosure in the emission layer EML, but embodiments are not limited thereto, and a fused polycyclic compound according to an embodiment described below may be included in the hole transport region HTR, the electron transport region ETR, or the capping layer CPL.

The first electrode EL1 has conductivity (e.g., may be conductive). The first electrode EL1 may be formed of a metal alloy or a conductive compound. The first electrode EL1 may be an anode. In addition, the first electrode EL1 may be a pixel electrode. The first electrode EL1 may be a transmissive electrode, a transflective (semi-transmissive) electrode, or a reflective electrode. When the first electrode EU is a transmissive electrode, the first electrode EU may include or be formed of a transparent metal oxide, for example, indium tin oxide (ITO), indium zinc oxide (IZO), zinc oxide (ZnO), or indium tin zinc oxide (ITZO). When the first electrode EL1 is a transflective electrode or a reflective electrode, the first electrode EU may include or be formed of silver (Ag), magnesium (Mg), copper (Cu), aluminum (Al), platinum (Pt), palladium (Pd), gold (Au), nickel (Ni), neodymium (Nd), iridium (Ir), chromium (Cr), lithium (Li), calcium (Ca), LiF/Ca, LiF/Al, molybdenum (Mo), titanium (Ti), or a compound or mixture (e.g., a mixture of Ag and Mg) thereof. In some embodiments, the first electrode EU may have a multi-layered structure including a reflective layer or transflective layer and a transparent conductive layer formed of indium tin oxide (ITO), indium zinc oxide (IZO), zinc oxide (ZnO), and/or indium tin zinc oxide (ITZO). For example, the first electrode EL1 may have, but is not limited to, a three-layer structure of ITO/Ag/ITO. The first electrode EL1 may have a thickness of about 1,000 Å to about 10,000 Å, for example, about 1,000 Å to about 3,000 Å.

The hole transport region HTR is provided on the first electrode EL1. The hole transport region HTR may include at least one selected from a hole injection layer HIL, a hole transport layer HTL, a hole buffer layer, and an electron blocking layer. The hole transport region HTR may have a thickness, for example, of about 50 Å to about 1,500 Å.

The hole transport region HTR may have a multilayer structure having a single layer formed of a single material, a single layer formed of two or more different materials, or a plurality of layers formed of a plurality of different materials.

For example, the hole transport region HTR may have a single layer structure including a hole injection layer HIL or a hole transport layer HTL, or a single layer structure formed of a hole injection material or a hole transport material. In some embodiments, the hole transport region HTR may have a single layer structure formed of materials different from each other, or a multi-layer structure including a hole injection layer HIL/a hole transport layer HTL, a hole injection layer HIL/a hole transport layer HTL/a hole buffer layer, a hole injection layer HIL/a hole buffer layer, a hole transport layer HTL/a hole buffer layer, or a hole injection layer HIL/a hole transport layer HTL/an electron blocking layer, the layers in each structure being sequentially laminated from the first electrode EL1, but embodiments are not limited thereto.

The hole transport region HTR may be formed using various suitable methods such as a vacuum deposition method, a spin coating method, a casting method, a Langmuir-Blodgett (LB) method, an inject printing method, a laser printing method, and/or a laser induced thermal imaging (LITI) method.

The hole injection layer HIL may include, for example, a phthalocyanine compound (such as copper phthalocyanine); N,N'-diphenyl-N,N'-bis-[4-(phenyl-m-tolyl-amino)-phenyl]-biphenyl-4,4'-diamine (DNTPD), 4,4',4"-[tris(3-methylphenyl)phenylamino]triphenylamine] (m-MTDATA), 4,4', 4"-tris(N,N-diphenylamino)triphenylamine (TDATA), 4,4', 4"-tris{N,-(2-naphthyl)-N-phenylamino)-triphenylamine (2-TNATA), poly(3,4-ethylenedioxythiophene)/poly(4-styrenesulfonate) (PEDOT/PSS), polyaniline/dodecylbenzenesulfonic acid (PANI/DBSA), polyaniline/camphor sulfonic acid (PANI/CSA), polyaniline/poly(4-styrenesulfonate) (PANI/PSS), N,N'-di(naphthalene-1-yl)-N,N'-diphenyl-benzidine (NPB), triphenylamine-containing polyether ketone (TPAPEK), 4-isopropyl-4'-methyldiphenyliodonium tetrakis(pentafluorophenyl)borate, dipyrazino[2,3-f: 2',3'-h]quinoxaline-2,3,6,7,10,11-hexacarbonitrile (HAT-CN), etc.

The hole transport layer HTL may further include, for example, carbazole derivatives (such as N-phenyl carbazole and polyvinyl carbazole), fluorene derivatives, N,N'-bis(3-methylphenyl)-N,N'-diphenyl-[1,1-biphenyl]-4,4'-diamine (TPD), triphenylamine derivatives (such as 4,4',4"-tris(N-carbazolyl)triphenylamine (TCTA)), N,N'-di(naphthalene-1-yl)-N,N'-diphenyl-benzidine (NPB), 4,4'-cyclohexylidene bis[N,N-bis(4-methylphenyl]benzenamine] (TAPC), 4,4'-bis[N,N'-(3-tolyl)amino]-3,3'-dimethylbiphenyl (HMTPD), 1,3-Bis(N-carbazolyl)benzene (mCP), etc.

The hole transport region HTR may have a thickness of about 50 Å to about 10,000 Å, for example, about 100 Å to about 5,000 Å. The hole injection region HIL may have a thickness, for example, of about 30 Å to about 1,000 Å, and the hole transport layer HTL may have a thickness of about 30 Å to about 1,000 Å. For example, the electron blocking layer EBL may have a thickness of about 10 Å to about 1,000 Å. When the thicknesses of each of the hole transport region HTR, the hole injection layer HIL, the hole transport layer HTL, and the electron blocking layer EBL satisfy the above-described range, satisfactory hole transport characteristics may be achieved without a substantial increase in driving voltage.

The hole transport region HTR may further include a charge generating material in addition to the above-described materials to improve conductivity. The charge generating material may be uniformly or non-uniformly dispersed into the hole transport region HTR. The charge generating material may be, for example, a p-dopant. The p-dopant may be one of quinone derivatives, metal oxides, and cyano group-containing compounds, but is not limited thereto. Non-limiting examples of the p-dopant may include quinone derivatives (such as tetracyanoquinodimethane (TCNQ) and 2,3,5,6-tetrafluoro-tetracyanoquinodimethane (F4-TCNQ)), and metal oxides (such as tungsten oxides and molybdenum oxides).

As described above, the hole transport region HTR may further include at least one of the hole buffer layer and the electron blocking layer EBL, in addition to the hole injection layer HIL and the hole transport layer HTL. The hole buffer layer may compensate for a resonance distance according to the wavelength of light emitted from the emission layer EML to increase luminous efficiency. A material included in the hole transport layer may also be used as a material in the hole buffer layer. The electron blocking layer EBL may block or reduce electron injection from the electron transport region ETR into the hole transport region HTR.

The light emitting layer EML is provided on the hole transport region HTR. The emission layer EML may have a thickness, for example, of about 100 Å to about 1,000 Å, or about 100 Å to about 300 Å. The emission layer EML may have a single layer structure formed of a single material, a single layer formed of materials different from each other (e.g., formed of multiple materials), or a multilayer structure including a plurality of layers formed of materials different from each other.

The emission layer EML in the organic electroluminescence device 10 of an embodiment may include a fused polycyclic compound of an embodiment.

In the description, the term "substituted or unsubstituted" may refer to being unsubstituted, or being substituted with at least one substituent selected from the group consisting of a deuterium atom, a halogen atom, a cyano group, a nitro group, an amine group, a silyl group, an oxy group, a thio group, a sulfinyl group, a sulfonyl group, a carbonyl group, a boron group, a phosphine oxide group, a phosphine sulfide group, an alkyl group, an alkenyl group, an alkoxy group, a hydrocarbon ring group, an aryl group, and a heterocyclic group. In addition, each of the substituents may themselves be substituted or unsubstituted. For example, a biphenyl group may be interpreted as an unsubstituted aryl group, or as a phenyl group substituted with a phenyl group.

In the description, the expression "bonded to an adjacent group to form a ring" refers to a state of being bonded to an adjacent group to form a substituted or unsubstituted hydrocarbon ring, or a substituted or unsubstituted heterocyclic ring.

The hydrocarbon ring may be an aliphatic hydrocarbon ring or an aromatic hydrocarbon ring. The heterocyclic ring may be an aliphatic heterocycle or an aromatic heterocycle. A ring formed by bonding adjacent groups to each other may be a monocyclic ring or a polycyclic ring. In addition, a ring formed by being bonded to an adjacent group may be linked to another ring to form a spiro structure.

In the description, the term "adjacent group" may refer to a substituent on a directly neighboring atom, a substituent on the same atom, or a substituent sterically close to the substituent (e.g., a group that is not on the same or a neighboring atom, but is positioned within bonding distance when the three-dimensional conformation of the molecules is considered). For example, two methyl groups in 1,2-dimethylbenzene may be interpreted as "adjacent groups" to each other, and two ethyl groups in 1,1-diethylcyclopentane may also be interpreted as "adjacent groups" to each other.

In the description, the term "halogen atom" may refer to a fluorine atom, a chlorine atom, a bromine atom, or an iodine atom.

In the description, the term "alkyl group" may refer to a linear, branched or cyclic alkyl. The number of carbons in the alkyl group may be 1 to 50, 1 to 30, 1 to 20, 1 to 10, or 1 to 6. Non-limiting examples of the alkyl group may include a methyl group, an ethyl group, an n-propyl group, an isopropyl group, an n-butyl group, a s-butyl group, a t-butyl group, an i-butyl group, a 2-ethylbutyl group, a 3,3-dimethylbutyl group, an n-pentyl group, an i-pentyl group, a neopentyl group, a t-pentyl group, a cyclopentyl group, a 1-methylpentyl group, a 3-methylpentyl group, a 2-ethylpentyl group, a 4-methyl-2-pentyl group, an n-hexyl group, a 1-methylhexyl group, a 2-ethylhexyl group, a 2-butylhexyl group, a cyclohexyl group, a 4-methylcyclohexyl group, a 4-t-butylcyclohexyl group, an n-heptyl group, a 1-methylheptyl group, a 2,2-dimethylheptyl group, a 2-ethylheptyl group, a 2-butylheptyl group, an n-octyl group, a t-octyl group, a 2-ethyloctyl group, a 2-butyloctyl group, a 2-hexyloctyl group, a 3,7-dimethyloctyl group, a cyclooctyl group, an n-nonyl group, an n-decyl group, an adamantyl group, a 2-ethyldecyl group, a 2-butyldecyl group, a 2-hexyldecyl group, a 2-octyldecyl group, an n-undecyl group, an n-dodecyl group, a 2-ethyldodecyl group, a 2-butyldodecyl group, a 2-hexyldocecyl group, a 2-octyldodecyl group, an n-tridecyl group, an n-tetradecyl group, an n-pentadecyl group, an n-hexadecyl group, a 2-ethylhexadecyl group, a 2-butylhexadecyl group, a 2-hexylhexadecyl group, a 2-octylhexadecyl group, an n-heptadecyl group, an n-octadecyl group, an n-nonadecyl group, an n-eicosyl group, a 2-ethyleicosyl group, a 2-butyleicosyl group, a 2-hexyleicosyl group, a 2-octyleicosyl group, an n-henicosyl group, an n-docosyl group, an n-tricosyl group, an n-tetracosyl group, an n-pentacosyl group, an n-hexacosyl group, an n-heptacosyl group, an n-octacosyl group, an n-nonacosyl group, an n-triacontyl group, etc.

In the description, the term "alkenyl group" refers to a hydrocarbon group including at least one carbon-carbon double bond in the middle or at the terminal end of an alkyl group having two or more carbon atoms. The alkenyl group may be linear or branched. The number of carbons may be 2 to 60, 2 to 30, 2 to 20, or 2 to 10, but is not limited thereto. Non-limiting examples of the alkenyl group include a vinyl (ethenyl) group, a propyl group, a 1-butenyl group, a 1-pentenyl group, a hexenyl group, a heptenyl group, an octenyl group, a 1,3-butadienyl group, a styrenyl group, a styryl vinyl group, etc.

In the description, the term "alkynyl group" refers to a hydrocarbon group including at least one carbon-carbon triple bond in the middle or at the terminal end of the alkyl group having two or more carbon atoms. The alkynyl group may be a linear or branched chain. The number of carbons may be 2 to 60, 2 to 30, 2 to 20 or 2 to 10, but is not limited thereto. Non-limiting examples of the alkynyl group include ethynyl, propynyl, etc.

In the description, the term "hydrocarbon ring" refers to any functional group or substituent derived from an aliphatic hydrocarbon ring, or any functional group or substituent derived from an aromatic hydrocarbon ring. The number of carbons to form a ring of the hydrocarbon ring may be 5 to 60, 5 to 30, or 5 to 20.

In the description, the term "aryl group" refers to any functional group or substituent derived from an aromatic hydrocarbon ring. The aryl group may be a monocyclic aryl group or a polycyclic aryl group. The carbon number to form a ring in the aryl group may be 6 to 60, 6 to 30, 6 to 20, or 6 to 15. Non-limiting examples of the aryl group include a phenyl group, a naphthyl group, a fluorenyl group, an anthracenyl group, a phenanthryl group, a biphenyl group, a terphenyl group, a quaterphenyl group, a quinquephenyl group, a sexiphenyl group, a triphenylenyl group, a pyrenyl group, a benzofluoranthenyl group, a chrysenyl group, etc.

In the description, the fluorenyl group may be substituted, and two substituents may be combined with each other to form a spiro structure. Non-limiting examples of the substituted fluorenyl group are as follows. However, an embodiment of the present disclosure is not limited thereto:

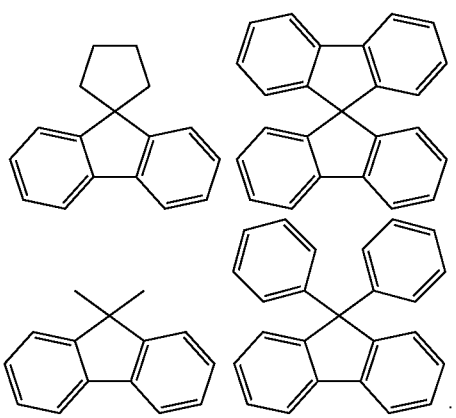

In the description, the term "heterocyclic group" refers to any functional group or substituent derived from a ring including one or more selected from boron (B), oxygen (O), nitrogen (N), phosphorus (P), silicon (Si), and sulfur (S) as a heteroatom. The heterocyclic group includes an aliphatic heterocyclic group and an aromatic heterocyclic group. The aromatic heterocyclic group may be a heteroaryl group. The aliphatic heterocyclic group and the aromatic heterocyclic group may be monocyclic or polycyclic.

In the description, the heterocyclic group may include one or more heteroatoms selected from B, O, N, P, Si, and S. In the case where the heterocyclic group includes two or more heteroatoms, the two or more heteroatoms may be the same as or different from each other. The heterocyclic group may be a monocyclic heterocyclic group or a polycyclic heterocyclic group, and may include a heteroaryl group. The number of carbons to form a ring of the heterocyclic group may be 2 to 30, 2 to 20, or 2 to 10.

In the description, the term "aliphatic heterocyclic group" may refer to a non-aromatic heterocycle including one or more heteroatoms selected from B, O, N, P, Si, and S. The number of carbons to form a ring of the aliphatic heterocyclic group may be 2 to 60, 2 to 30, 2 to 20, or 2 to 10. Non-limiting examples of the aliphatic heterocyclic group include an oxirane group, a thiirane group, a pyrrolidine group, a piperidine group, a tetrahydrofuran group, a tetrahydrothiophene group, a thiane group, a tetrahydropyran group, a 1,4-dioxane group, etc.

In the description, the term "heteroaryl group" may refer to an aromatic heterocycle including one or more heteroatoms selected from B, O, N, P, Si, and S. In the case where the heteroaryl group includes two or more heteroatoms, the two or more heteroatoms may be the same as or different from each other. The heteroaryl group may be a monocyclic heterocyclic group or a polycyclic heterocyclic group. The number of carbons to form a ring of the heteroaryl group may be 2 to 60, 2 to 30, 2 to 20, or 2 to 10. Non-limiting examples of the heteroaryl group include a thiophene group, a furan group, a pyrrole group, an imidazole group, a triazole group, a pyridine group, a bipyridine group, a pyrimidine group, a triazine group, an acridyl group, a pyridazine group, a pyrazinyl group, a quinoline group, a quinazoline group, a quinoxaline group, a phenoxazine group, a phthalazine group, a pyrido pyrimidine group, a pyrido pyrazine group, a pyrazino pyrazine group, an isoquinoline group, an indole group, a carbazole group, an N-arylcarbazole group, an N-heteroarylcarbazole group, an N-alkylcarbazole group, a benzoxazole group, a benzimidazole group, a benzothiazole group, a benzocarbazole group, a benzothiophene group, a dibenzothiophene group, a thienothiophene group, a benzofuran group, a phenanthroline group, a thiazole group, an isooxazole group, an oxazole group, an oxadiazole group, a thiadiazole group, a phenothiazine group, a dibenzosilole group, a dibenzofuran group, etc.

In the present disclosure, the term "arylene group" may refer to substantially the same description as set forth for the aryl group, except that the arylene group is a divalent group. The term "heteroarylene group" may refer to substantially the same description as set forth for the heteroaryl group, except that the heteroarylene group is a divalent group.

In the description, the term "silyl group" may refer to an alkyl silyl group or an aryl silyl group. Non-limiting examples of the silyl group include a trimethylsilyl group, a triethylsilyl group, a t-butyldimethylsilyl group, a vinyldimethylsilyl group, a propyldimethylsilyl group, a triphenylsilyl group, a diphenylsilyl group, a phenylsilyl group, etc.

In the description, the term "boryl group" may refer to an alkyl boryl group or an aryl boryl group. Non-limiting examples of the boryl group include a trimethylboryl group, a triethylboryl group, a t-butyldimethylboryl group, a triphenylboryl group, a diphenylboryl group, a phenylboryl group, etc.

In the description, the carbon number of the amine group may be 1 to 30, but is not particularly limited thereto. The amine group may include an alkyl amine group, an aryl amine group, or a heteroaryl amine group. Non-limiting examples of the amine group include a methylamine group, a dimethylamine group, a phenylamine group, a diphenylamine group, a naphthylamine group, a 9-methyl-anthracenylamine group, a triphenylamine group, etc.

In the description, the term "oxy group" may refer to an alkoxy group or an aryl oxy group. The alkoxy group may include a linear, branched, or cyclic chain. The number of carbons in the alkoxy group may be, for example, 1 to 20, or 1 to 10, but is not particularly limited thereto. Non-limiting examples of the oxy group include a methoxy group, an ethoxy group, an n-propoxy group, an isopropoxy group, a butoxy group, a pentyloxy group, a hexyloxy group, an octyloxy group, a nonyloxy group, a decyloxy group, a benzyloxy group, etc.

In the description, the alkyl group in the alkyl thio group, the alkyl sulfoxy group, the alkyl aryl group, the alkyl amino group, the alkyl boryl group, and the alkyl silyl group is the same as the alkyl group described above, including the examples thereof.

In the description, the aryl group in the aryl oxy group, the aryl thio group, the aryl sulfoxy group, the aryl amino group, the aryl boron group, and the aryl silyl group is the same as the aryl group described above, including the examples thereof.

In the description, the term "direct linkage" may refer to a single bond.

A fused polycyclic compound of an embodiment may be represented by Formula 1: The fused polycyclic compound represented by Formula 1 may have at least one carbazole moiety in a fused ring.

[Formula 1]

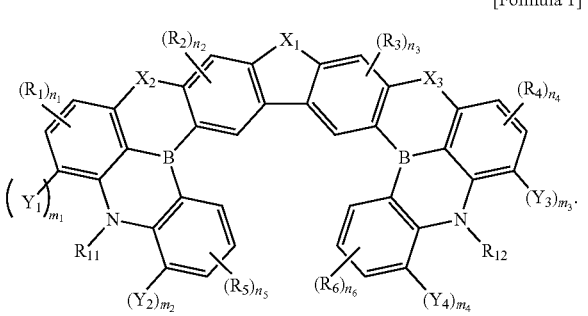

In Formula 1, $X_1$ to $X_3$ may each independently be $NR_9$, O, or S. For example, $X_1$ may be $NR_9$ and both $X_2$ and $X_3$ may be 0, or $X_1$ to $X_3$ may all be S. In some embodiments, $X_1$ to $X_3$ may all be $NR_9$. In some embodiments, $X_1$ may be 0 or S and both $X_2$ and $X_3$ may be $NR_9$. In some embodiments, $X_1$ to $X_3$ may each independently be 0 or S.

In Formula 1, $Y_1$ to $Y_4$ may each independently be a direct linkage, O, or S.

For example, $Y_1$ to $Y_4$ may be a direct linkage.

In Formula 1, $m_1$ to $m_4$ may each independently be 0 or 1. In Formula 1, when $X_1$ is O or S, $m_1+m_2+m_3+m_4$ may not equal 0. In other words, when $X_1$ is O or S, at least one selected from $m_1$ to $m_4$ may not equal 0 (e.g., may be 1). When $X_1$ is O or S, $m_1+m_2+m_3+m_4$ may equal 2.

In Formula 1, at least one selected from $Y_1$ to $Y_4$ may be a direct linkage. When $Y_1$ is a direct linkage, $m_1$ may be 1. When $Y_2$ is a direct linkage, $m_2$ may be 1. When $Y_3$ is a direct linkage, $m_3$ may be 1. When $Y_4$ is a direct linkage, $m_4$ may be 1.

In Formula 1, $R_1$ to $R_6$ may each independently be a hydrogen atom, a deuterium atom, a halogen atom, a boron group, a phosphine oxide group, a cyano group, a substituted or unsubstituted amine group, a substituted or unsubstituted silyl group, a substituted or unsubstituted alkyl group having 1 to 20 carbon atoms, a substituted or unsubstituted aryl group having 6 to 60 carbon atoms to form a ring, or a substituted or unsubstituted heteroaryl group having 2 to 60 carbon atoms to form a ring. In some embodiments, each of $R_1$ to $R_6$ may be combined with an adjacent group to form a ring. In some embodiments, all of $R_1$ to $R_6$ may be hydrogen atoms. In some embodiments, $R_1$, $R_4$, $R_5$, and $R_6$ may each independently be a substituted or unsubstituted amine group, a substituted or unsubstituted methyl group, or a substituted or unsubstituted carbazole group. In some embodiments, $R_1$, $R_4$, $R_5$, and $R_6$ may each independently be a substituted or unsubstituted t-butyl group, a substituted or unsubstituted carbazole group, a substituted or unsubstituted diphenylamine group. a substituted or unsubstituted isopropyl phenylamine group, or a substituted or unsubstituted piperidine group.

In Formula 1, $R_9$ may be a substituted or unsubstituted alkyl group having 1 to 20 carbon atoms, a substituted or unsubstituted aryl group having 6 to 60 carbon atoms to form a ring, or a substituted or unsubstituted heteroaryl group having 2 to 60 carbon atoms to form a ring. In Formula 1, when $X_1$ to $X_3$ are each $NR_9$, each $R_9$ may independently be a substituted or unsubstituted phenyl group.

In Formula 1, $n_1$ to $n_4$ may each independently be an integer of 0 to 2, and $n_5$ and $n_6$ may each independently be an integer of 0 to 3. When $n_1$ is O, the fused polycyclic compound according to an embodiment may not be substituted at $R_1$. The case where $n_1$ is 2 and all the $R_1$ groups are hydrogen atoms may be substantially the same as the case where $n_1$ is 0. When $n_1$ is 2, the plurality of $R_1$ groups may all be the same, or at least one of the plurality of $R_1$ groups may be different from the others. When $n_2$ is 0, the fused polycyclic compound according to an embodiment may not be substituted at $R_2$. The case where $n_2$ is 2 and all the $R_2$ groups are hydrogen atoms may be substantially the same as the case where $n_2$ is 0. When $n_2$ is 2, the plurality of $R_2$ groups may all be the same, or at least one of the plurality of $R_2$ groups may be different from the others. When $n_3$ is 0, the fused polycyclic compound according to an embodiment may not be substituted at $R_3$. The case where $n_3$ is 2 and all the $R_3$ groups are hydrogen atoms may be substantially the same as the case where $n_3$ is 0. When $n_3$ is 2, the plurality of $R_3$ groups may all be the same, or at least one of the plurality of $R_3$ groups may be different from the others. When $n_4$ is 0, the fused polycyclic compound according to an embodiment may not be substituted at $R_4$. The case where $n_4$ is 2 and all the $R_4$ groups are hydrogen atoms may be substantially the same as the case where $n_4$ is 0. When $n_4$ is 2, the plurality of $R_4$ groups may all be the same, or at least one of the plurality of $R_4$ groups may be different from the others. When $n_5$ is 0, the fused polycyclic compound according to an embodiment may not be substituted at $R_5$. The case where $n_5$ is 3 and all the $R_5$ groups are hydrogen atoms may be substantially the same as the case where $n_5$ is 0. When $n_5$ is 2, the plurality of $R_5$ groups may all be the same, or at least one of the plurality of $R_5$ groups may be different from the others. When $n_6$ is 0, the fused polycyclic compound according to an embodiment may not be substituted at $R_6$. The case where $n_6$ is 3 and all the $R_6$ groups are hydrogen atoms may be substantially the same as the case where $n_6$ is 0. When $n_6$ is 2, the plurality of $R_6$ groups may all be the same, or at least one of the plurality of $R_6$ groups may be different from the others.

The fused polycyclic compound of an embodiment may have a symmetrical structure (e.g., may have mirror plane symmetry). For example, the fused polycyclic compound represented by Formula 1 of an embodiment may have a symmetrical structure around a central ring including $X_1$. In Formula 1, $X_2$ and $X_3$ may be the same, $Y_1$ and $Y_3$ may be the same, $Y_2$ and $Y_4$ may be the same, $m_1$ and $m_3$ may be the same, and $m_2$ and $m_4$ may be the same.

The fused polycyclic compound of an embodiment includes two polycyclic rings containing a nitrogen atom and a boron atom compared to a related art polycyclic ring containing a nitrogen atom and a boron atom in the core, and has a structure in which two polycyclic rings are linked to each other via a fused heterocyclic ring (such as carbazole, dibenzofuran, or dibenzothiophene). For example, the fused polycyclic compound of an embodiment may have a fused polycyclic heterocyclic moiety (such as carbazole, dibenzofuran, or dibenzothiophene) in a polycyclic ring containing a nitrogen atom and a boron atom, or have a structure in which two polycyclic rings are linked to each other via a fused heterocyclic moiety (such as carbazole, dibenzofuran, or dibenzothiophene). Accordingly, the fused polycyclic compound of an embodiment may be used as a delayed fluorescence emitting material due to its ready separation of HOMO and LUMO within one molecule, as facilitated by the presence of multiple resonance structures in a broad planar skeleton containing one or more carbazole moieties. The fused polycyclic compound of an embodiment may have a relatively decreased energy difference ($\Delta E_{ST}$) between a lowest triplet exciton energy level (T1 level) and a lowest singlet exciton energy level (S1 level) associated with the structure above, and accordingly, when the fused polycyclic compound is used as a delayed fluorescence emitting material, the luminous efficiency of an organic electroluminescence device may be improved.

The fused polycyclic compound represented by Formula 1 may be represented by Formula 1-1:

[Formula 1-1]

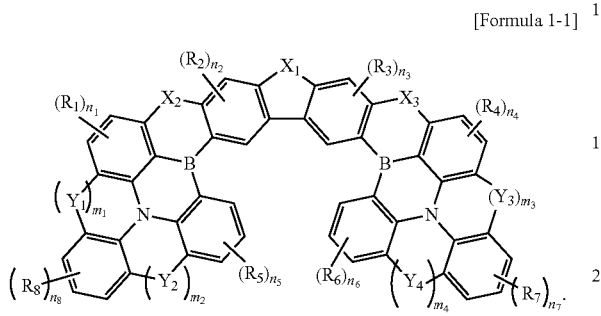

In Formula 1-1, $R_7$ and $R_8$ may each independently be a hydrogen atom, a deuterium atom, a halogen atom, a boron group, a phosphine oxide group, a cyano group, a substituted or unsubstituted amine group, a substituted or unsubstituted silyl group, a substituted or unsubstituted alkyl group having 1 to 20 carbon atoms, a substituted or unsubstituted aryl group having 6 to 60 carbon atoms to form a ring, or a substituted or unsubstituted heteroaryl group having 2 to 60 carbon atoms to form a ring. In some embodiments, each of $R_7$ and $R_8$ may be combined with an adjacent group to form a ring. For example, both of $R_7$ and $R_8$ may be hydrogen atoms. In some embodiments, $R_7$ and $R_8$ may each independently be a substituted or unsubstituted amine group, a substituted or unsubstituted methyl group, or a substituted or unsubstituted carbazole group. In some embodiments, $R_7$ and $R_8$ may each independently be a substituted or unsubstituted t-butyl group, a substituted or unsubstituted carbazole group, a substituted or unsubstituted diphenylamine group, a substituted or unsubstituted isopropyl phenylamine group, or a substituted or unsubstituted piperidine group.

In Formula 1, $n_7$ and $n_8$ may each independently be an integer of 0 to 3. When $n_7$ is 0, the fused polycyclic compound according to an embodiment may not be substituted at $R_7$. The case where $n_7$ is 3 and all the $R_7$ groups are hydrogen atoms may be substantially the same as the case where $n_7$ is 0. When $n_7$ is an integer of 2 or more, the plurality of $R_7$ groups may all be the same, or at least one of the plurality of $R_7$ groups may be different from the others. When $n_8$ is 0, the fused polycyclic compound according to an embodiment may not be substituted at $R_8$. The case where $n_8$ is 3 and all the $R_8$ groups are hydrogen atoms may be substantially the same as the case where $n_8$ is 0. When $n_8$ is an integer of 2 or more, the plurality of $R_8$ groups may all be the same, or at least one of the plurality of $R_8$ groups may be different from the others.

In Formula 1-1, $X_1$ to $X_3$, $Y_1$ to $Y_4$, $R_1$ to $R_6$, $n_1$ to $n_6$, and $m_1$ to $m_4$ may each be substantially the same as described in Formula 1.

The fused polycyclic compound represented by Formula 1-1 may be represented by Formula 2-1 or Formula 2-2:

[Formula 2-1]

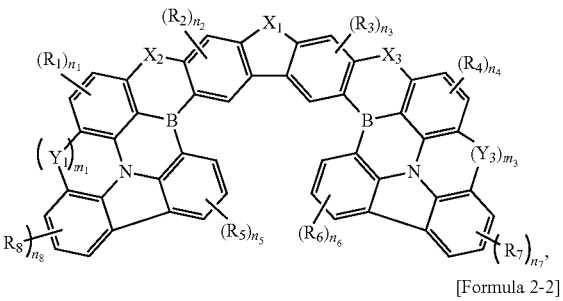

[Formula 2-2]

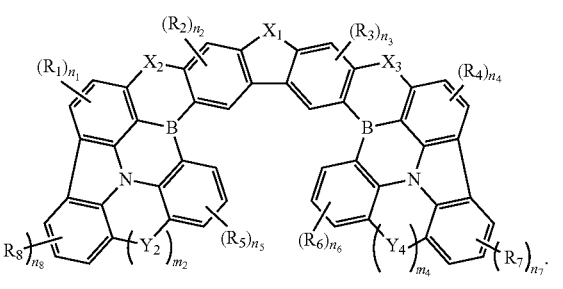

Formula 2-1 may be (correspond to) the case where $m_2$ and $m_4$ are each 1 and $Y_2$ and $Y_4$ are each direct linkages in Formula 1-1. Formula 2-2 may be the case where $m_1$ and $m_3$ are each 1 and $Y_1$ and $Y_3$ are each direct linkages in Formula 1-1.

In Formula 2-1 and Formula 2-2, $X_1$ to $X_3$, $Y_1$ to $Y_4$, $R_1$ to $R_8$, $n_1$ to $n_8$, and $m_1$ to $m_4$ may each be substantially the same as described in Formula 1-1.

The fused polycyclic compound represented by Formula 1-1 may be represented by Formula 3-1 or Formula 3-2:

[Formula 3-1]

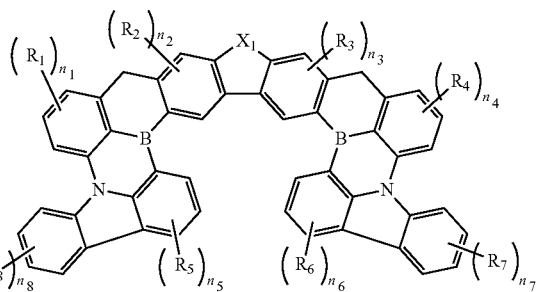

[Formula 3-2]

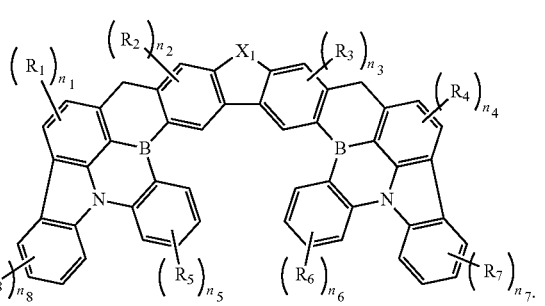

Formula 3-1 may be the case where $m_2$ and $m_4$ are each 1, $Y_2$ and $Y_4$ are each direct linkages, and $m_1$ and $m_3$ are each 0 in Formula 1-1. Formula 2-2 may be the case where $m_1$ and $m_3$ are each 1, $Y_1$ and $Y_3$ are each direct linkages, and $m_2$ and $m_4$ are each 0 in Formula 1-1.

In Formula 3-1 and Formula 3-2, $X_1$ to $X_3$, $R_1$ to $R_8$, and $n_1$ to $n_8$ may each be substantially the same as described in Formula 1-1.

The fused polycyclic compound represented by Formula 1-1 may be represented by Formula 4:

[Formula 4]

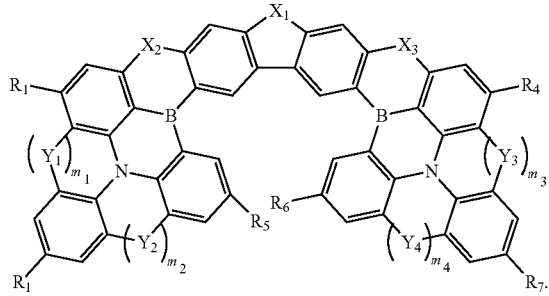

Formula 4 may be the case where $n_1$, $n_4$, $n_5$, $n_6$, $n_7$, and $n_8$ in Formula 1-1 are each 1, and the substitution sites of $R_1$, $R_4$, $R_5$, $R_6$, $R_7$, and $R_8$ are each specified.

The fused polycyclic compound represented by Formula 4 may have a symmetrical structure. The fused polycyclic compound represented by Formula 4 of an embodiment may have a symmetrical structure around a central ring including $X_1$. In Formula 4, $X_2$ and $X_3$ may each be the same, $Y_1$ and $Y_3$ may each be the same, $Y_2$ and $Y_4$ may each be the same, $m_1$ and $m_3$ may each be the same, and $m_2$ and $m_4$ may each be the same. In Formula 4, $R_1$ and $R_4$ may each be the same, $R_5$ and $R_8$ may each be the same, and $R_6$ and $R_7$ may each be the same.

In Formula 4, $X_1$ to $X_3$, $Y_1$ to $Y_4$, $R_1$, $R_4$, and $m_1$ to $m_4$ may each be the same as described in Formula 1-1.

The fused polycyclic compound of an embodiment may be any compound selected from the compounds represented by Compound Group 1. The organic electroluminescence device 10 of an embodiment may include at least one fused polycyclic compound selected from the compounds represented by Compound Group 1 or Compound Group 2 in the emission layer EML.

[Compound Group 1]

1

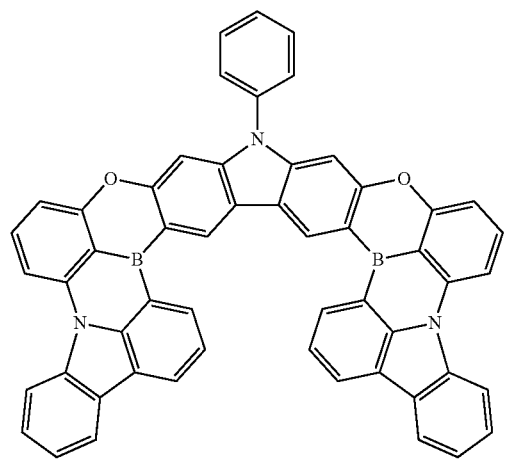

2

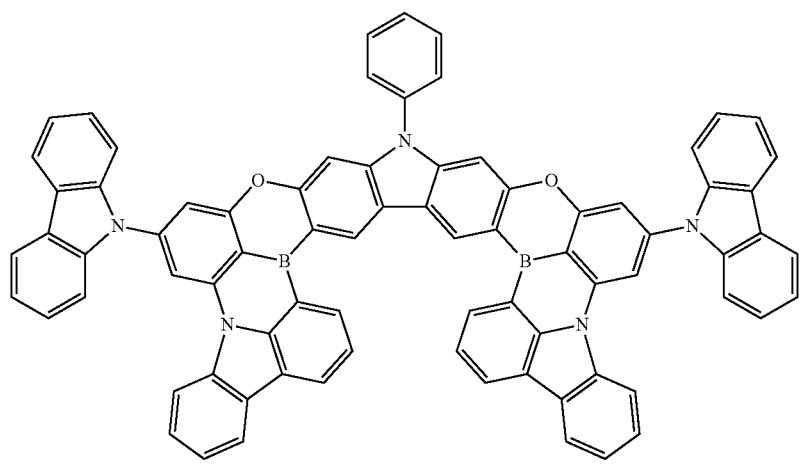

3
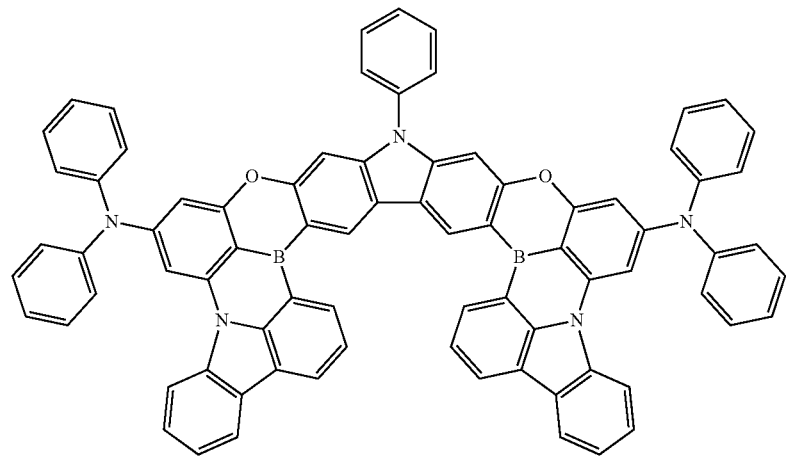
4
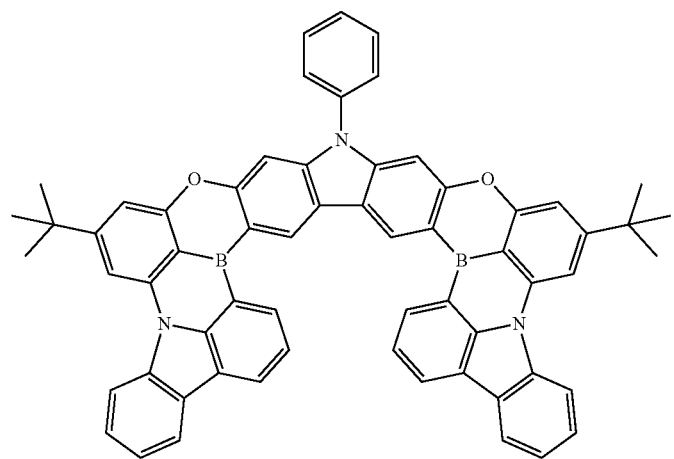
5
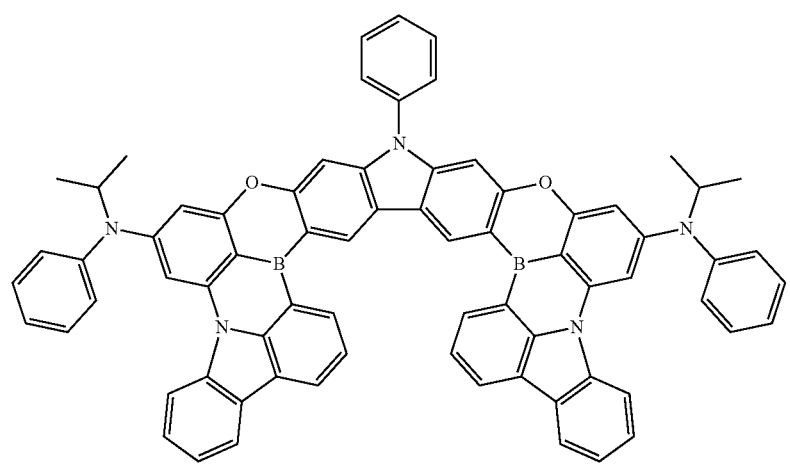

6
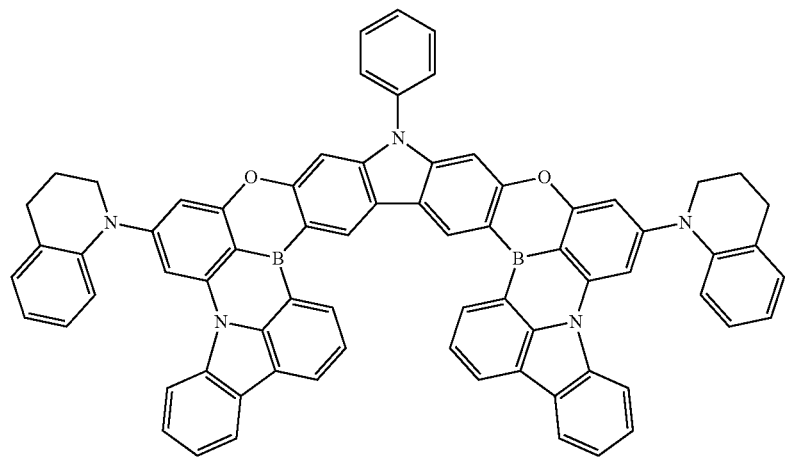
7
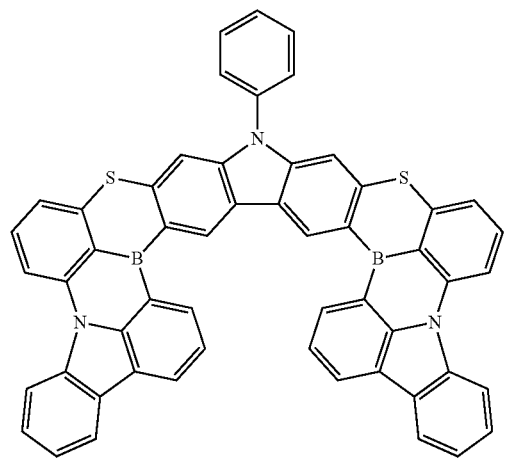
8
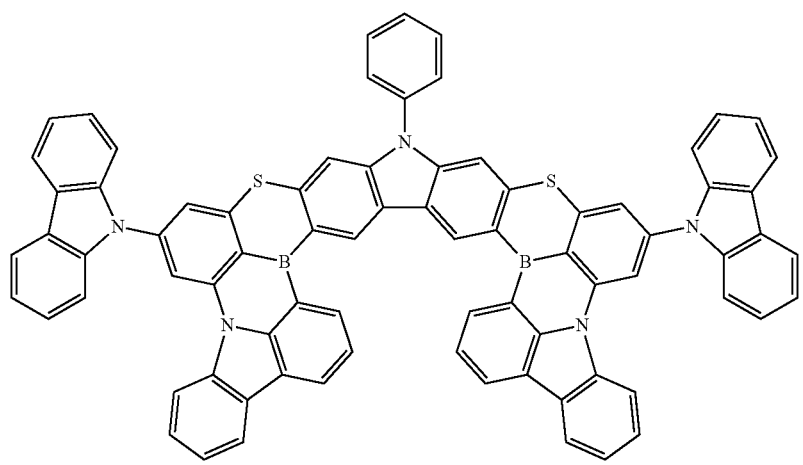

9
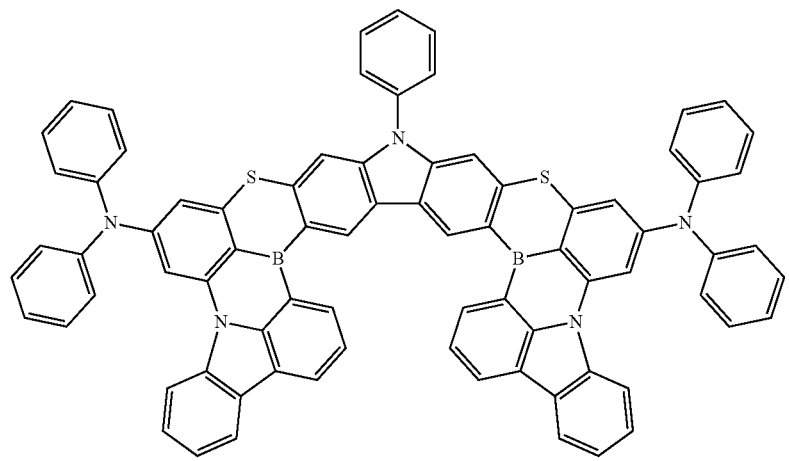
10
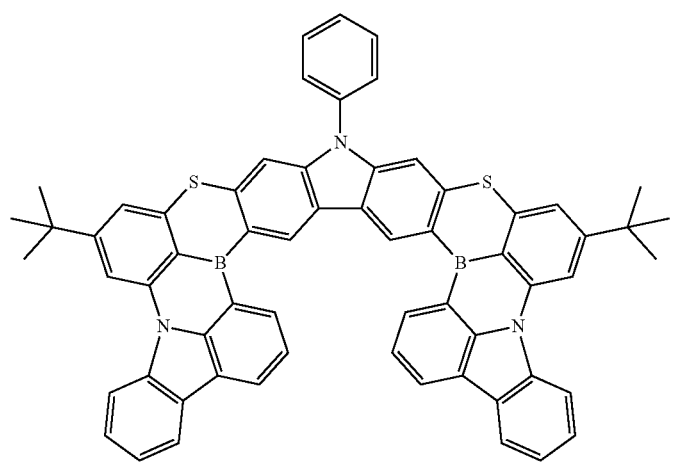
11
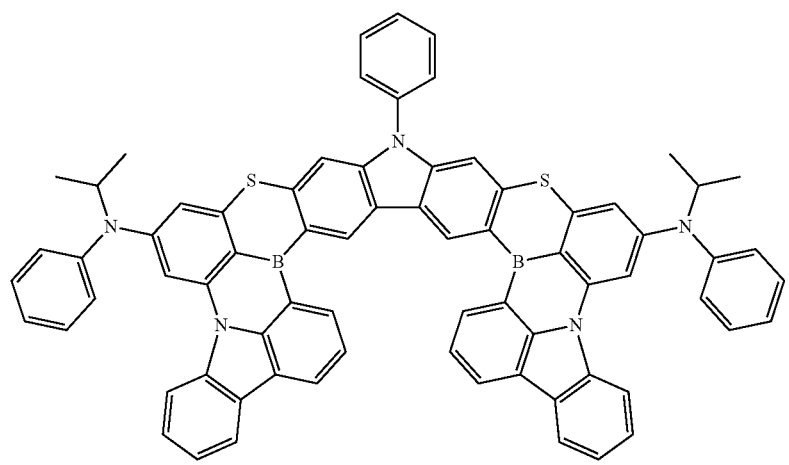

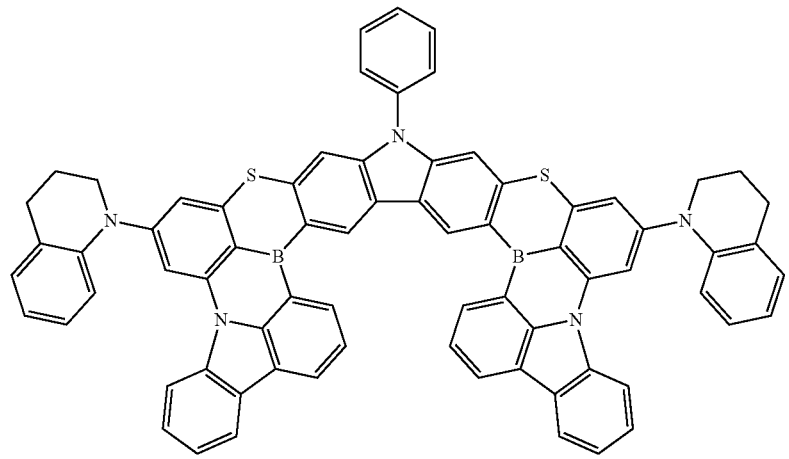
12
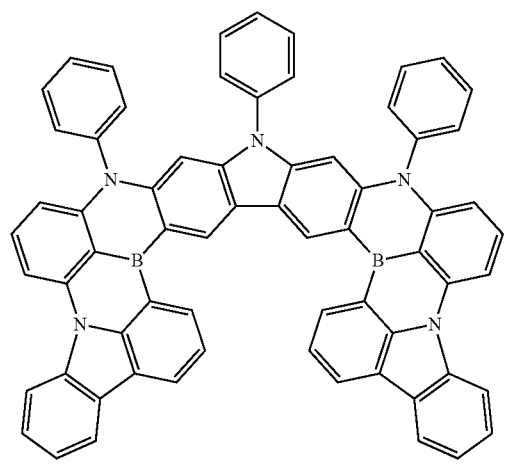
13
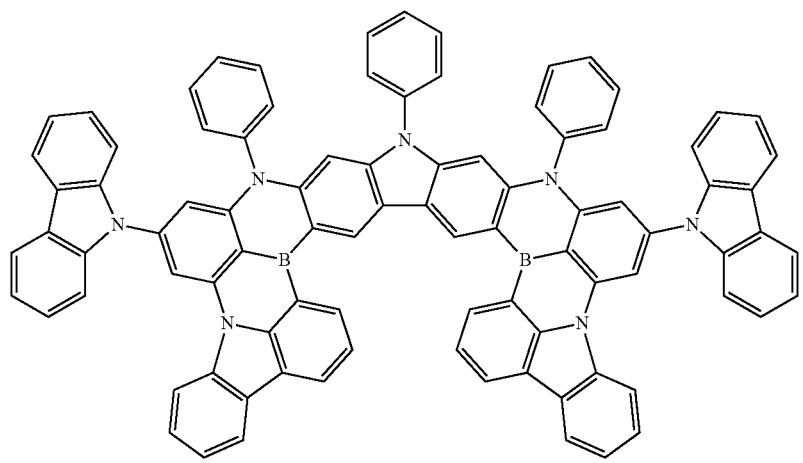
14

15
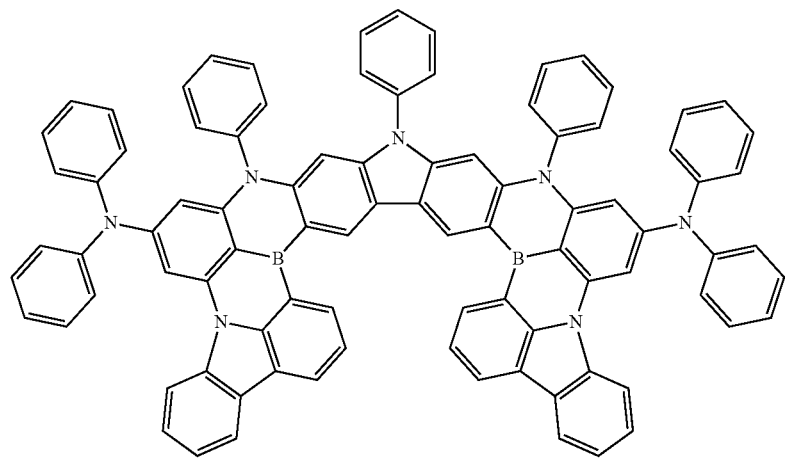
16
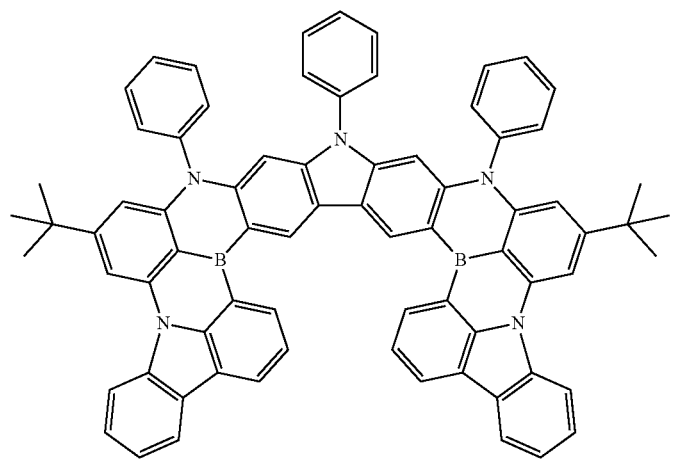
17
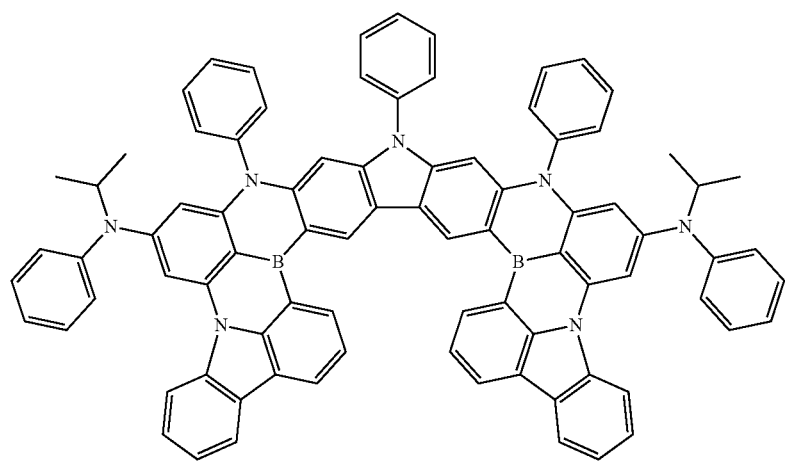

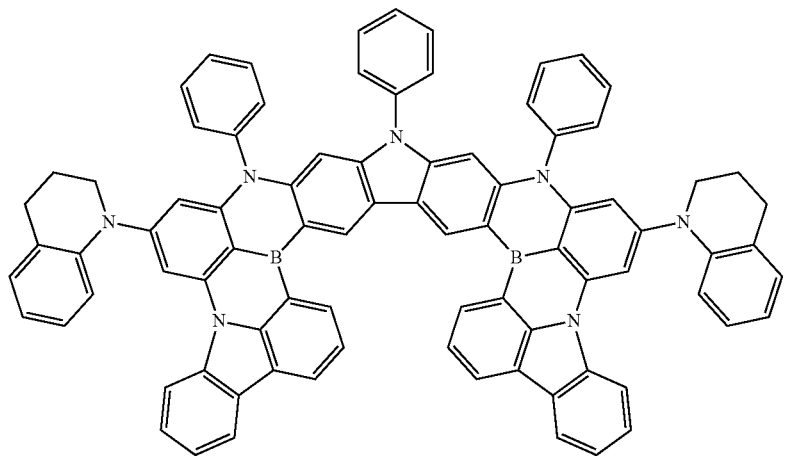
18
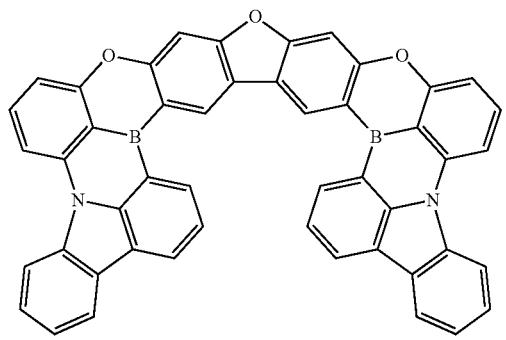
19
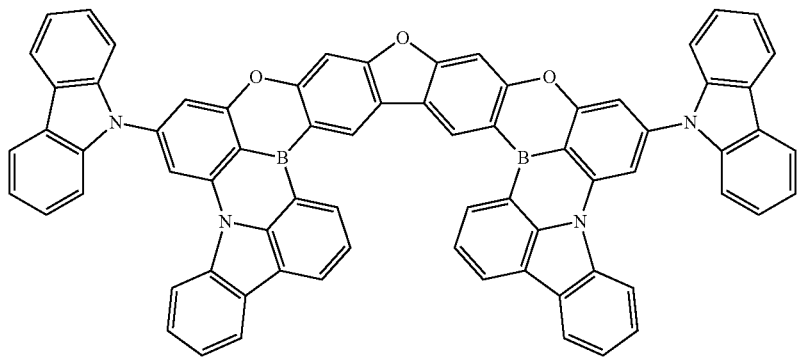
20
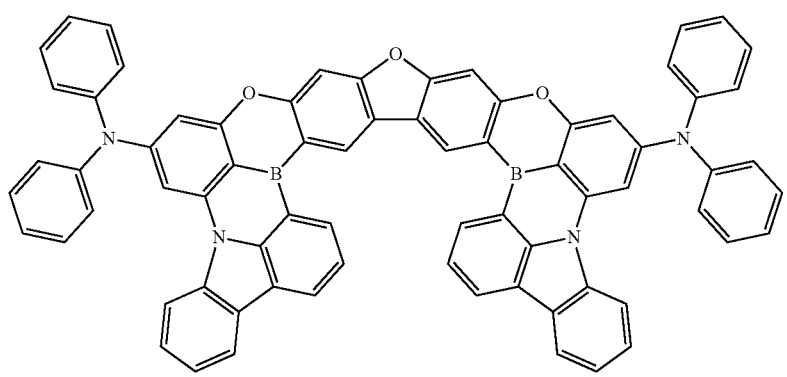
21

-continued
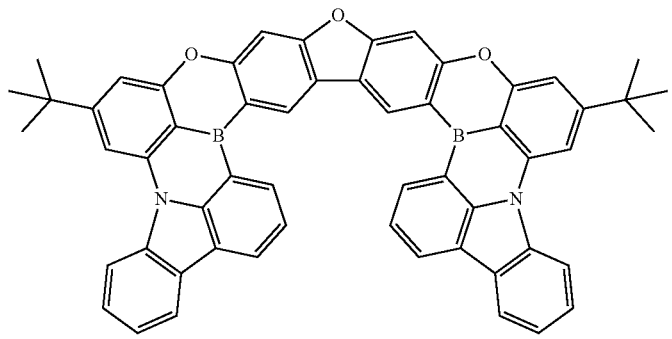
22
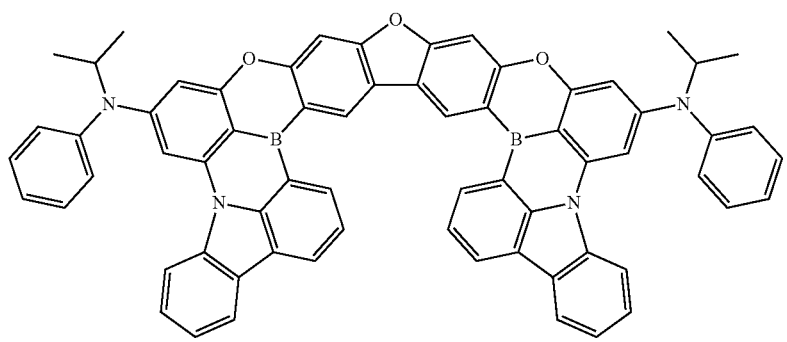
23
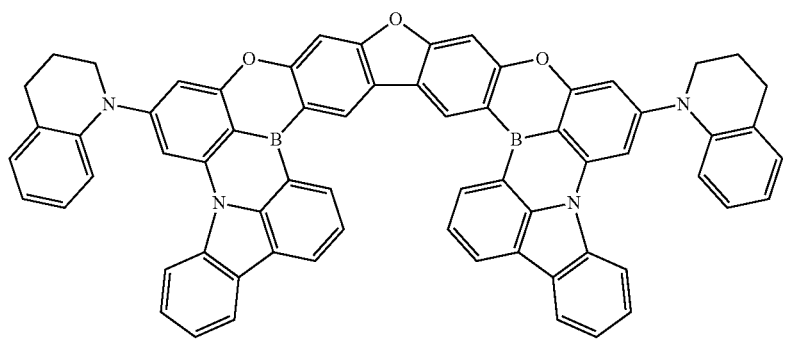
24
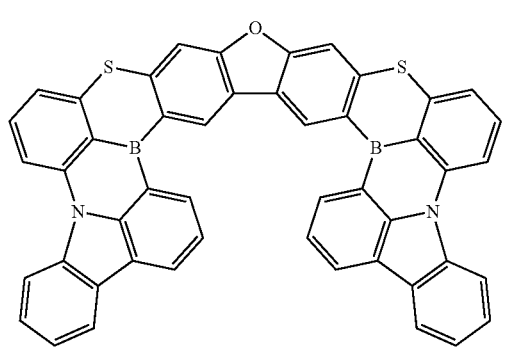
25

-continued
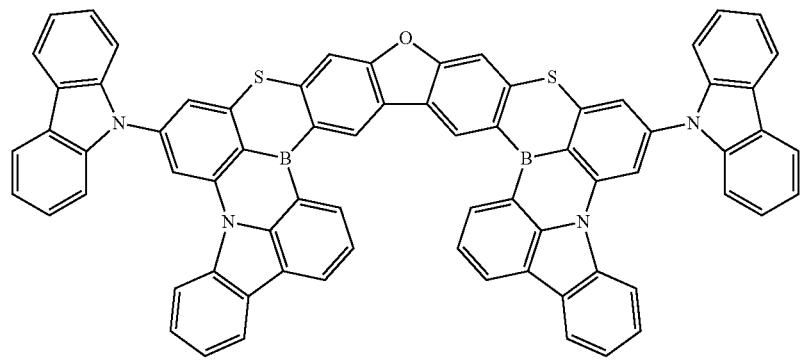
26
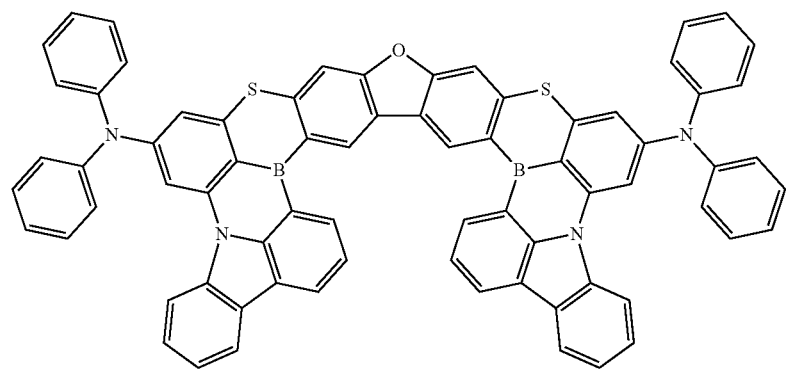
27
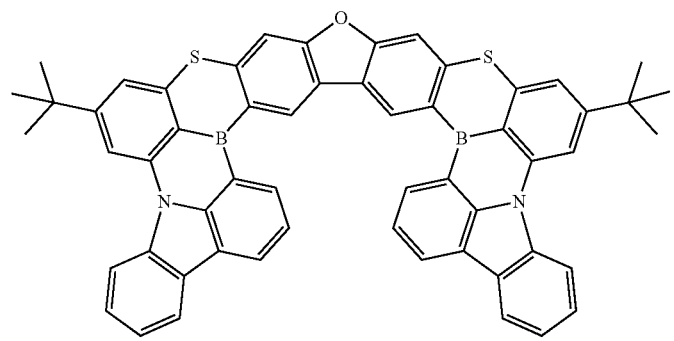
28
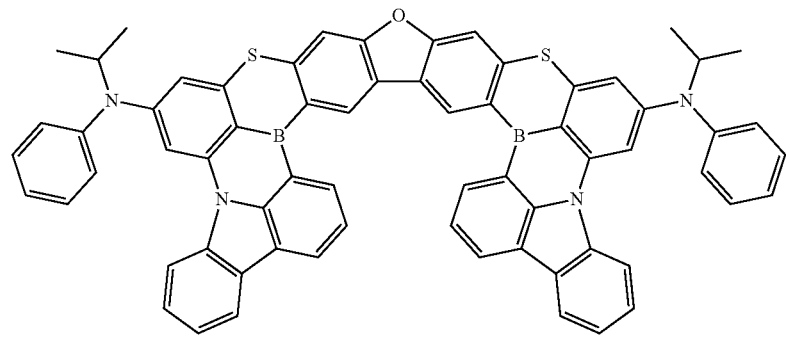
29

-continued
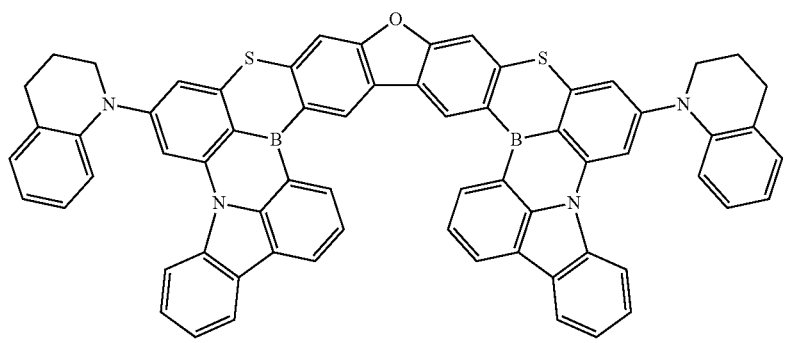
30
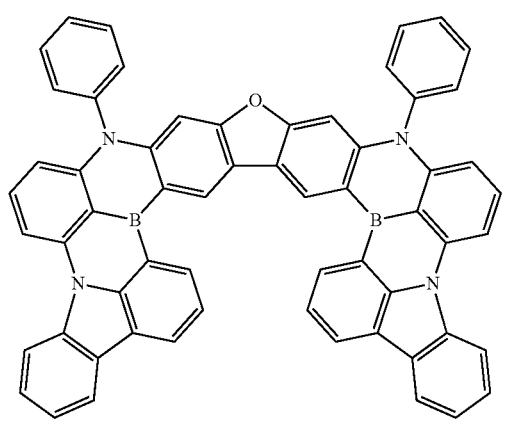
31
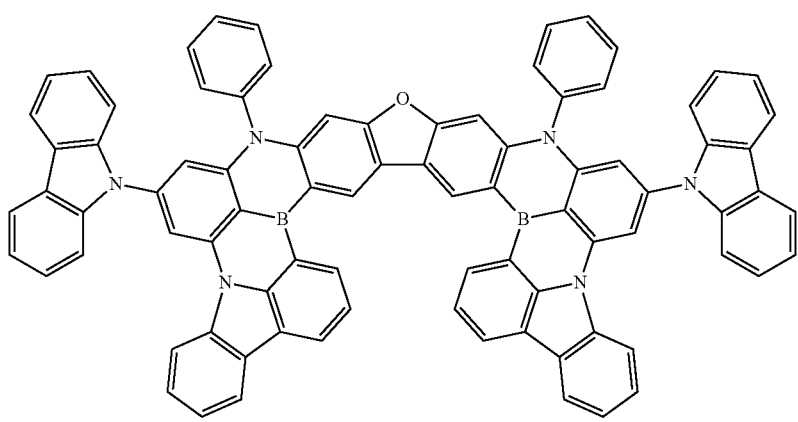
32
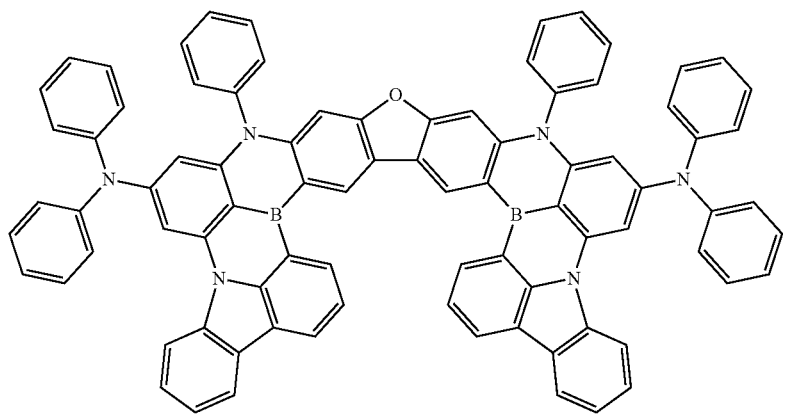
33

-continued
34
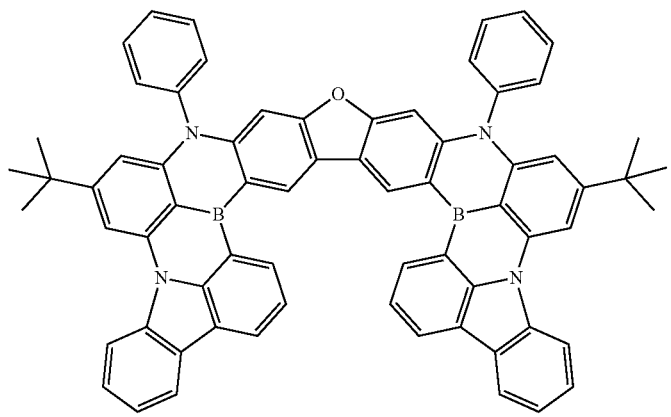
35
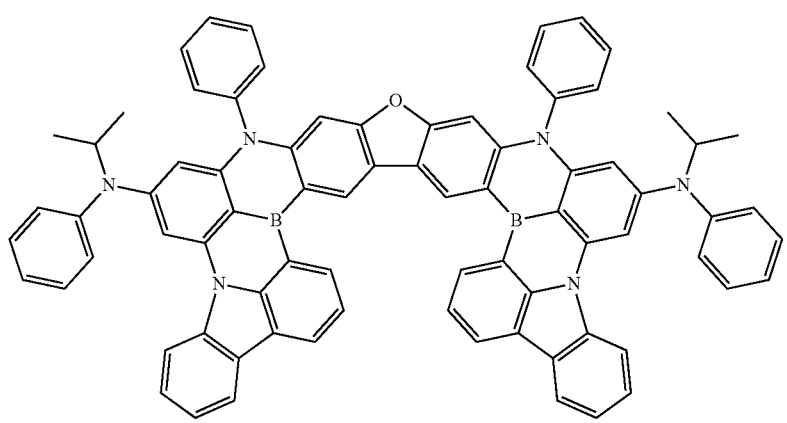
36
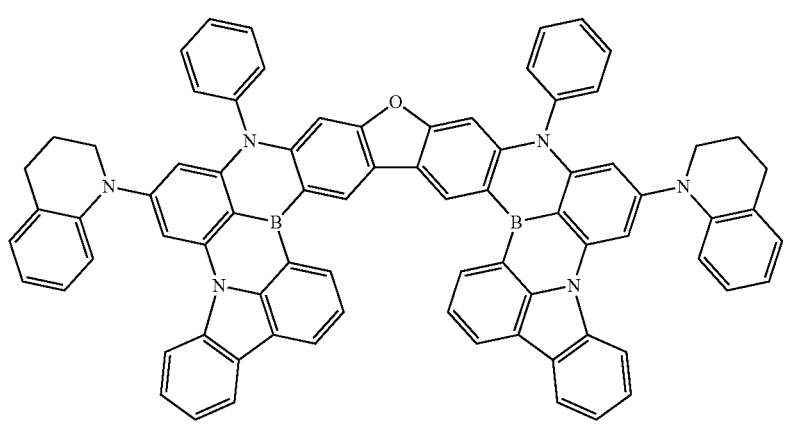
37
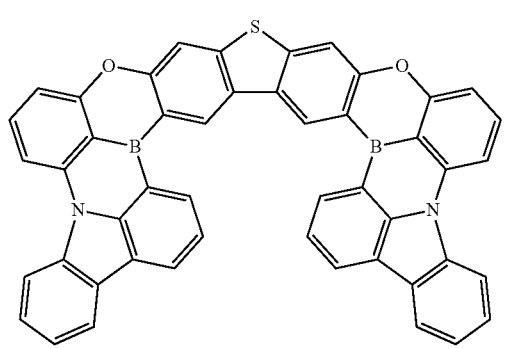

-continued
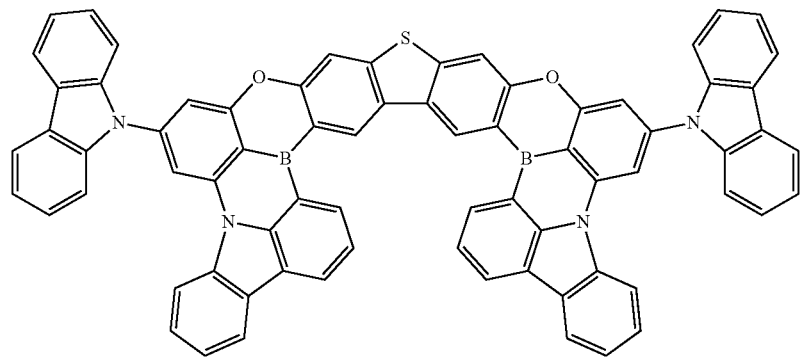
38
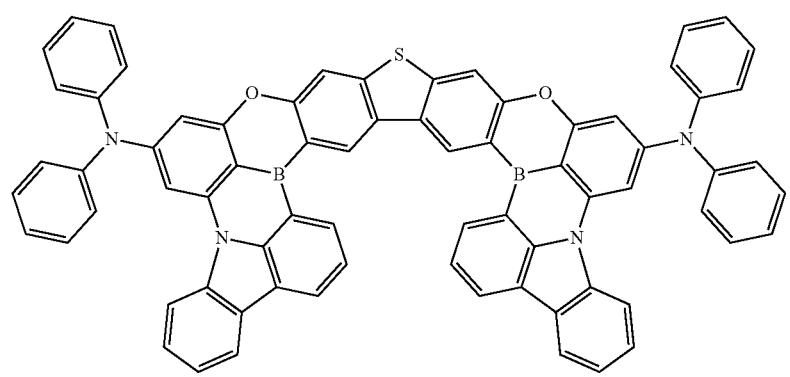
39
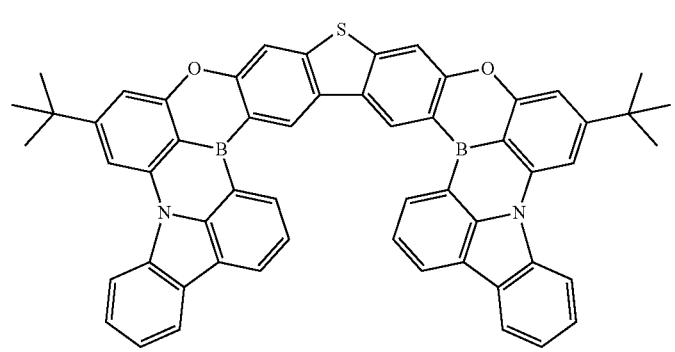
40
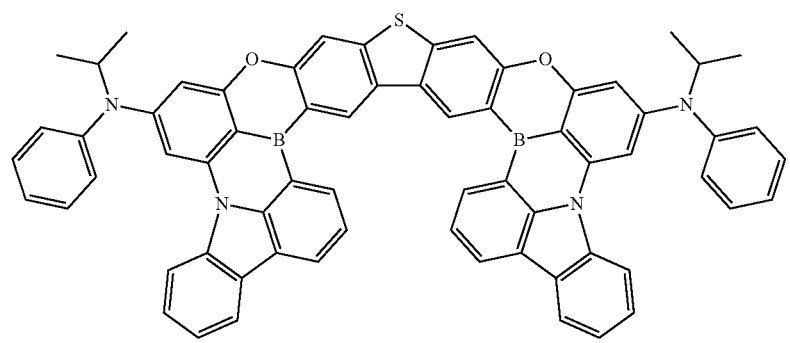
41

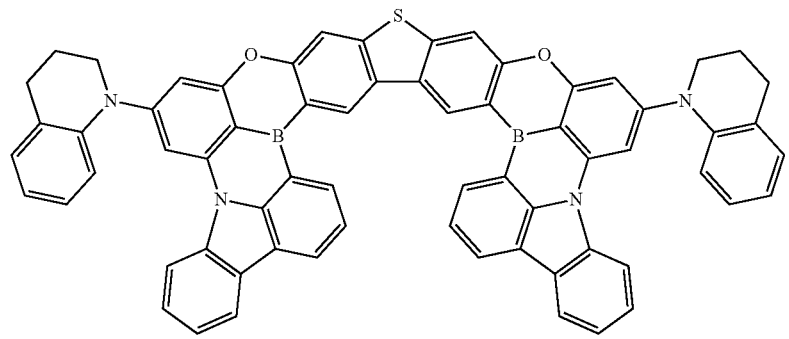
42
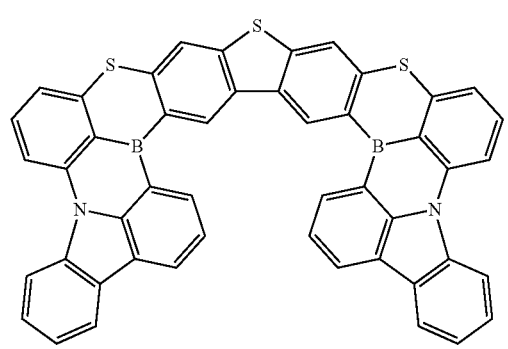
43
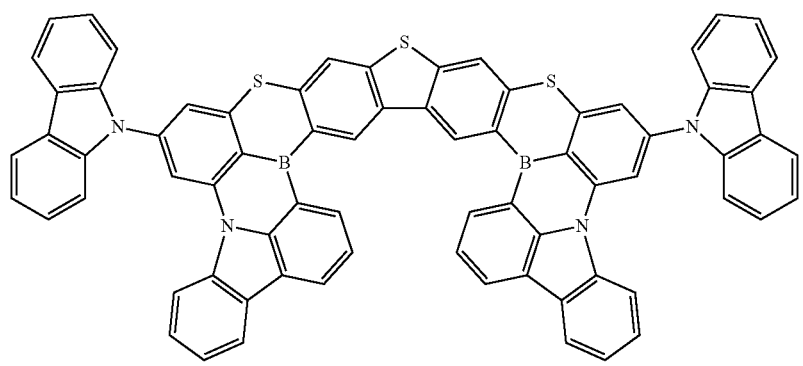
44
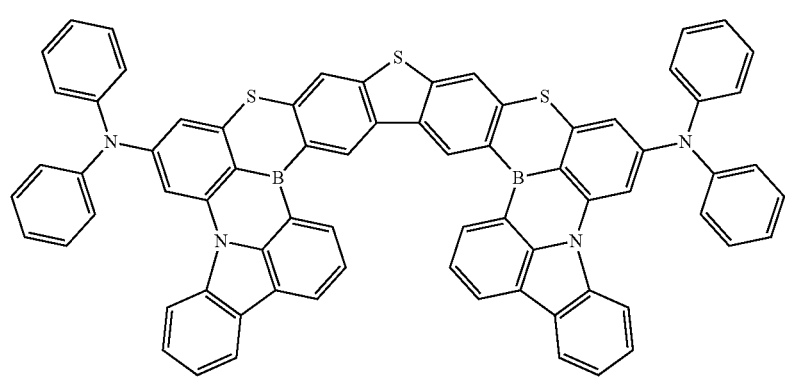
45

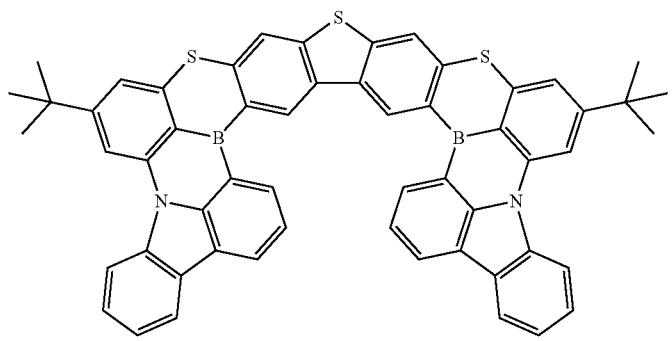
46
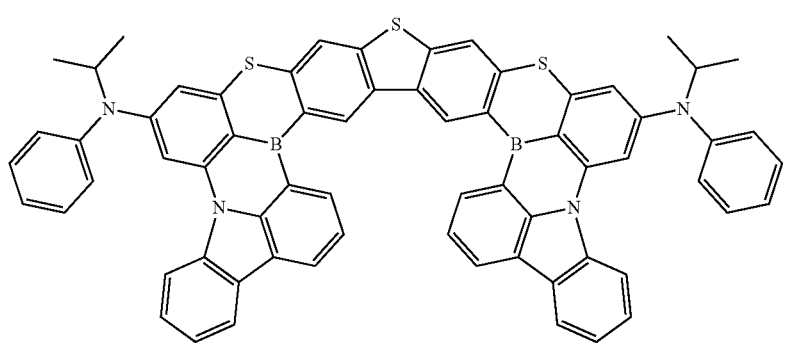
47
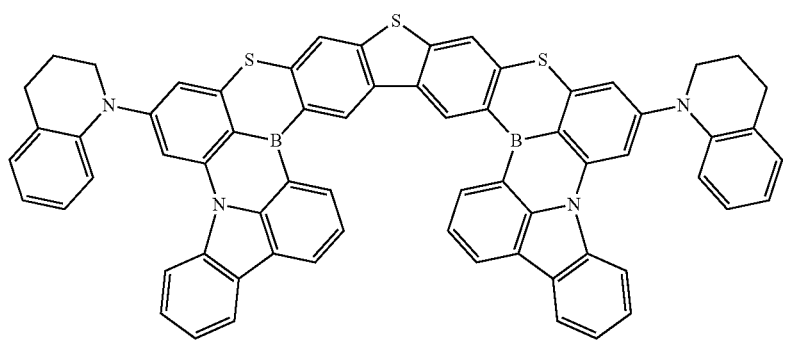
48
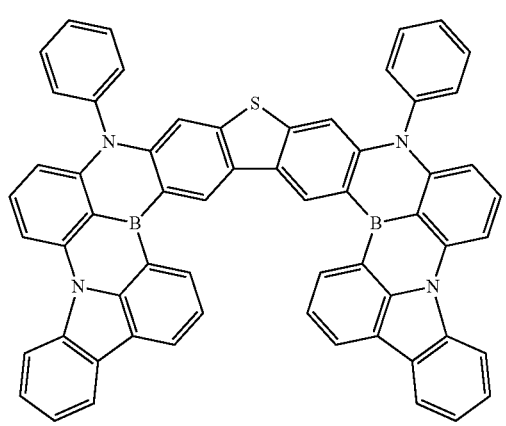
49

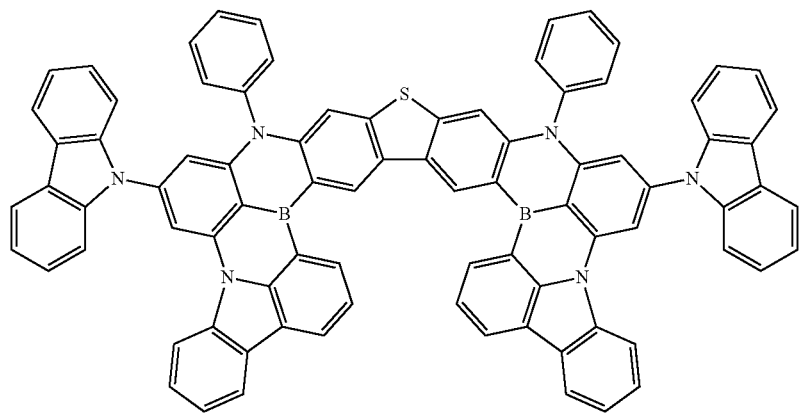
50
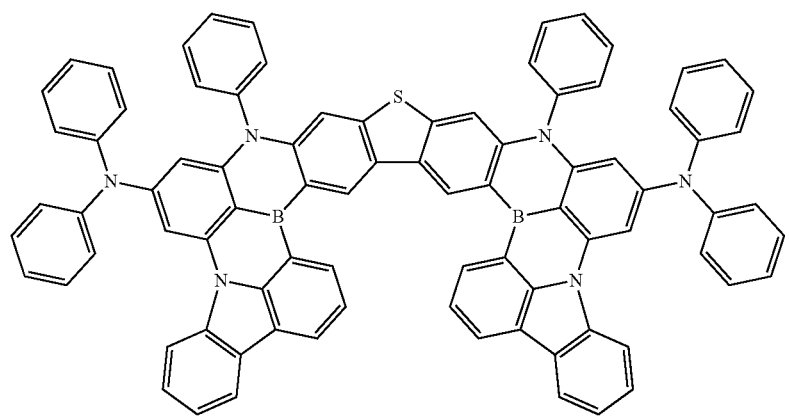
51
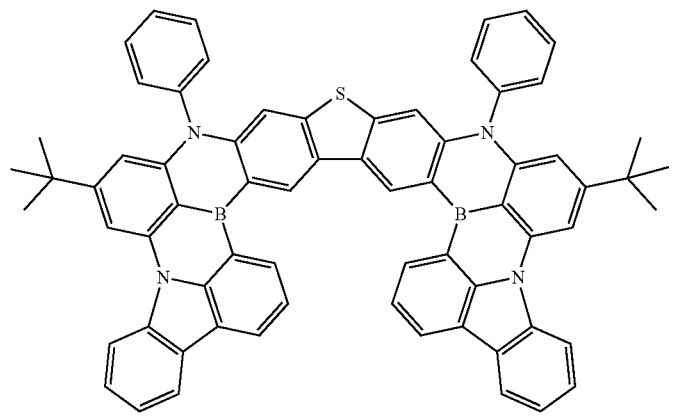
52
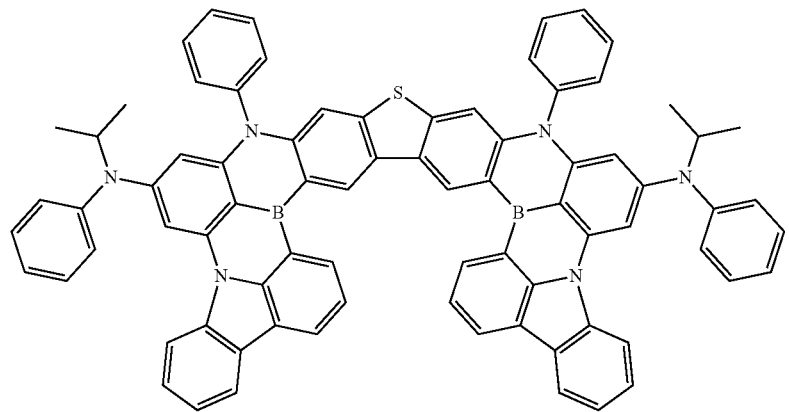
53

-continued
54
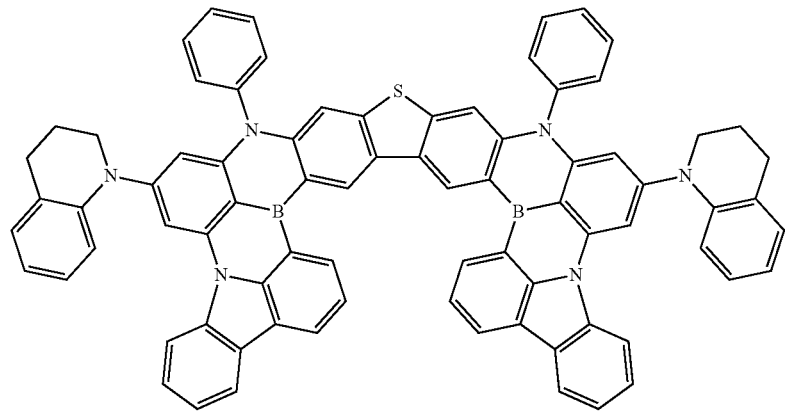
55
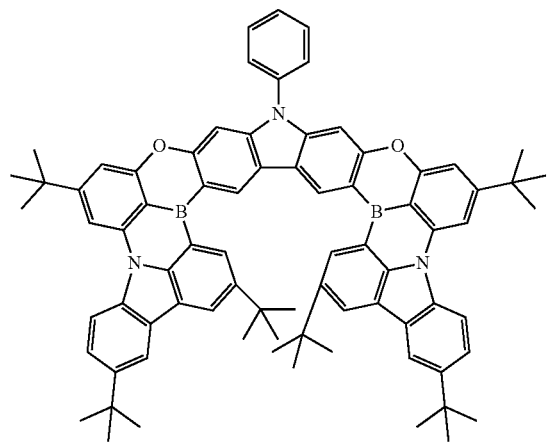
56
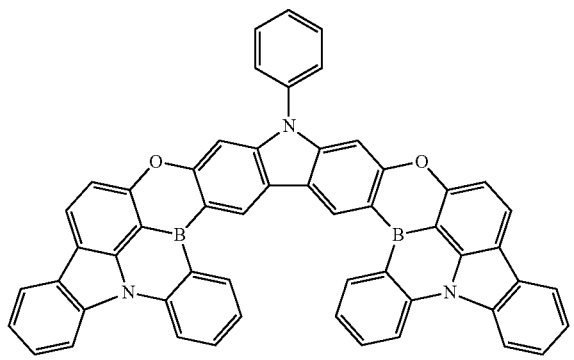
57
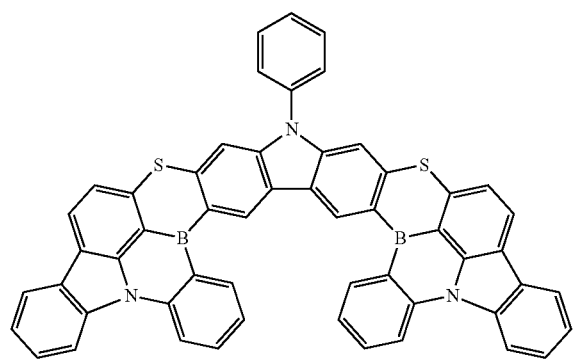
58
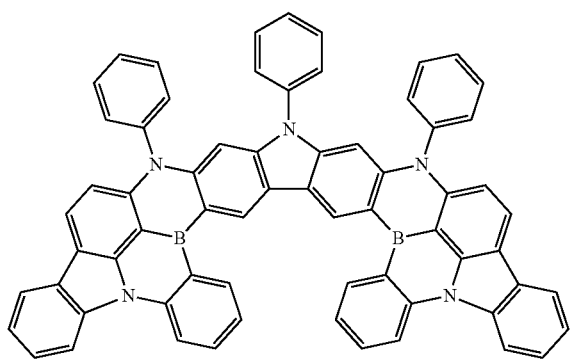
59
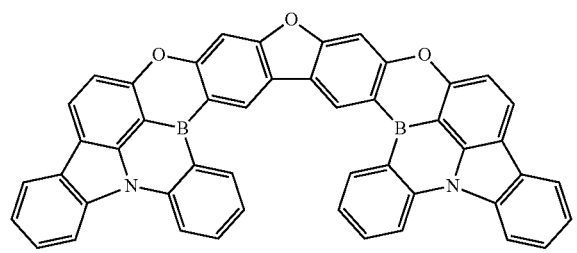
60
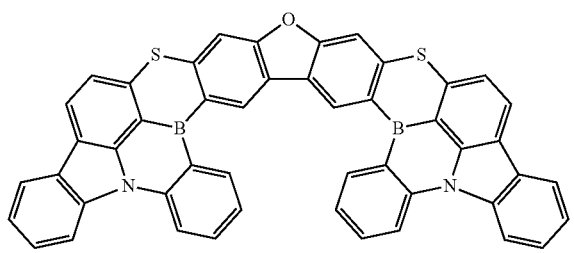

-continued
61
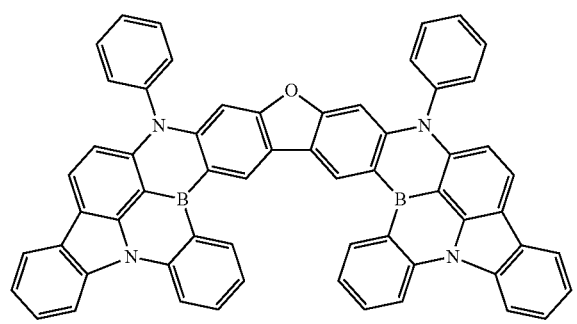
62
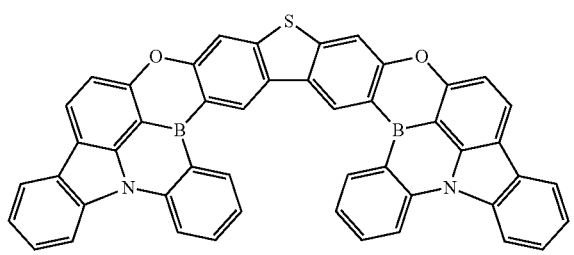
63
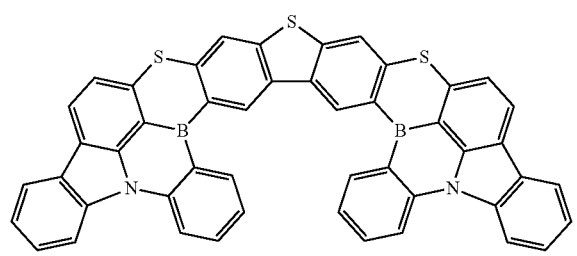
64
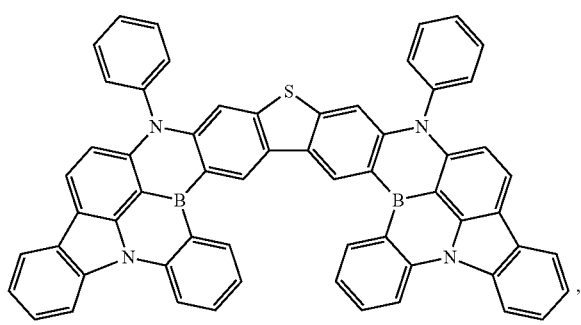
[Compound Group 2]
65
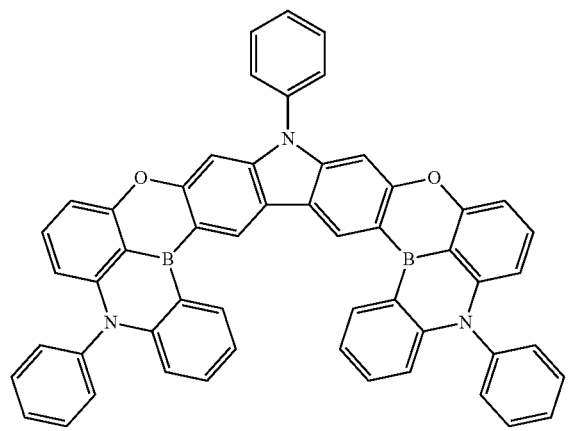
66
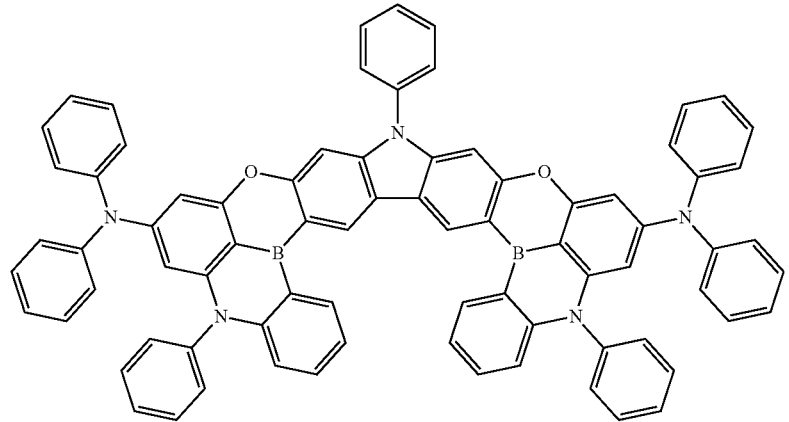

-continued
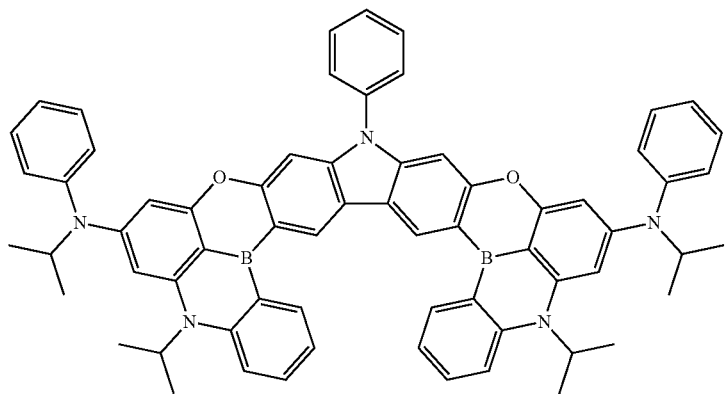
67
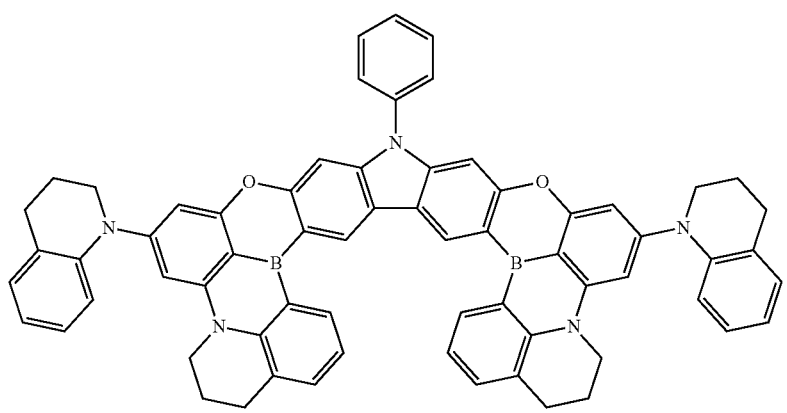
68
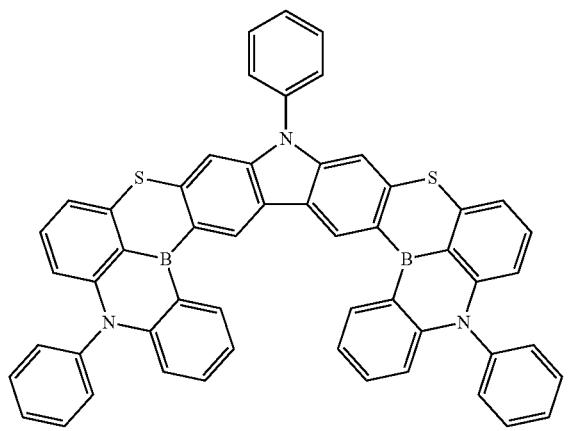
69
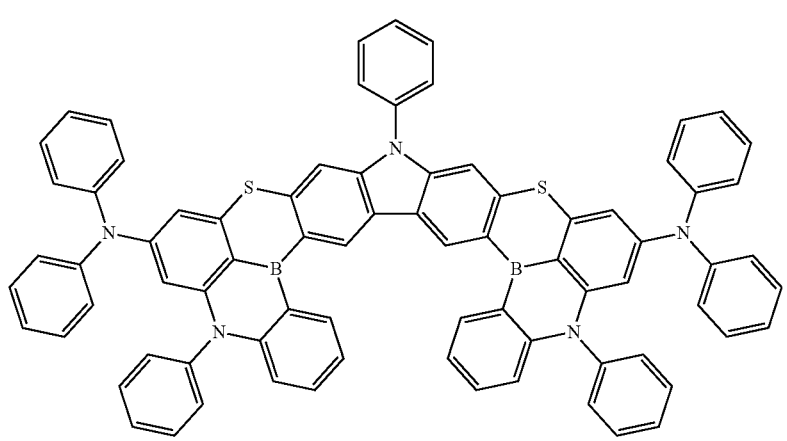
70

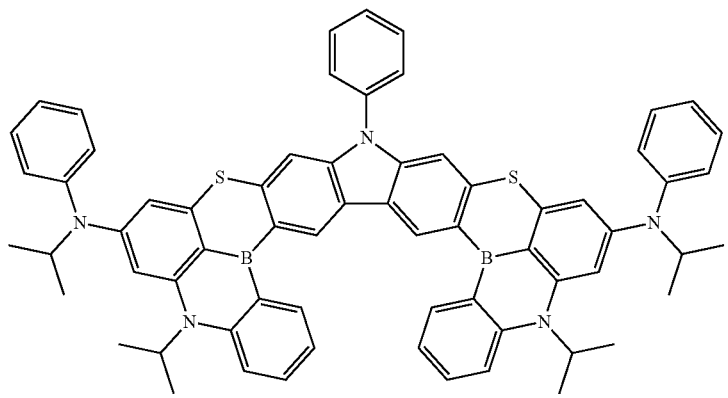
71
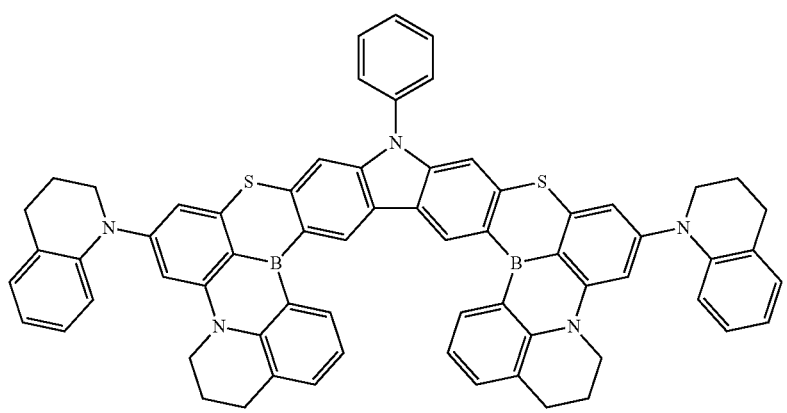
72
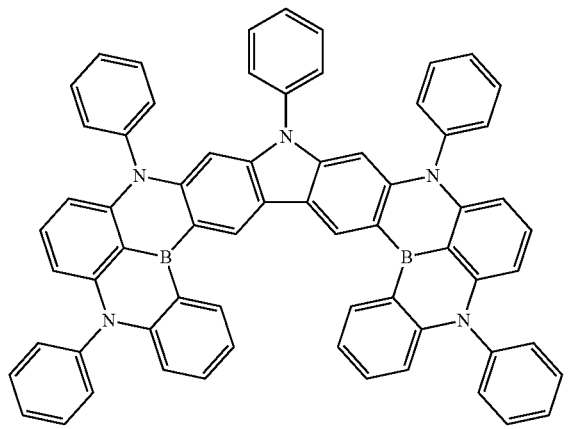
73
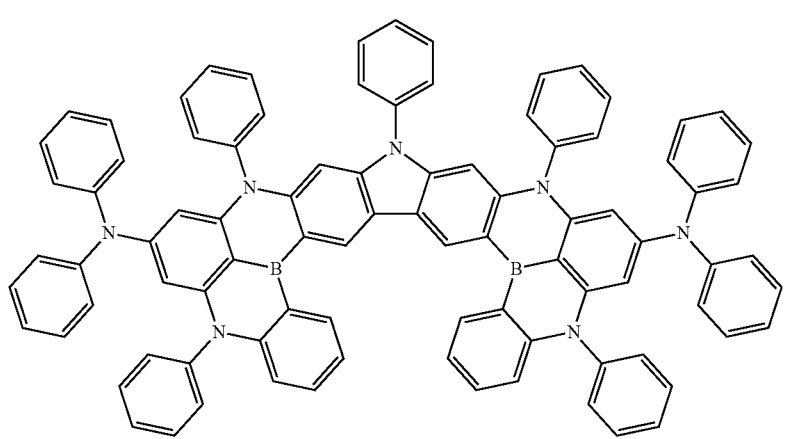
74

-continued
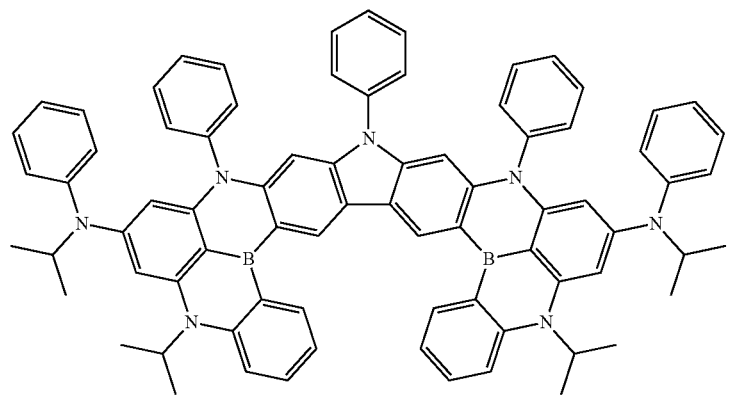
75
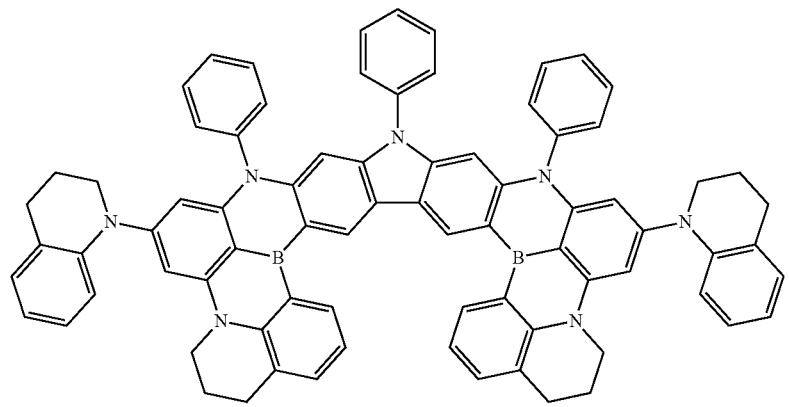
76
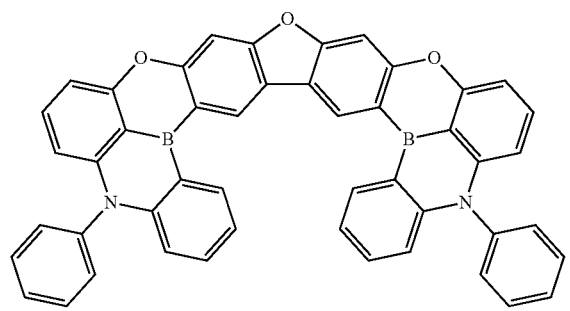
77
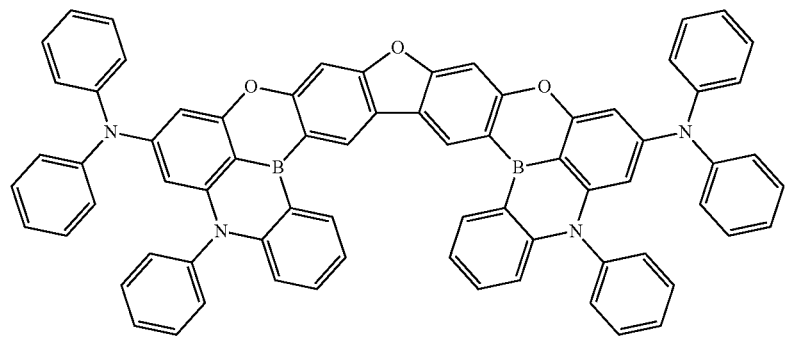
78

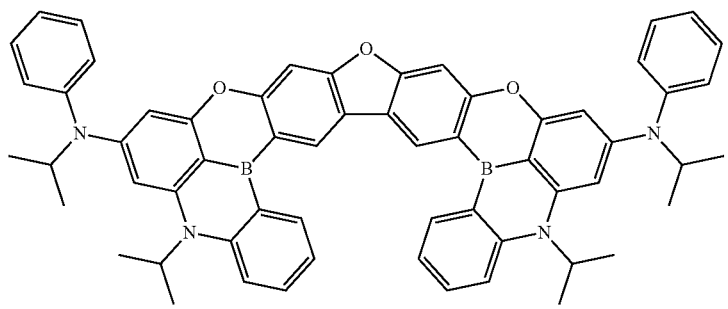
79
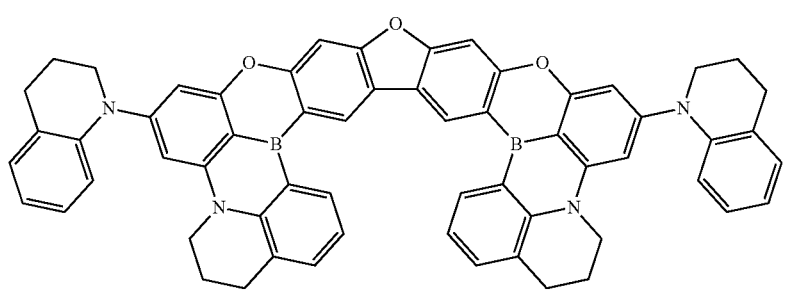
80
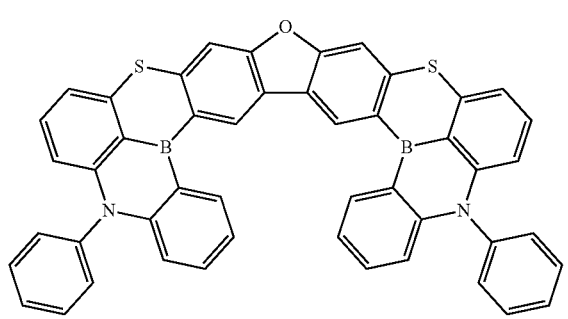
81
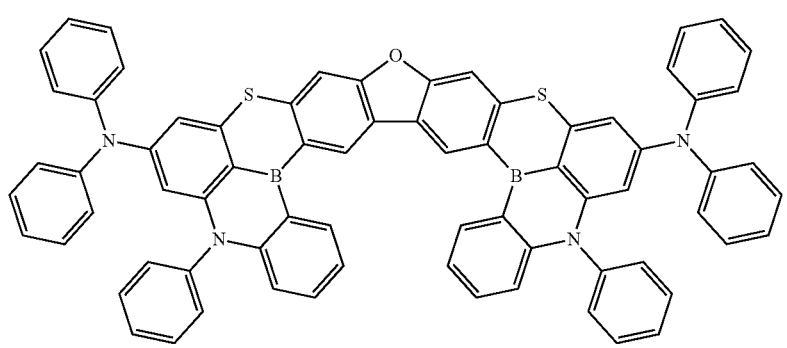
82
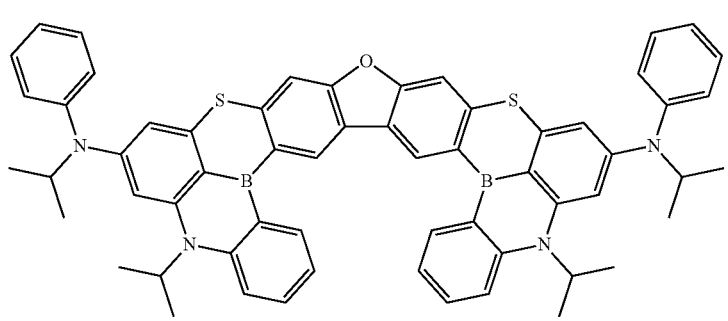
83

-continued
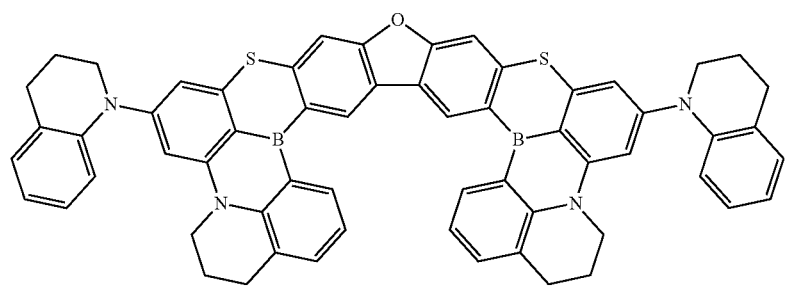
84
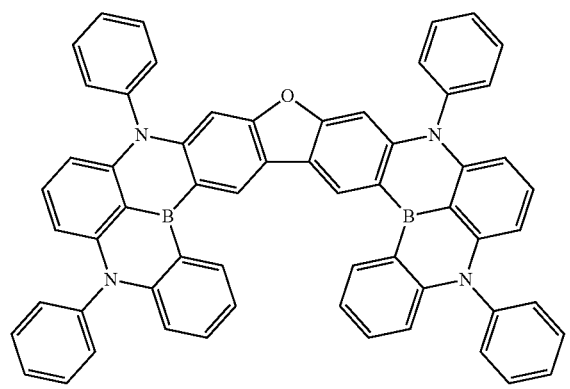
85
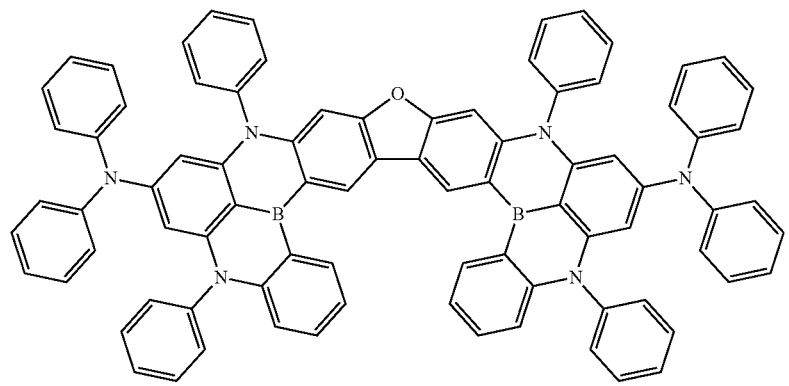
86
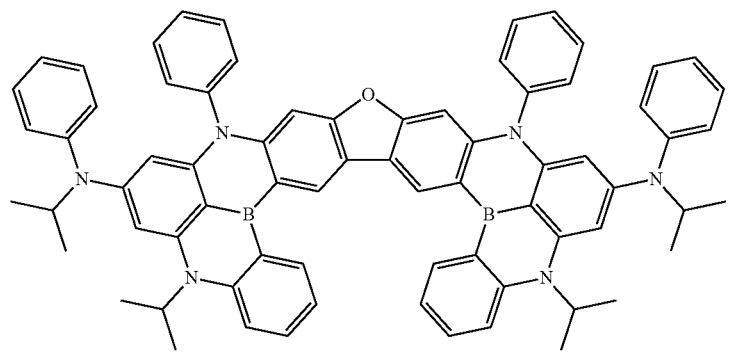
87

-continued
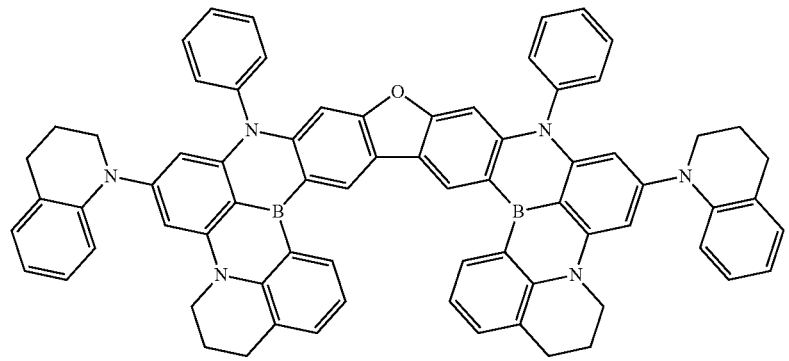
88
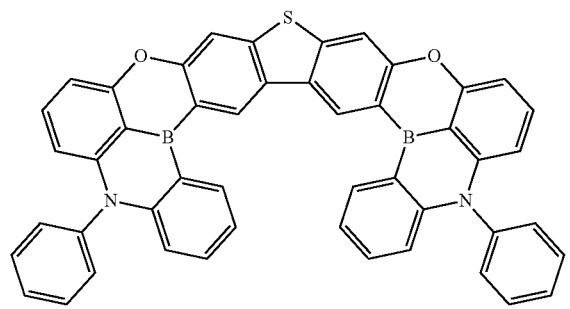
89
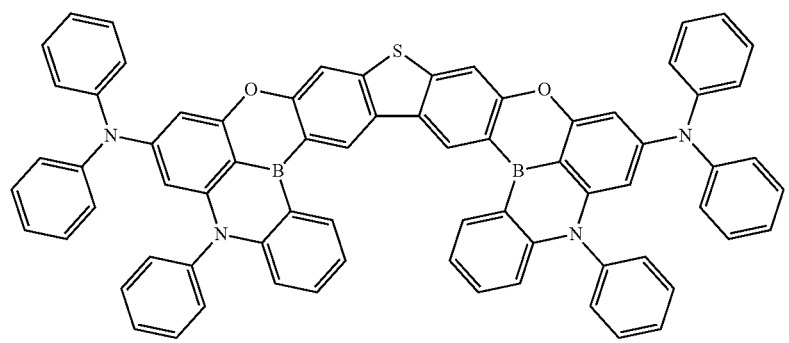
90
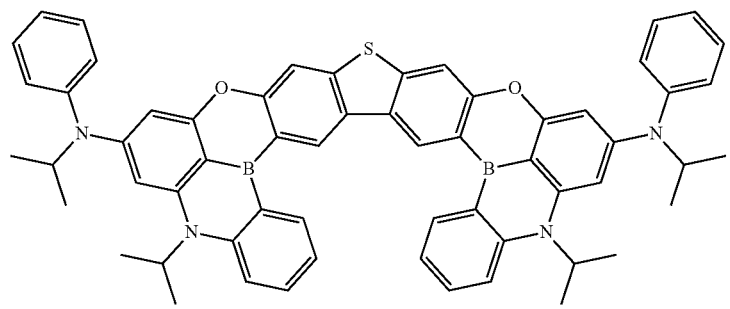
91
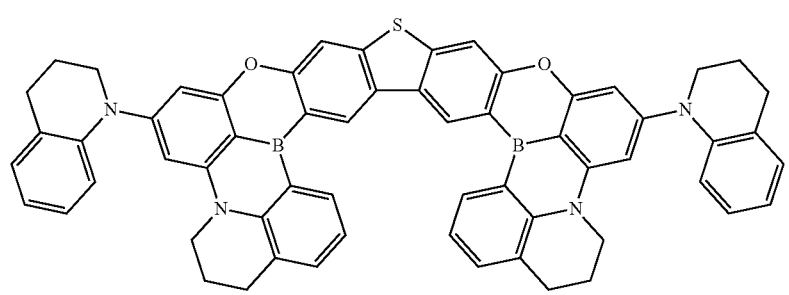
92

93
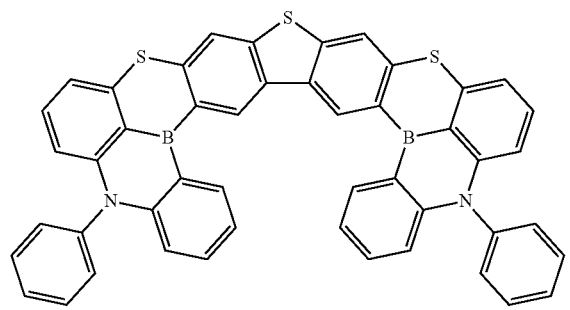
94
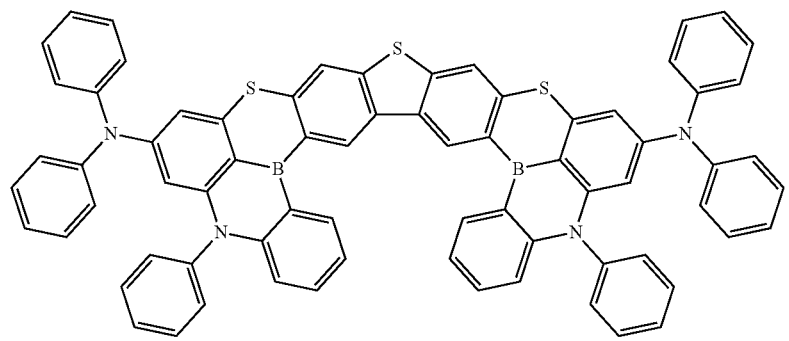
95
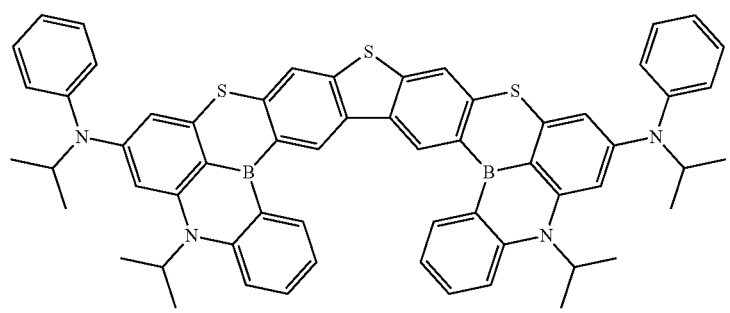
96
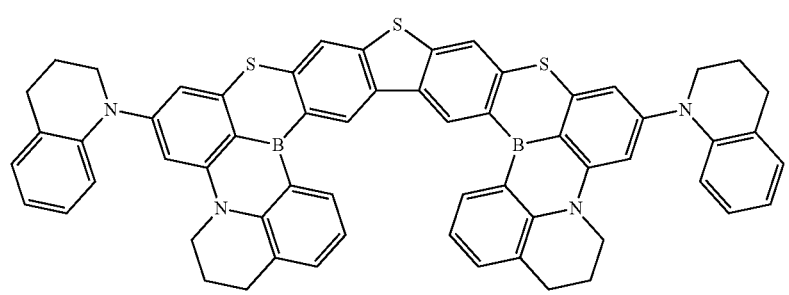
97
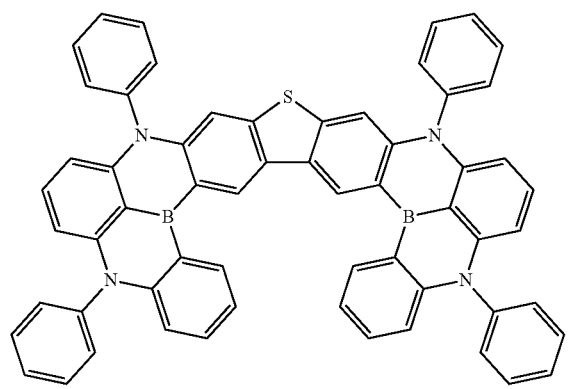

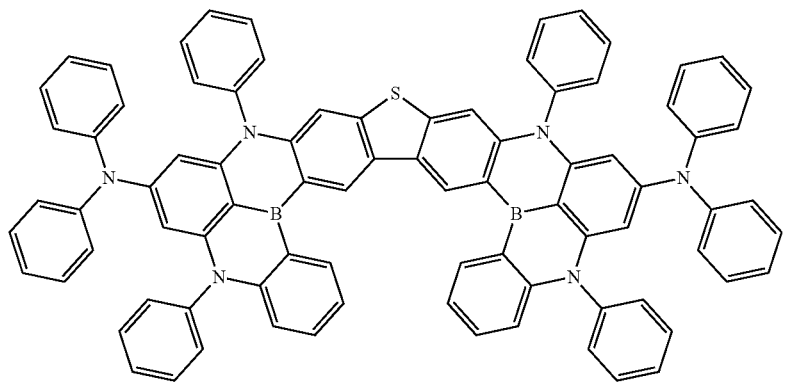

98

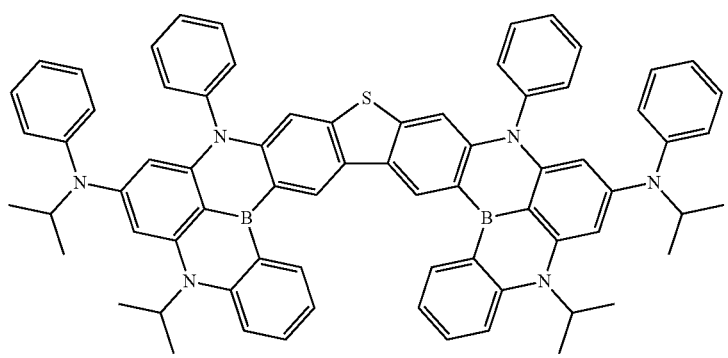

99

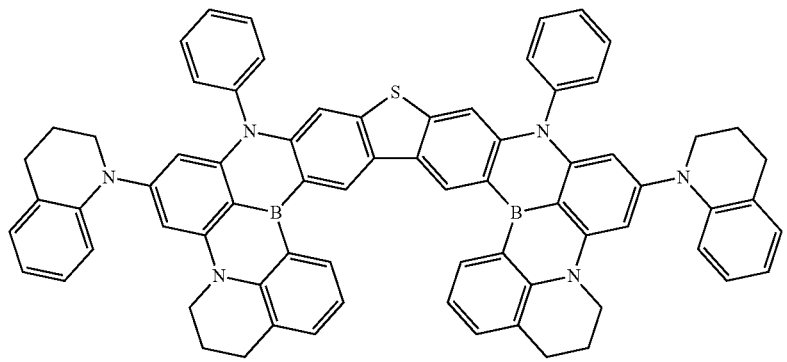

100

The fused polycyclic compound represented by Formula 1 of an embodiment may be a thermally activated delayed fluorescence emitting material. Furthermore, the fused polycyclic compound represented by Formula 1 of an embodiment may be a thermally activated delayed fluorescence dopant having an energy difference ($\Delta E_{ST}$) between the lowest triplet exciton energy level (T1 level) and the lowest singlet exciton energy level (S1 level) of 0.33 eV or less. The fused polycyclic compound represented by Formula 1 of an embodiment may be a thermally activated delayed fluorescence dopant having an energy difference ($\Delta E_{ST}$) between a lowest triplet exciton energy level (T1 level) and a lowest singlet exciton energy level (S1 level) of 0.2 eV or less. The fused polycyclic compound represented by Formula 1 of an embodiment may be a thermally activated delayed fluorescence dopant having an energy difference ($\Delta E_{ST}$) between a lowest triplet exciton energy level (T1 level) and a lowest singlet exciton energy level (S1 level) of 0.1 eV or less.

The fused polycyclic compound represented by Formula 1 of an embodiment may be a luminescence material having a luminescence center wavelength in the 430 nm to 490 nm wavelength region. For example, the fused polycyclic compound represented by Formula 1 of an embodiment may be a blue thermally activated delayed fluorescence (TADF) dopant. However, embodiments are not limited thereto, when the fused polycyclic compound of an embodiment is used as a luminescence material, the fused polycyclic compound may be used as a dopant material to emit light in any suitable wavelength region light, as a red luminescence dopant, and a green luminescence dopant.

The emission layer EML in the organic electroluminescence device 10 of an embodiment may be to emit delayed fluorescence. For example, the emission layer EML may be to emit thermally activated delayed fluorescence (TADF).

In some embodiments, the emission layer EML of the organic electroluminescence device 10 may be to emit blue light. For example, the emission layer EML of the organic electroluminescence device 10 of an embodiment may be to emit blue light in the wavelength region of 490 nm or more.

However, embodiments are not limited thereto, and in some embodiments, the emission layer EML may be to emit green light or red light.

The organic electroluminescence device 10 of an embodiment may include a plurality of emission layers. The plurality of emission layers may be sequentially laminated and provided, and for example, the organic electroluminescence device 10 including the plurality of emission layers may be to emit white light. The organic electroluminescence device including the plurality of emission layers may be an organic electroluminescence device having a tandem structure. When the organic electroluminescence device 10 includes a plurality of emission layers, at least one emission layer EML may include the fused polycyclic compound of an embodiment as described above.

In an embodiment, the emission layer EML includes a host and a dopant, and may include the above-described fused polycyclic compound as a dopant. For example, the emission layer EML in the organic electroluminescence device 10 of an embodiment may include a host for emitting delayed fluorescence and a dopant for emitting delayed fluorescence, and may include the above-described fused polycyclic compound as a dopant for emitting delayed fluorescence. The emission layer EML may include at least one selected from the fused polycyclic compounds represented by Compound Group 1 as a thermally activated delayed fluorescence dopant.

In an embodiment, the emission layer EML is a delayed fluorescence emission layer, and the emission layer EML may include any suitable host material and the above-described fused polycyclic compound. For example, in an embodiment, the fused polycyclic compound may be used as a TADF dopant.

In an embodiment, the emission layer may include any suitable host material. Any suitable material may be used as the host material of the emission layer EML, for example, one selected from fluoranthene derivatives, pyrene derivatives, arylacetylene derivatives, anthracene derivatives, fluorene derivatives, perylene derivatives, chrysene derivatives, etc. In some embodiments, the host material may include pyrene derivatives, perylene derivatives, and anthracene derivatives. For example, as the host material of the emission layer EML, anthracene derivatives represented by Formula 5 may be used:

[Formula 5]

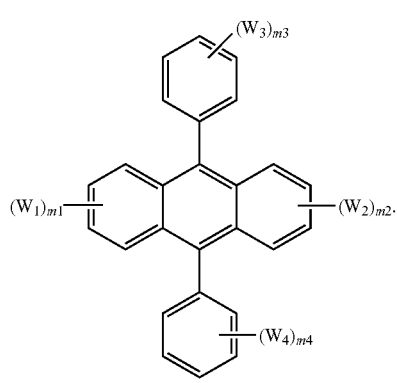

In Formula 5, $W_1$ to $W_4$ may each independently be a hydrogen atom, a deuterium atom, a halogen atom, a substituted or unsubstituted silyl group, a substituted or unsubstituted alkyl group having 1 to 20 carbon atoms, a substituted or unsubstituted aryl group having 6 to 30 carbon atoms to form a ring, or a substituted or unsubstituted heteroaryl group of 2 to 30 carbon atoms to form a ring, or may be combined with an adjacent group to form a ring, where $m_1$ and $m_2$ may each independently be an integer of 0 to 4, and $m_3$ and $m_4$ may each independently be an integer of 0 to 5.

When $m_1$ is 1, $W_1$ may not be a hydrogen atom, when $m_2$ is 1, $W_2$ may not be a hydrogen atom, when $m_3$ is 1, $W_3$ may not be a hydrogen atom, and when $m_4$ is 1, $W_4$ may not be a hydrogen atom.

When $m_1$ is 2 or more, the plurality of $W_1$ groups are the same or different. When $m_2$ is 2 or more, the plurality of $W_2$ groups are the same or different. When $m_3$ is 2 or more, the plurality of $W_3$ groups are the same or different. When $m_4$ is 2 or more, the plurality of $W_4$ groups are the same or different.

The compound represented by Formula 5 may be represented by the following structures, but the compound represented by Formula 5 is not limited thereto:

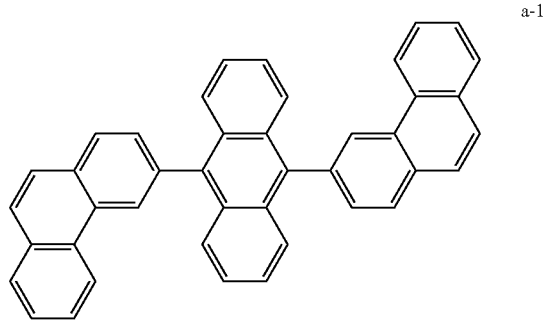

a-1

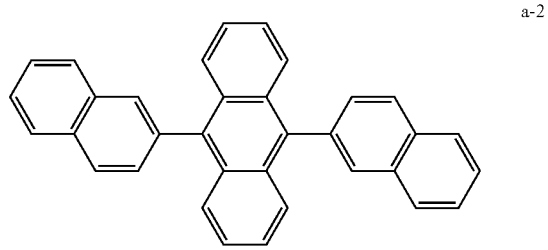

a-2

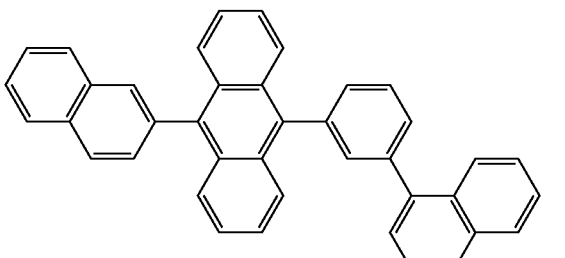

a-3

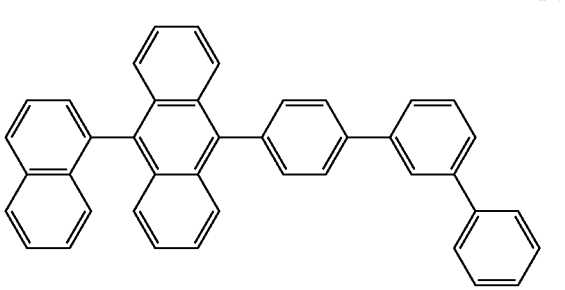

a-4

-continued a-5
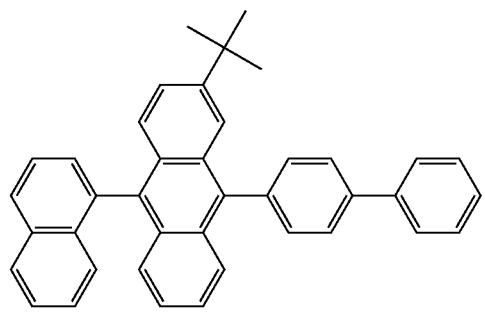

a-6
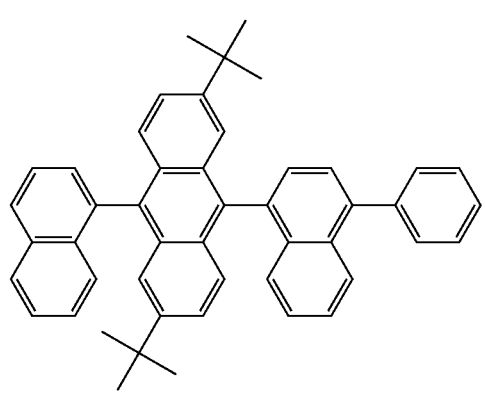

a-7
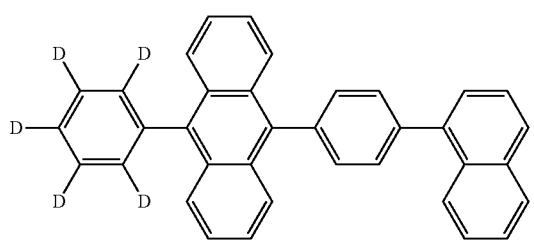

a-8
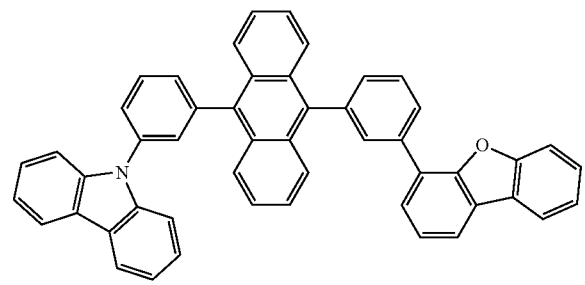

a-9
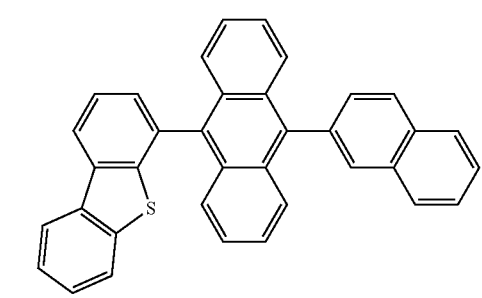

-continued a-10
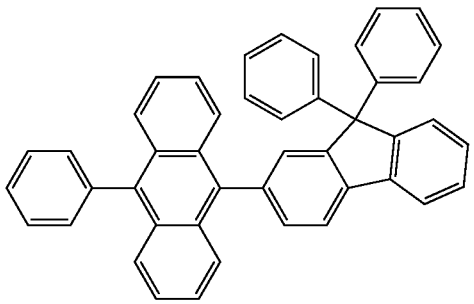

a-11
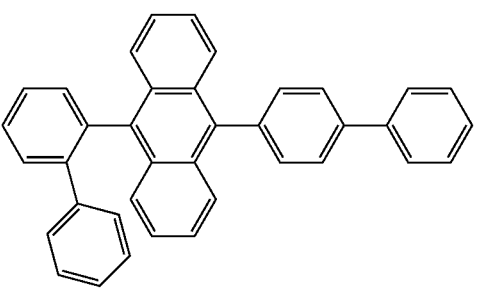

a-12
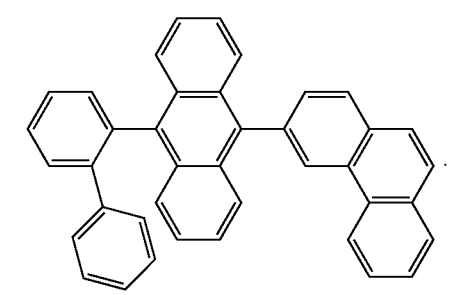

In an embodiment, the emission layer EML may include, as host materials, tris(8-hydroxyquinolino)aluminum (Alq3), 4,4'-bis(N-carbazolyl)-1,1'-biphenyl (CBP), poly(n-vinylcarbazole (PVK), 9,10-di(naphthalene-2-yl)anthracene (ADN), 4,4',4"-tris(carbazol-9-yl)-triphenylamine (TCTA), 1,3,5-tris(N-phenylbenzimidazole-2-yl)benzene (TPBi), 3-tert-butyl-9,10-di(naphth-2-yl)anthracene (TBADN), distyrylarylene (DSA), 4,4'-bis(9-carbazolyl)-2,2'-dimethyl-biphenyl (CDBP), 2-methyl-9,10-bis(naphthalen-2-yl)anthracene (MADN), bis[2-(diphenylphosphino)phenyl]ether oxide (DPEPO), hexaphenyl cyclotriphosphazene (CP1), 1,4-bis(triphenylsilyl)benzene (UGH2), hexaphenylcyclotrisiloxane (DPSiO3), octaphenylcyclotetra siloxane (DPSiO4), 2,8-bis(diphenylphosphoryl)dibenzofuran (PPF), 3,3'-bis(N-carbazolyl)-1,1'-biphenyl (mCBP), 1,3-bis(N-carbazolyl)benzene (mCP), etc. However, embodiments are not limited thereto, and any suitable delayed fluorescence emission host materials may be included.

Meanwhile, the emission layer EML in the organic electroluminescence device 10 of an embodiment may further include any suitable dopant materials. In an embodiment, the emission layer EML may include, as dopant materials, styryl derivatives (e.g., 1,4-bis[2-(3-N-ethylcarbazolyl)vinyl]benzene (BCzVB), 4-(di-p-tolylamino)-4'-[(di-p-tolylamino) styryl]stilbene (DPAVB), and N-(4-((E)-2-(6-((E)-4-(diphenylamino)styryl)naphthalen-2-yl)vinyl)phenyl)-N-phenyl-benz enamine (N-BDAVBi), perylene and derivatives thereof (e.g., 2,5,8,11-tetra-t-butylperylene (TBP)), pyrene and derivatives thereof (e.g., 1-dipyrene, 1,4-dipyrenylbenzene, 1,4-bis(N,N-diphenylamino)pyrene), etc.

Further, in an embodiment, the emission layer EML may include two dopant materials having different lowest triplet exciton energy levels (T1 levels). The emission layer EML of the organic electroluminescence device 10 of an embodiment may include a host having a first lowest triplet exciton energy level, a first dopant having a second lowest triplet exciton energy level that is lower than the first lowest triplet exciton energy level, and a second dopant having a third lowest triplet exciton energy level that is lower than the second lowest triplet exciton energy level. In an embodiment, the emission layer EML may include the above-described fused polycyclic compound of an embodiment as the first dopant.

In the organic electroluminescence device 10 of an embodiment including a host, a first dopant, and a second dopant in the emission layer EML, the first dopant may be a delayed fluorescence dopant, and the second dopant may be a fluorescence dopant. Furthermore, the fused polycyclic compound represented by Formula 1 in the organic electroluminescence device 10 of an embodiment may serve as an assistant dopant.

For example, when the emission layer EML of the organic electroluminescence device 10 of an embodiment includes a plurality of dopants, the emission layer EML may include the above-described polycyclic compound of an embodiment as the first dopant, and one of the other above-described dopant materials as the second dopant. In an embodiment, when the emission layer EML is to emit blue light, the emission layer EML may further include, as the second dopant, any related art dopant selected from the group consisting of styryl derivatives (e.g., 1,4-bis[2-(3-N-ethylcarbazolyl)vinyl]benzene (BCzVB), 4-(di-p-tolylamino)-4'-[(di-p-tolylamino)styryl]stilbene (DPAVB), and N-(4-((E)-2-(6-((E)-4-(diphenylamino)styryl)naphthalen-2-yl)vinyl)phenyl)-N-phenylbenz enamine (N-BDAVBi), perylene and derivatives thereof (e.g., 2,5,8,11-tetra-t-butylperylene (TBP)), pyrene and derivatives thereof (e.g., 1-dipyrene, 1,4-dipyrenylbenzene, 1,4-bis(N,N-diphenylamino)pyrene), etc. Further, an organometallic complex or a metal complex such as $(4,6-F2ppy)_2Irpic$ including Ir, Pt, Pd etc. as a core atom may also be used as the second dopant.

In the organic electroluminescence device 10 of an embodiment including the fused polycyclic compound of an embodiment as a first dopant of the emission layer EML, the emission layer EML may be to emit green light or red light, where the second dopant material may be the above-described related art blue dopant, a green fluorescence dopant, or a red fluorescence dopant.

When the emission layer EML of the organic electroluminescence device 10 of an embodiment includes a plurality of dopants, the first dopant having a lowest triplet exciton energy level that is higher than that of the other (e.g., the second dopant) is the above-described related art blue dopant, and the second dopant having a lowest triplet exciton energy level that is lower than that of the other (e.g., the first dopant) may include the above-described fused polycyclic compound of an embodiment. In this case, styryl derivatives, perylene derivatives, pyrene derivatives, a metal complex, or an organometallic complex described above may be used as the first dopant.

The emission layer EML in the organic electroluminescence device 10 of an embodiment may be a phosphorescence emission layer. For example, the fused polycyclic compound according to an embodiment may be included in the emission layer EML as a phosphorescence host material.

In the organic electroluminescence device 10 of an embodiment shown in FIGS. 1 to 4, the electron transport region ETR is provided on the emission layer EML. The electron transport region ETR may include, but is not limited to, at least one selected from the hole blocking layer HBL, the electron transport layer ETL, and the electron injection layer EIL.

The electron transport region ETR may have a multilayer structure having a single layer formed of a single material, a single layer formed of materials different from each other, or a plurality of layers formed of materials different from each other.

For example, the electron transport region ETR may have a single layer structure including an electron injection layer EIL or an electron transport layer ETL, or a single layer structure formed of electron injection materials and/or electron transport materials. In some embodiments, the electron transport region ETR may have a single layer structure formed of materials different from each other, or a structure of an electron transport layer ETL/an electron injection layer EIL, or structure of a hole blocking layer HBL/an electron transport layer ETL/an electron injection layer (EIL), each layer being sequentially laminated from the emission layer EML, but embodiments are not limited thereto. The electron transport region ETR may have a thickness, for example, of about 1,000 Å to about 1,500 Å.

The electron transport region ETR may be formed using various methods (such as a vacuum deposition method, a spin coating method, a casting method, a Langmuir-Blodgett (LB) method, an inkjet printing method, a laser printing method, and a laser induced thermal imaging (LITI) method).

When the electron transport region ETR includes the electron transport layer ETL, the electron transport region ETR may include an anthracene-based compound. However, embodiments are not limited thereto, and the electron transport region may include, for example, tris(8-hydroxyquinolinato)aluminum (Alq3), 1,3,5-tri[(3-pyridyl)-phen-3-yl]benzene, 2,4,6-tris(3'-(pyridin-3-yl)biphenyl-3-yl)-1,3,5-triazine, 2-(4-(N-phenylbenzoimidazolyl-1-ylphenyl)-9,10-dinaphthylanthracene, 1,3,5-tri(1-phenyl-1H-benz[d]imidazol-2-yl)phenyl (TPBi), 2,9-dimethyl-4,7-diphenyl-1,10-phenanthroline (BCP), 4,7-diphenyl-1,10-phenanthroline (Bphen), 3-(4-biphenylyl)-4-phenyl-5-tert-butylphenyl-1,2,4-triazole (TAZ), 4-(naphthalen-1-yl)-3,5-diphenyl-4H-1,2,4-triazole (NTAZ), 2-(4-biphenylyl)-5-(4-tert-butylphenyl)-1,3,4-oxadiazole (tBu-PBD), bis(2-methyl-8-quinolinolato-N1,O8)-(1,1'-biphenyl-4-olato)aluminum (BAlq), beryllium bis(benzoquinolin-10-olate ($Bebq_2$), 9,10-di(naphthalene-2-yl)anthracene (ADN), or a mixture thereof. The thickness of the electron transport layers ETL may be about 100 Å to about 1,000 Å, for example, about 150 Å to about 500 Å. When the thickness of the electron transport layer ETL satisfies the above-described range, satisfactory electron transport characteristics may be achieved without a substantial increase in driving voltage.

When the electron transport region ETR includes the electron injection layer EIL, the electron transport region ETR may be formed using metal halides (such as LiF, NaCl, CsF, RbCl, RbI, and/or CuI), lanthanum metals (such as Yb), metal oxides (such as $Li_2O$ and/or BaO), Lithium quinolate (LiQ), etc., but embodiments are not limited thereto. In some embodiments, the electron injection layer EIL may be formed of a mixture of an electron transport material and an organo metal salt. The organo metal salt may be a material having an energy band gap of about 4 eV or more. For example, the organo metal salt may include metal acetate, metal benzoate, metal acetoacetate, metal acetylacetonate, and/or metal stearate. The thickness of the electron injection layer EIL may be about 1 Å to about 100 Å, or about 3 Å to about 90 Å. When the thickness of the electron injection layer EIL satisfies the above-described range, satisfactory electron injection characteristics may be achieved without a substantial increase in driving voltage.

As described above, the electron transport region ETR may include the hole blocking layer HBL. The hole blocking layer HBL may include, for example, at least one of 2,9-dimethyl-4,7-diphenyl-1,10-phenanthroline (BCP), or 4,7-diphenyl-1,10-phenanthroline (Bphen), but is not limited thereto.

The second electrode EL2 may be disposed on the electron transport region ETR. The second electrode EL2 may be a common electrode or a negative electrode. The second electrode EL2 may be a transmissive electrode, a transflective electrode, or a reflective electrode. When the second electrode EL2 is a transmissive electrode, the second electrode EL2 may be formed of a transparent metal oxide, for example, indium tin oxide (ITO), indium zinc oxide (IZO), zinc oxide (ZnO), indium tin zinc oxide (ITZO), and/or the like.

When the second electrode EL2 is a transflective electrode or a reflective electrode, the second electrode EL2 may include Ag, Mg Cu, Al, Pt, Pd, Au, Ni, Nd, Ir, Cr, Li, Ca, LiF/Ca, LiF/Al, Mo, Ti, or a compound or mixture (e.g., a mixture of Ag and Mg) including the same. Alternatively, the second electrode EL2 may have a multi-layered structure including a reflective layer or a transflective layer and a transparent conductive layer formed of indium tin oxide (ITO), indium zinc oxide (IZO), zinc oxide (ZnO), and/or indium tin zinc oxide (ITZO).

In some embodiments, the second electrode EL may be connected to an auxiliary electrode. When the second electrode EL2 is connected to the auxiliary electrode, resistance of the second electrode EL2 may be decreased.

In some embodiments, the organic electroluminescence device 10 of an embodiment may include a buffer layer between the emission layer EML and the electron transport region ETR. The buffer layer may control the concentration of the excitons that are generated in the emission layer EML. For example, the buffer layer may include a part (portion) of the emission layer EML material. The buffer layer may include the host material of the emission layer EML material. In some embodiments, the lowest triplet exciton energy level of the buffer layer material may be controlled to be higher than or equal to the lowest triplet exciton energy level of the second dopant, or in some embodiments, to be lower than or equal to the lowest triplet exciton energy level of the second dopant according to a combination of host and dopant materials included in the emission layer EML.

A capping layer CPL may be further disposed on the second electrode EL2 of the organic electroluminescence device 10 of an embodiment. The capping layer CPL may include, for example, α-NPD, NPB, TPD, m-MTDATA, Alq$_3$, CuPc, N4,N4,N4',N4'-tetra (biphenyl-4-yl) biphenyl-4,4'-diamine (TPD15), 4,4',4"-tris (carbazol sol-9-yl) triphenylamine (TCTA), N, N'-bis (naphthalen-1-yl), etc.

The organic electroluminescence device 10 according to an embodiment of the present disclosure may include the above-described fused polycyclic compound of an embodiment in the emission layer EML disposed between the first electrode EL1 and the second electrode EL2 to exhibit high luminous efficiency characteristics. In addition, the fused polycyclic compound according to an embodiment may be a thermally activated delayed fluorescence dopant, and the emission layer EML may include the fused polycyclic compound of an embodiment to emit thermally activated delayed fluorescence, thereby exhibiting high luminous efficiency characteristics.

In some embodiments, the above-described fused polycyclic compound of an embodiment may be included as a material for the organic electroluminescence device 10 in an organic layer other than the emission layer EML. For example, the organic electroluminescence device 10 of an embodiment of the present disclosure may also include the above-described fused polycyclic compound in at least one organic layer disposed between the first electrode EU and the second electrode EL2, or in the capping layer disposed on the second electrode EL2.

The above-described fused polycyclic compound of an embodiment includes two polycyclic rings containing a nitrogen atom and a boron atom and the fused polycyclic heterocyclic moiety (such as carbazole, dibenzofuran, and/or dibenzothiophene) within a fused ring, and has a relatively small energy difference ($\Delta E_{ST}$) between a lowest triplet exciton energy level (T1 level) and a lowest singlet exciton energy level (S1 level) when compared to related art compounds, and therefore, when the above-described fused polycyclic compound is used as a material of the organic electroluminescence device, the efficiency of the organic electroluminescence device may be improved.

Hereinafter, the compound according to an embodiment of the present disclosure and the organic electroluminescence device of an embodiment will be explained in more detail by referring to Examples and Comparative Examples. The examples are provided for assisting the understanding of the present disclosure, and the scope of the present disclosure is not limited thereto.

Examples

1. Synthesis of Fused Polycyclic Compound

First, example methods for synthesizing the fused polycyclic compound according to the current embodiment will be described with respect to Compounds 3, 15, 24, 56, 58, 66, 74, 88, and 98. In addition, in the following descriptions, a synthetic method of the fused polycyclic compound is provided as an example, but the synthetic method according to an embodiment of the present disclosure is not limited to the following examples.

(1) Synthesis of Compound 3

Fused polycyclic compound 3 according to an embodiment may be synthesized by, for example, the following reaction.

(Synthesis of Intermediate Compound 3-1)

[Reaction Formula 1-a]

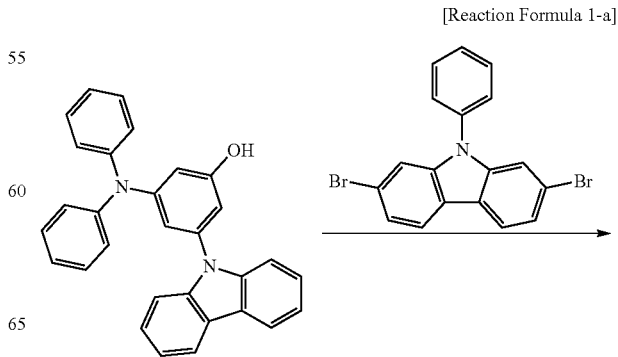

-continued

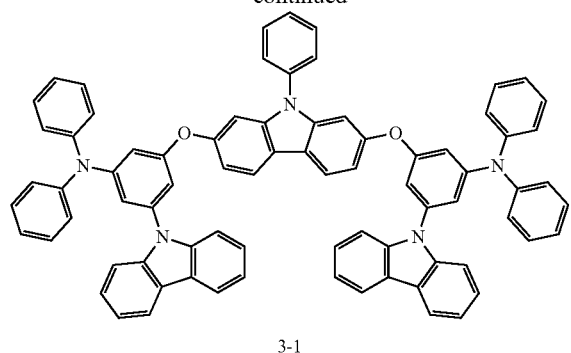

3-1

2,7-dibromo-9-phenyl-9H-carbazole (1 eq), 3-(9H-carbazol-9-yl)-5-(diphenylamino)phenol (2 eq), CuI (0.1 eq), 1,10-phenanthroline (0.2 eq), and $K_2CO_3$ (4 eq) were dissolved in DMF, and then stirred at about 160° C. for about 12 hours. After cooling, the solvent was removed at reduced pressure, and the resultant was washed three times with dichloromethane and water, and then separated to obtain an organic layer. The obtained organic layer was dried with $MgSO_4$, and then dried at reduced pressure. Intermediate compound 3-1 was obtained by column chromatography (yield: 45%).

(Synthesis of Compound 3)

[Reaction Formula 1-b]

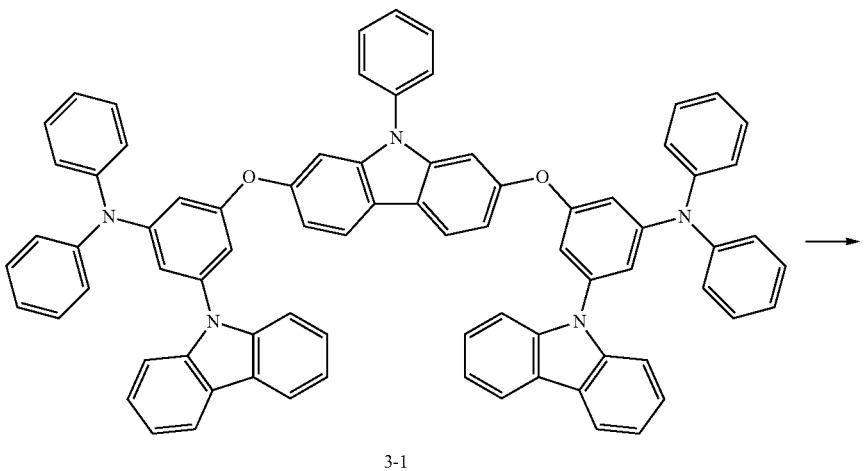

3-1

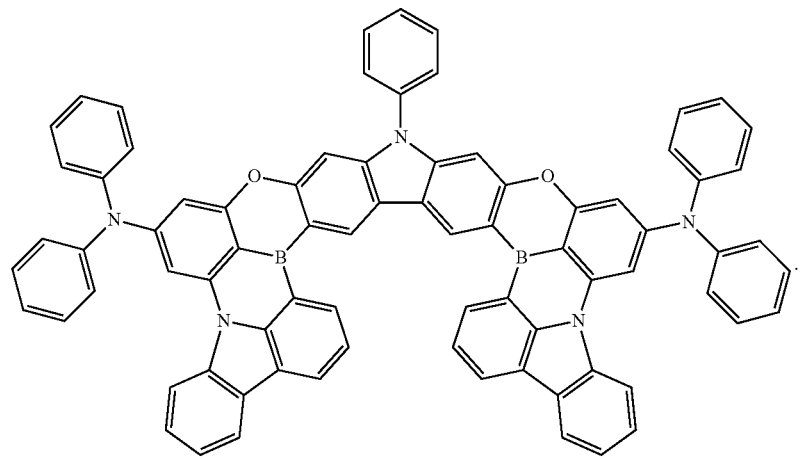

3

Intermediate compound 3-1 (1 eq) was dissolved in ortho-dichlorobenzene, and then cooled to about 0° C. in a nitrogen atmosphere. $BBr_3$ (16 eq) was infused slowly and then stirred for 24 hours at elevated temperature to about 150° C. After cooling, the reaction was slowly quenched dropwise with triethylamine, and then extracted in ethyl alcohol. The extracted reactant was purified by filtration. The obtained solids were filtered through a silica filter using toluene, and then purified by recrystallization using toluene again to obtain Compound 3 (yield: 14%).

(2) Synthesis of Compound 15

Fused polycyclic compound 15 according to an embodiment may be synthesized by, for example, the following reaction.

(Synthesis of Intermediate Compound 15-1)

[Reaction Formula 2-a]

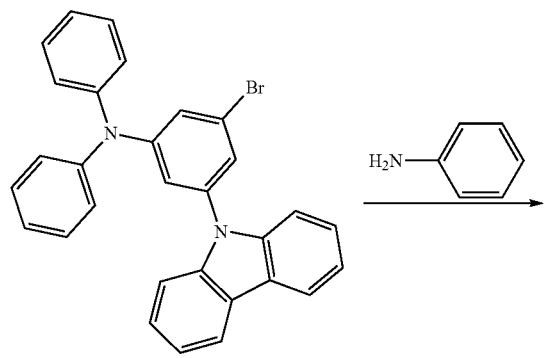

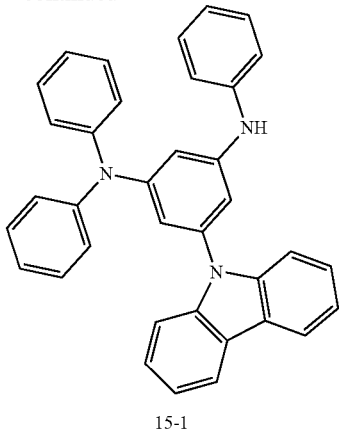

15-1

3-bromo-5-(9H-carbazol-9-yl)-N,N-diphenylaniline (1 eq), aniline (1.5 eq), Pd$_2$(dba)$_3$ (0.05 eq), P(t-Bu)$_3$ (0.1 eq), and sodium tert-butoxide (3 eq) were dissolved in toluene, and then stirred at about 100° C. for about 12 hours. The reaction was cooled, and the reaction was washed three times with ethyl acetate and water, and then separated to obtain an organic layer. The obtained organic layer was dried with MgSO$_4$, and then dried at reduced pressure. Intermediate compound 15-1 was obtained by filtering with a silica filter and recrystallizing (yield: 83%).

(Synthesis of Intermediate Compound 15-2)

[Reaction Formula 2-b]

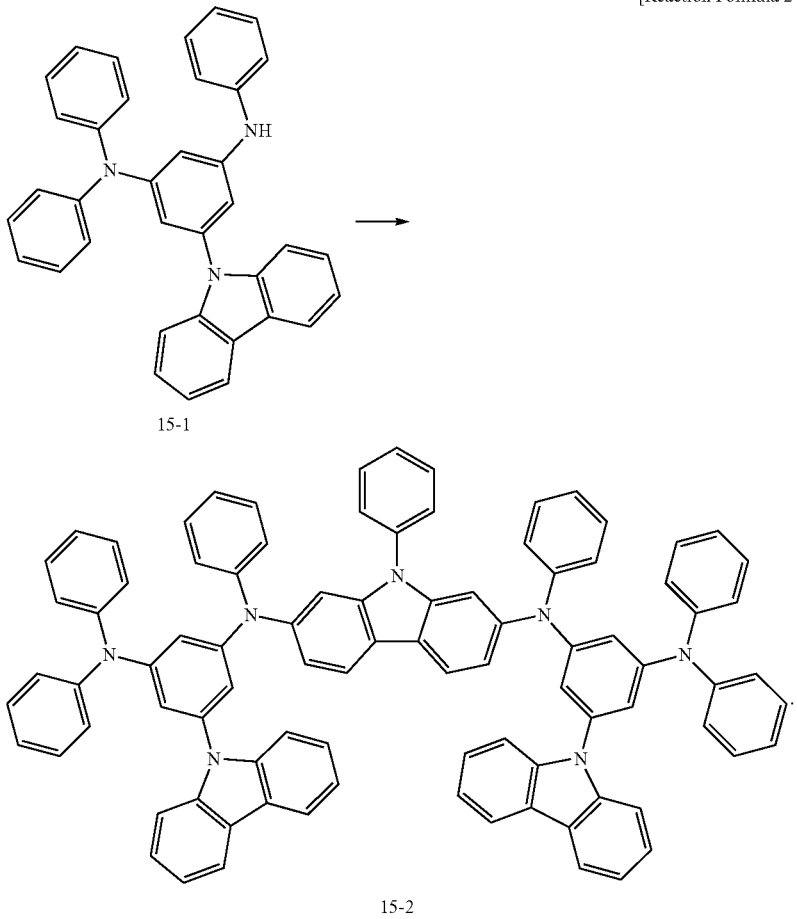

15-2

2,7-dibromo-9-phenyl-9H-carbazole (1 eq), intermediate compound 15-1 (2 eq), Pd$_2$(dba)$_3$ (0.1 eq), P(t-Bu)$_3$ (0.2 eq), and sodium tert-butoxide (5 eq) were used to react in the same manner as in Reaction Formula 2-a to obtain Intermediate compound 15-2 (yield: 71%).
(Synthesis of Compound 15)

[Reaction Formula 2-c]

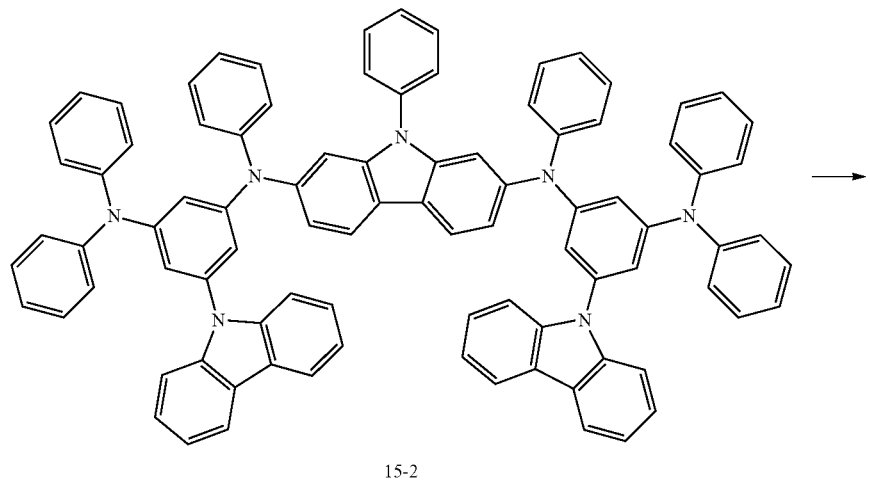

15-2

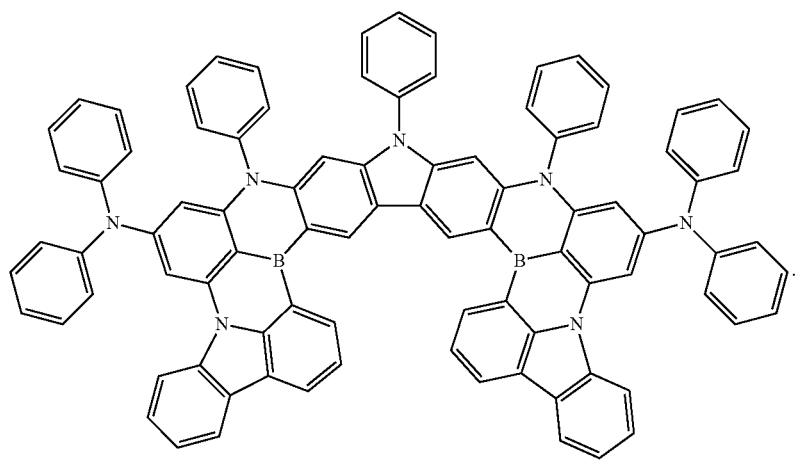

15

Intermediate compound 15-2 was used to react in the same manner as synthesis and purification in Reaction Formula 1-b to obtain Compound 15 (yield: 17%).

(3) Synthesis of Compound 24

Fused polycyclic compound 24 according to an embodiment may be synthesized by, for example, the following reaction.

(Synthesis of Intermediate Compound 24-1)

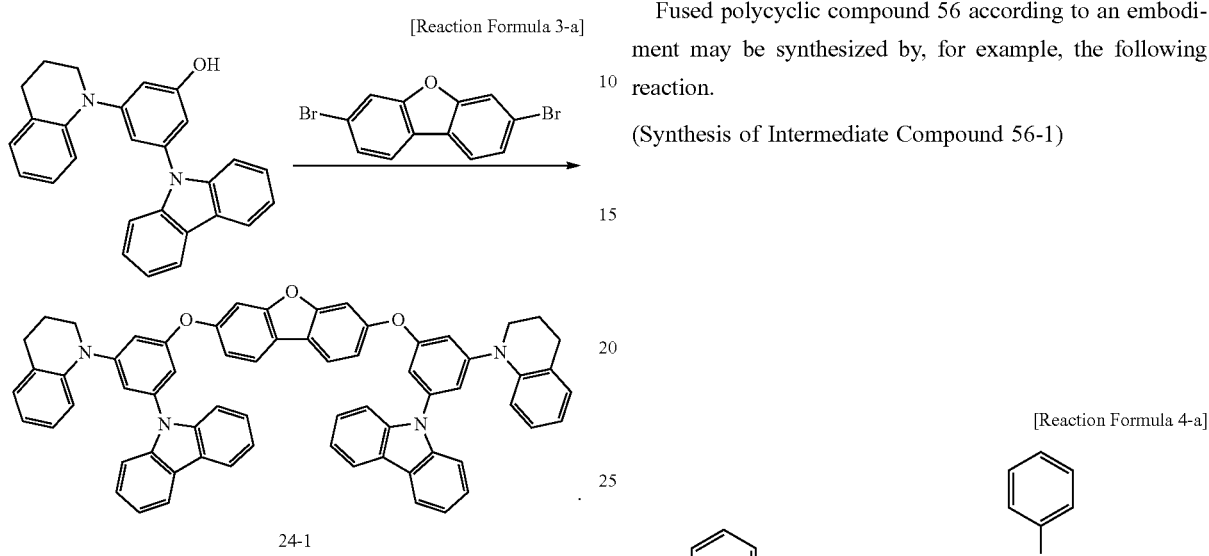

[Reaction Formula 3-a]

24-1

3,7-dibromodibenzo[b,d]furan (1 eq), and 3-(9H-carbazol-9-yl)-5-(3,4-dihydroquinolin-1(2H)-yl)phenol (2 eq) were used to react in the same manner as in Reaction Formula 1-a to obtain Intermediate compound 24-1 (yield: 33%).

(Synthesis of Compound 24)

Intermediate compound 24-1 was used to react in the same manner as synthesis and purification in Reaction Formula 1-b to obtain Compound 24 (yield: 16%).

(4) Synthesis of Compound 56

Fused polycyclic compound 56 according to an embodiment may be synthesized by, for example, the following reaction.

(Synthesis of Intermediate Compound 56-1)

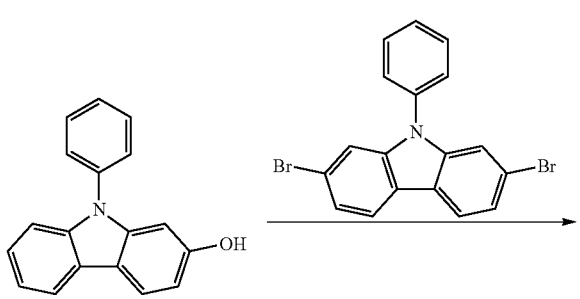

[Reaction Formula 4-a]

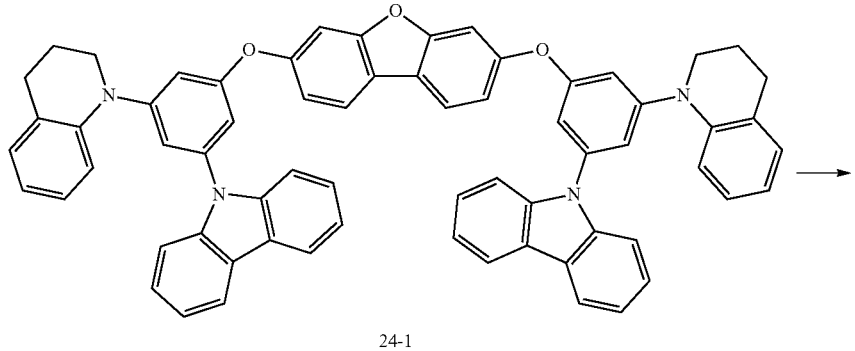

[Reaction Formula 3-b]

24-1

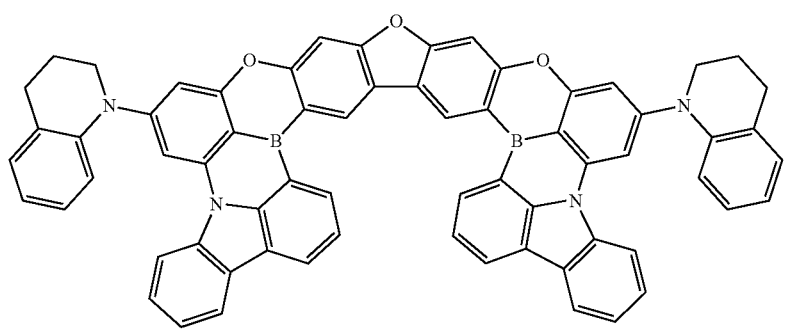

24

-continued

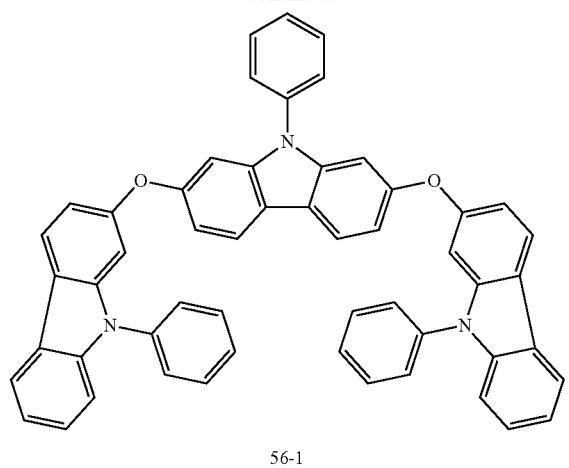

56-1

2,7-dibromo-9-phenyl-9H-carbazole (1 eq), and 9-phenyl-9H-carbazol-2-ol (2 eq) were used to react in the same manner as in Reaction Formula 1-a to obtain Intermediate compound 56-1 (yield: 43%).

(Synthesis of Compound 56)

[Reaction Formula 4-b]

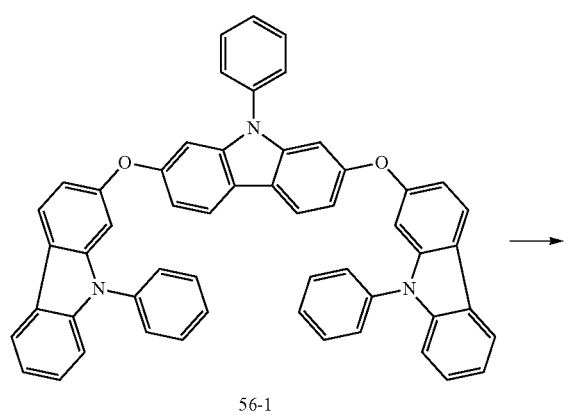

56-1

↓

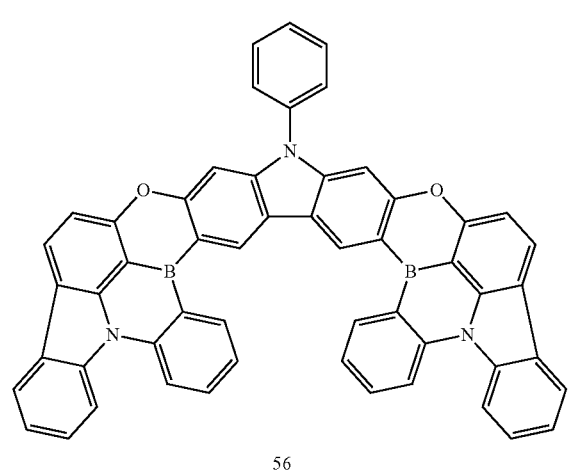

56

Intermediate compound 56-1 (1 eq) was dissolved in o-xylene, and then cooled to about 0° C. in a nitrogen atmosphere. BBr$_3$ (12 eq) was infused slowly and then stirred for 48 hours at elevated temperature to about 170° C. After cooling, Compound 56 was obtained through the same purifying process as in Reaction Formula 1-b. (yield: 6%)

(5) Synthesis of Compound 58

Fused polycyclic compound 58 according to an embodiment may be synthesized by, for example, the following reaction.

(Synthesis of Intermediate Compound 58-1)

[Reaction Formula 5-a]

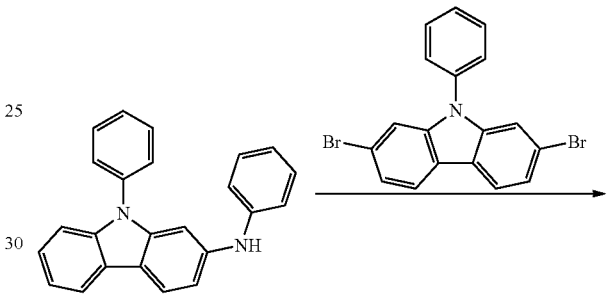

58-1

2,7-dibromo-9-phenyl-9H-carbazole (1 eq), and N,9-diphenyl-9H-carbazol-2-amine (2 eq) were used to react in the same manner as in Reaction Formula 1-a to obtain Intermediate compound 58-1 (yield: 75%).

(Synthesis of Compound 58)

[Reaction Formula 5-b]

(Synthesis of Intermediate Compound 66-1)

[Reaction Formula 6-a]

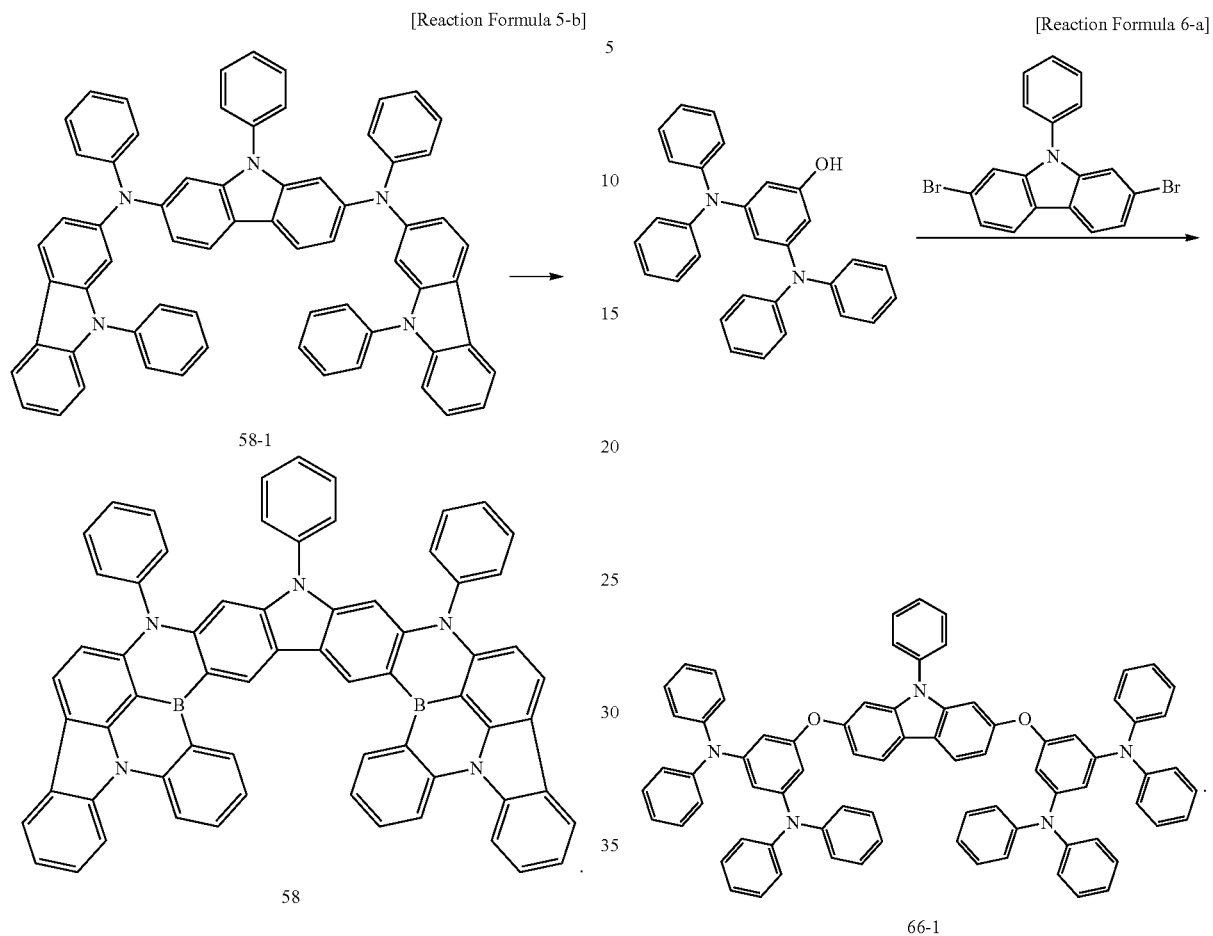

Intermediate compound 58-1 was used to react in the same manner as synthesis and purification in Reaction Formula 1-b to obtain Compound 58 (yield: 12%).

(6) Synthesis of Compound 66

Fused polycyclic compound 66 according to an embodiment may be synthesized by, for example, the following reaction.

2,7-dibromo-9-phenyl-9H-carbazole (1 eq), and 3,5-bis(diphenylamino)phenol (2 eq) were used to react in the same manner as in Reaction Formula 1-a to obtain Intermediate compound 66-1 (yield: 35%).

(Synthesis of Compound 66)

[Reaction Formula 6-b]

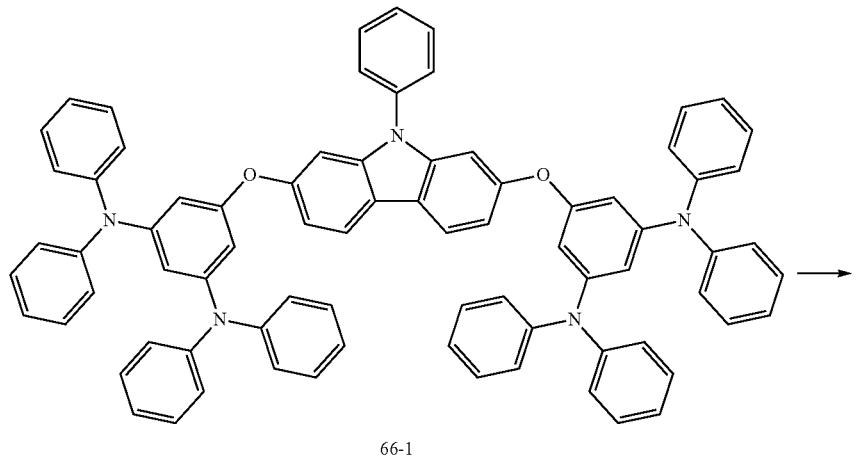

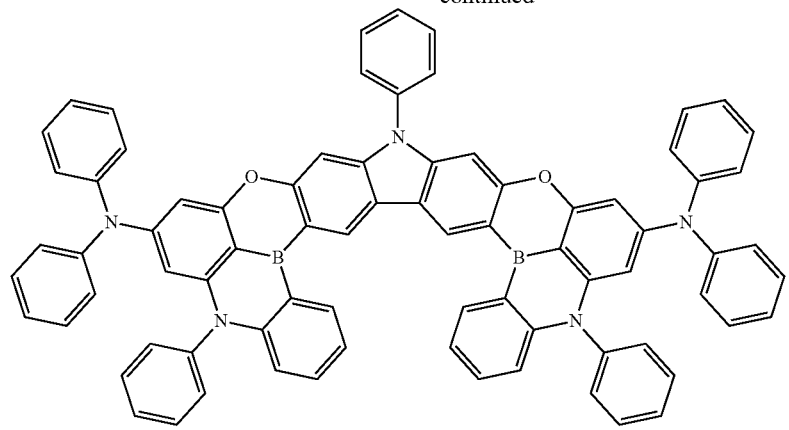

66

Intermediate compound 66-1 was used to react in the same manner as in Reaction Formula 1-b to obtain Compound 66 (yield: 35%).

(7) Synthesis of Compound 74

Fused polycyclic compound 74 according to an embodiment may be synthesized by, for example, the following reaction.

(Synthesis of Intermediate Compound 74-1)

[Reaction Formula 7-a]

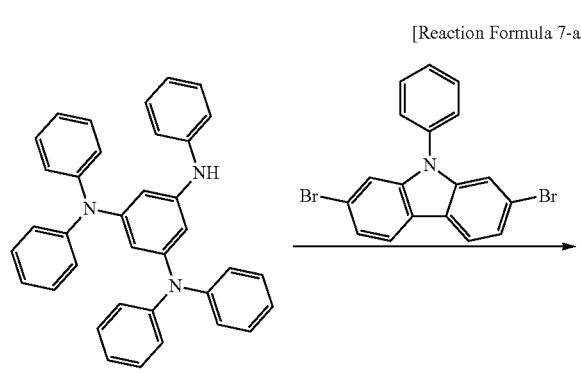

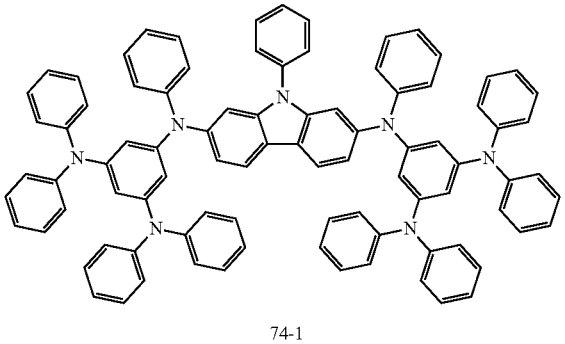

74-1

2,7-dibromo-9-phenyl-9H-carbazole (1 eq), and N1,N1,N3,N3,N5-pentaphenylbenzene-1,3,5-triamine (2 eq) were used to react in the same manner as in Reaction Formula 1-a to obtain Intermediate compound 74-1 (yield:

(Synthesis of Compound 74)

[Reaction Formula 7-b]

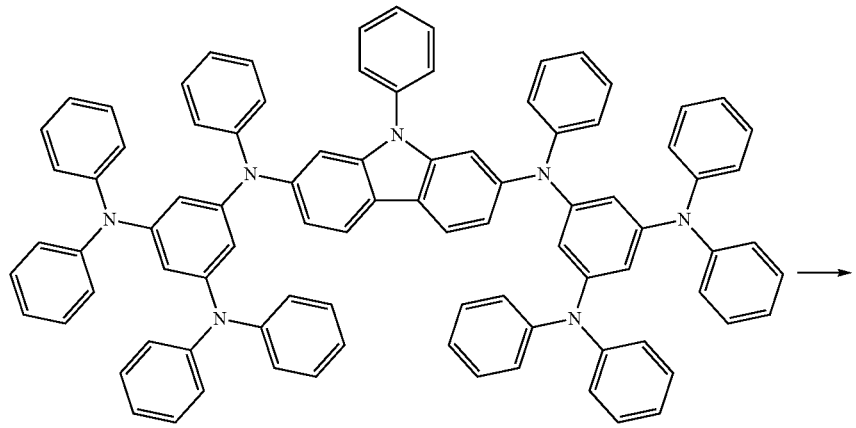

74-1

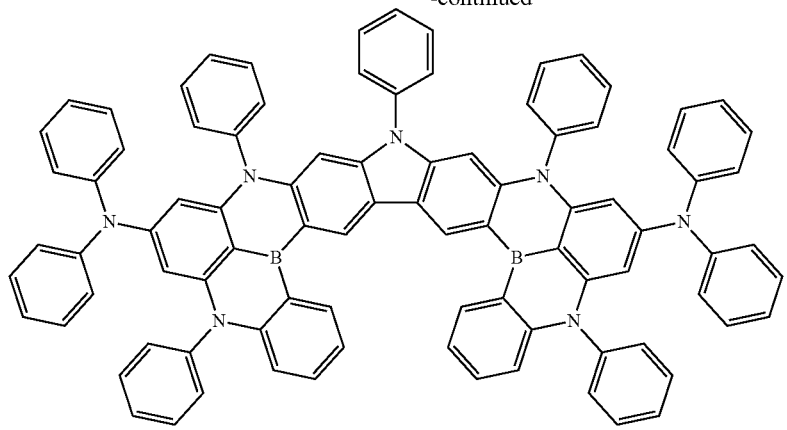

74

Intermediate compound 74-1 was used to react in the same manner as synthesis and purification in Reaction Formula 1-b to obtain Compound 74 (yield: 18%).

(8) Synthesis of Compound 88

Fused polycyclic compound 88 according to an embodiment may be synthesized by, for example, the following reaction.

(Synthesis of Intermediate Compound 88-1)

[Reaction Formula 8-a]

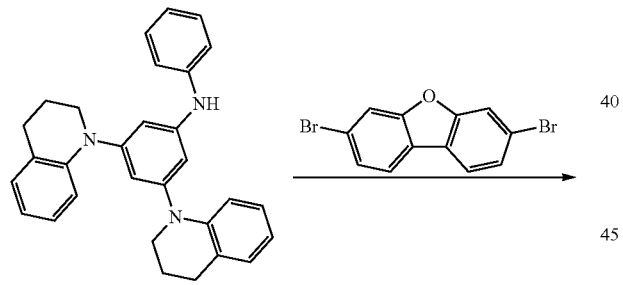

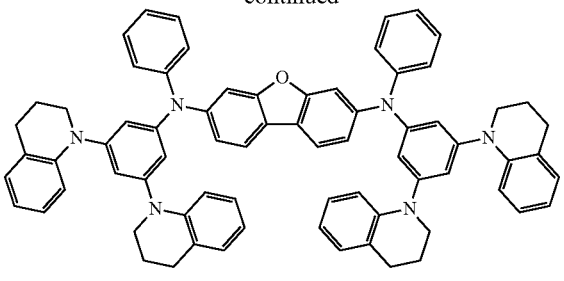

88-1

3,7-dibromodibenzo[b,d]furan (1 eq), and 3,5-bis(3,4-dihydroquinolin-1(2H)-yl)-N-phenylaniline (2 eq) were used to react in the same manner as in Reaction Formula 1-a to obtain Intermediate compound 88-1 (yield: 55%).

(Synthesis of Compound 88)

[Reaction Formula 8-b]

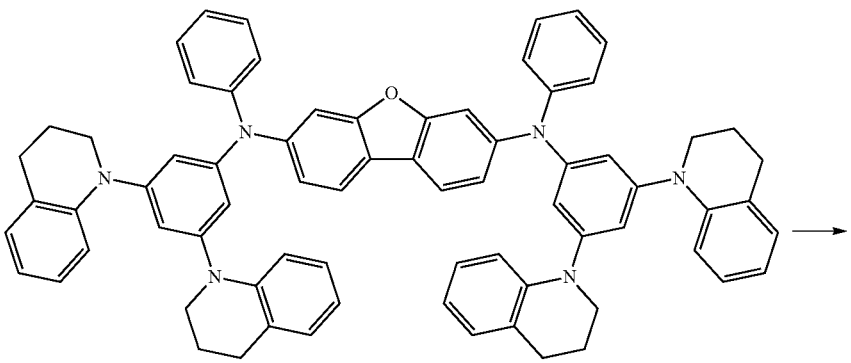

88-1

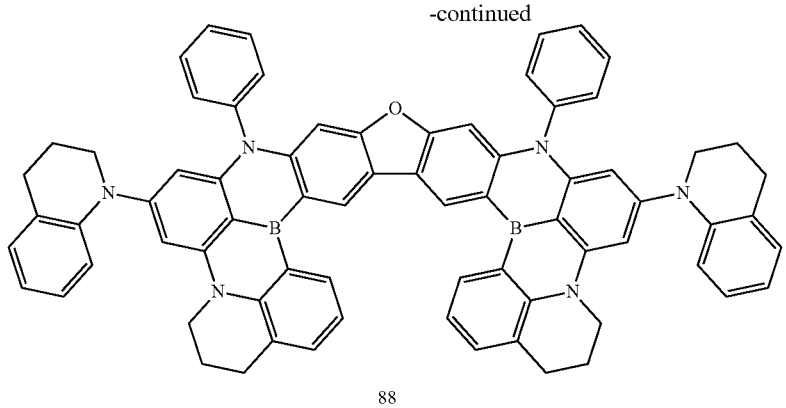

88

Intermediate compound 88-1 was used to react in the same manner as synthesis and purification in Reaction Formula 1-b to obtain Compound 88 (yield: 10%).

(9) Synthesis of Compound 98

Fused polycyclic compound 98 according to an embodiment may be synthesized by, for example, the following reaction.

(Synthesis of Intermediate Compound 98-1)

[Reaction Formula 9-a]

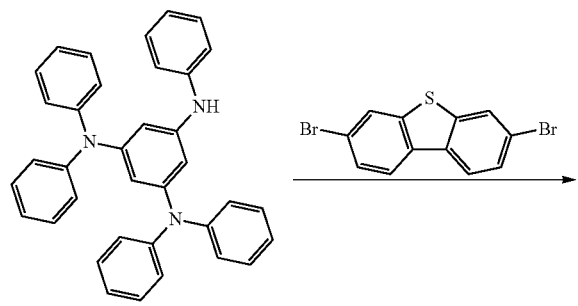

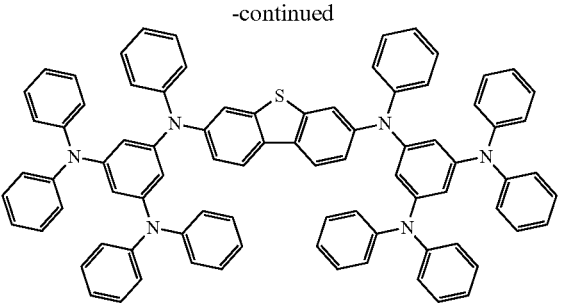

98-1

3,7-dibromodibenzo[b,d]thiophene (1 eq), and N1,N1,N3,N3,N5-pentaphenylbenzene-1,3,5-triamine (2 eq) were used to react in the same manner as in Reaction Formula 1-a to obtain Intermediate compound 98-1 (yield: 61%).

(Synthesis of Compound 98)

[Reaction Formula 9-b]

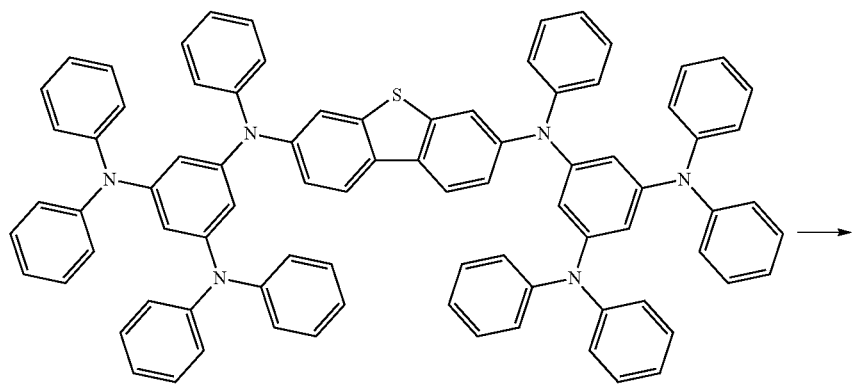

98-1

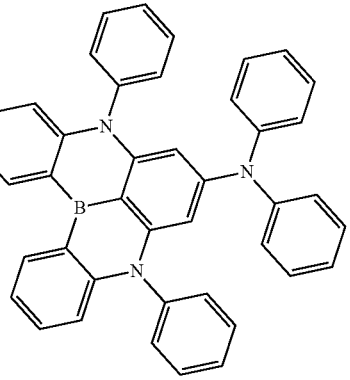

98

Intermediate compound 98-1 was used to react in the same manner as synthesis and purification in Reaction Formula 1-b to obtain Compound 98 (yield: 4%).

¹H-NMR measurement values and molecular weight data for Compounds 3, 15, 24, 56, 58, 66, 74, 88, and 98 are shown in Table 1. Thus, it could be confirmed that the compounds prepared by each of synthetic examples are Compounds 3, 15, 24, 56, 58, 66, 74, 88, and 98, respectively.

TABLE 1

| Compound | H NMR (δ) | Calc | Found |
|---|---|---|---|
| 3 | 8.95-8.90 (2H, s), 8.84-8.78 (2H, d), 8.55-8.47 (2H, d) 8.25-8.21 (2H, d), 7.95-7.85 (2H, m), 7.55-7.41 (7H, m) 7.34-7.24 (14H, m), 6.85-6.65 (12H, m), 6.35-6.22 (4H, m) | 1107.86 | 1107.84 |
| 15 | 8.92-8.88 (2H, s), 8.81-8.75 (2H, d), 8.52-8.42 (2H, d) 8.23-8.17 (2H, d), 7.91-7.82 (2H, m), 7.52-7.38 (7H, m) 7.31-7.22 (18H, m), 6.84-6.60 (18H, m), 6.31-6.17 (4H, m) | 1258.08 | 1258.07 |
| 24 | 9.12-8.98 (2H, s), 8.89-8.82 (2H, d), 8.52-8.42 (2H, d) 8.23-8.17 (2H, d), 7.94-7.78 (2H, m), 7.62-7.52 (2H, m) 7.33-7.09 (10H, m), 6.79-6.55 (4H, m), 6.35-6.19 (4H, m) 3.05-2.88 (8H, m), 2.11-2.03 (4H, m) | 960.69 | 960.67 |
| 56 | 9.19-9.10 (2H, s), 8.95-8.91 (2H, d), 8.75-8.66 (2H, d) 8.43-8.39 (2H, d), 7.88-7.75 (2H, m), 7.60-7.42 (13H, m) 7.30-7.11 (6H, m) | 773.45 | 773.44 |
| 58 | 9.12-9.04 (2H, s), 8.91-8.84 (2H, d), 8.72-8.63 (2H, d) 8.43-8.39 (2H, d), 7.88-7.75 (2H, m), 7.60-7.42 (13H, m) 7.30-7.11 (10H, m), 6.86-6.67 (6H, m) | 923.67 | 923.65 |
| 66 | 8.85-8.80 (2H, s), 8.77-8.72 (2H, d), 7.93-7.81 (2H, m), 7.55-7.41 (7H, m), 7.34-7.24 (18H, m), 6.85-6.65 (16H, m) 6.35-6.22 (4H, m) | 1111.89 | 1111.87 |
| 74 | 8.83-8.76 (2H, s), 8.72-8.66 (2H, d), 7.85-7.77 (2H, m), 7.51-7.36 (7H, m), 7.31-7.19 (22H, m), 6.83-6.61 (22H, m) 6.31-6.20 (4H, m) | 1262.12 | 1262.10 |
| 88 | 8.83-8.76 (2H, s), 8.72-8.66 (2H, d), 7.41-7.38 (2H, s) 7.21-7.06 (10H, m), 6.81-6.56 (12H, m), 5.33-5.28 (4H, m) 3.05-2.88 (8H, m), 2.75-2.68 (8H, m), 2.11-1.99 (8H, m) | 1042.88 | 1042.86 |
| 98 | 8.93-8.88 (2H, s), 8.75-8.69 (2H, d), 7.89-7.78 (2H, m), 7.55-7.38 (2H, m), 7.31-7.19 (22H, m), 6.83-6.61 (22H, m) 6.31-6.20 (4H, m) | 1203.07 | 1203.05 |

2. Evaluation of Energy Level of Fused Polycyclic Compound

The energy levels and the like of Example Compounds 1, 3, 6, 15, and 56 and Comparative Compounds C1 and C2 were identified via simulation (computation). The calculated Example Compounds and Comparative Compounds are as follows:

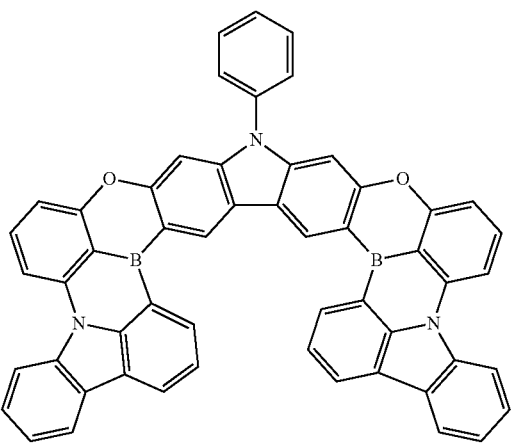

1

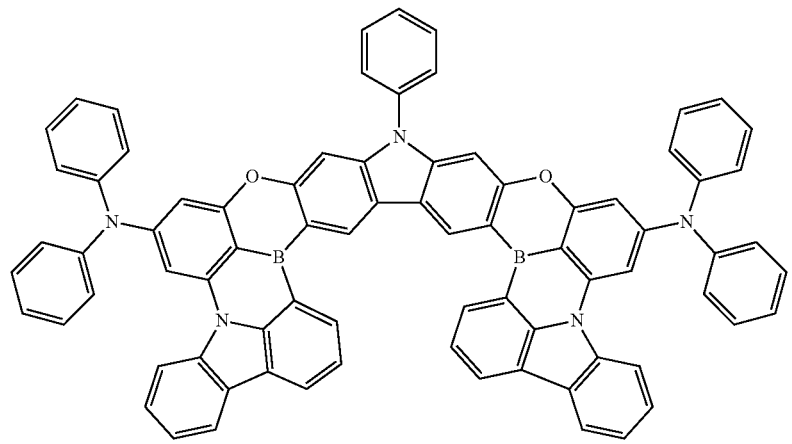
3
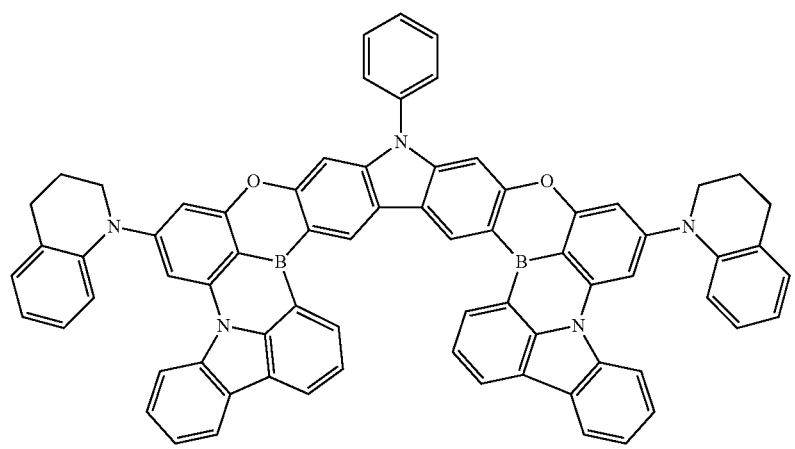
6
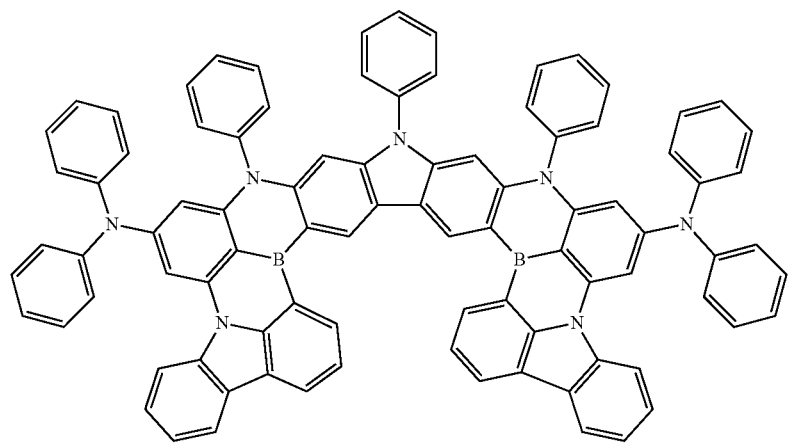
15

-continued

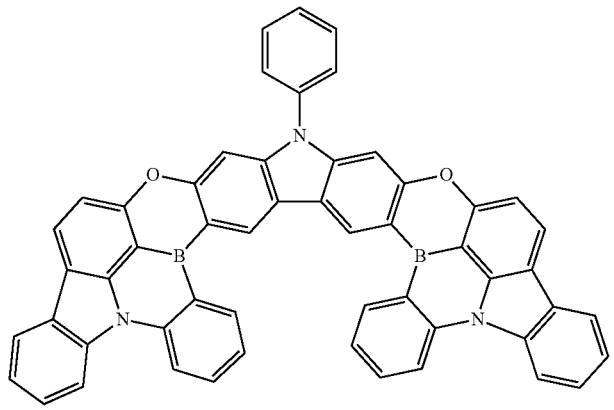
56

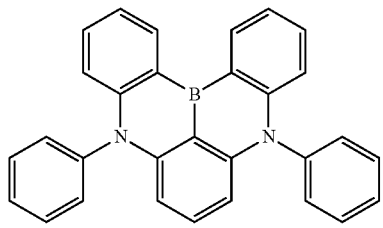
C1

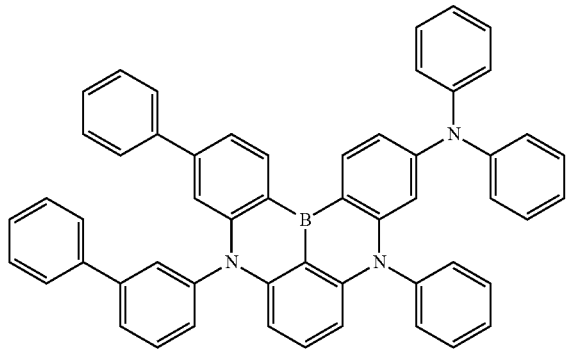
C2

The HOMO level, LUMO level, lowest singlet exciton energy level (S1 level), lowest triplet exciton energy level (T1 level), dipole momentum, oscillator strength (OSC), and $\Delta E_{ST}$ of Example Compounds 1, 3, 6, 15, and 56, and Comparative Compounds C1 and C2, are listed in Table 2. The value of the energy level in Table 2 was calculated by a non-empirical molecular orbital method. For example, the value was calculated with B3LYP/6-31G(d) using Gaussian 09 from Gaussian, Inc. (Wallingford, Conn., USA). $\Delta E_{ST}$ shows the difference between a lowest singlet exciton energy level (S1 level) and a lowest triplet exciton energy level (T1 level).

TABLE 2

| Compounds | HOMO | LUMO | S1 level (eV) | T1 level (eV) | Dipole | OSC | $\Delta E_{ST}$ (eV) |
|---|---|---|---|---|---|---|---|
| Compound 1 | −5.145 | −1.72 | 2.8531 | 2.5844 | 1.7322 | 0.4018 | 0.269 |
| Compound 3 | −5.028 | −1.59 | 2.7642 | 2.6253 | 2.4187 | 0.8044 | 0.139 |
| Compound 6 | −4.995 | −1.65 | 2.771 | 2.585 | 1.0661 | 0.8713 | 0.186 |
| Compound 15 | −4.633 | −1.41 | 2.7445 | 2.4318 | 7.2865 | 0.4745 | 0.313 |
| Compound 56 | −5.19 | −1.67 | 2.8321 | 2.6072 | 0.8816 | 0.5054 | 0.225 |
| Comparative Compound C1 | −4.73 | −1.09 | 3.11 | 2.62 | 2.55 | 0.20 | 0.492 |

TABLE 2-continued

| Compounds | HOMO | LUMO | S1 level (eV) | T1 level (eV) | Dipole | OSC | $\Delta E_{ST}$ (eV) |
|---|---|---|---|---|---|---|---|
| Comparative Compound C2 | −4.69 | −1.24 | 2.94 | 2.53 | 2.61 | 0.42 | 0.418 |

It can be identified that Example Compounds 1, 3, 6, 15, and 56 have a higher T1 level, a lower $\Delta E_{ST}$ value, and a higher oscillator strength value, compared to Comparative Compounds C1 and C2. Each of Example Compounds 1, 3, 6, 15, and 56 have a low $\Delta E_{ST}$ of 0.33 eV or less and a high oscillator strength value, so that light absorption characteristics are improved. Therefore, it is found that these compounds may be used as thermally activated delayed fluorescence dopant materials.

3. Manufacture and Evaluation of Organic Electroluminescence Device Including Fused Polycyclic Compound (Manufacture of Organic Electroluminescence Device)

An organic electroluminescence device of an embodiment including a fused polycyclic compound of an embodiment in the emission layer was manufactured as follows. Compound 1, Compound 56, Compound 58, Compound 66, Compound 74, Compound 88, and Compound 98, which are example fused polycyclic compounds, were used as dopant materials in the emission layer to manufacture the organic electroluminescence devices of Examples 1 to 9. Comparative Examples 1 and 2 correspond to the organic electroluminescence devices manufactured using Comparative Compound C2 and Comparative Compound C3 as dopant materials of the emission layer.

To form a first electrode, an ITO glass substrate having about 15 Ω/cm² (about 1,200 Å) made by Corning Inc. was cut to a size of 50 mm×50 mm×0.7 mm, washed with isopropyl alcohol and pure water for about 5 minutes, cleansed by ultrasonic waves, and then irradiated with ultraviolet rays for about 30 minutes and exposed to ozone for cleaning. The glass substrate was installed in a vacuum deposition apparatus. NPD was deposited under vacuum on the top of the glass substrate to a thickness of about 300 Å to form a hole injection layer, and TCTA, which is a hole transporting compound, was deposited under vacuum to a thickness of about 200 Å to form a hole transport layer. CzSi was deposited under vacuum on the hole transport layer to a thickness of about 100 Å. mCP and the Example Compound of the present disclosure or the Comparative Compound were co-deposited on the hole transport layer at a weight ratio of 99:1 to form an emission layer having a thickness of about 200 Å. Then TSP01, which is a compound for the electron transport layer, was formed to a thickness of about 200 Å, and TPBi, which is a compound for the electron injection layer, was deposited to a thickness of 300 Å. LiF which is an alkali metal halide, was deposited on the electron transport layer to a thickness of about 10 Å, and Al was deposited in vacuum to a thickness of about 3,000 Å to form an LiF/Al second electrode, and thereby manufacturing an organic electroluminescence device.

The compounds used for manufacturing the organic electroluminescence device of Examples and Comparative Examples are shown below.

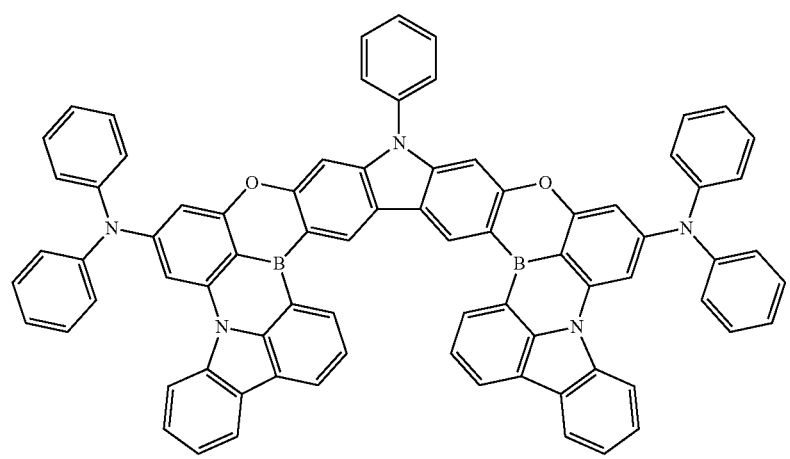

-continued
15
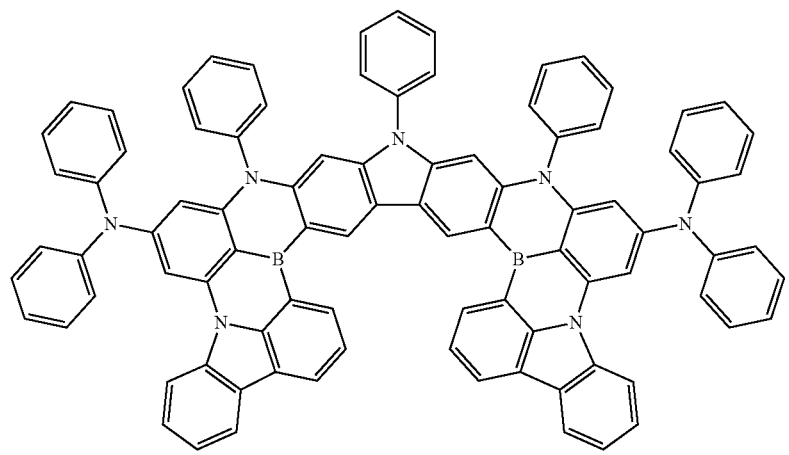
24
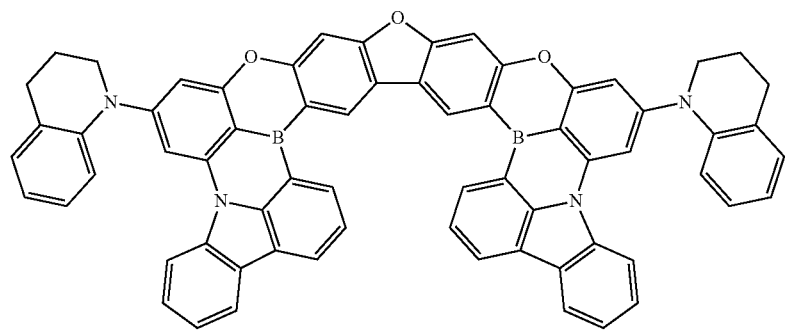
56 58
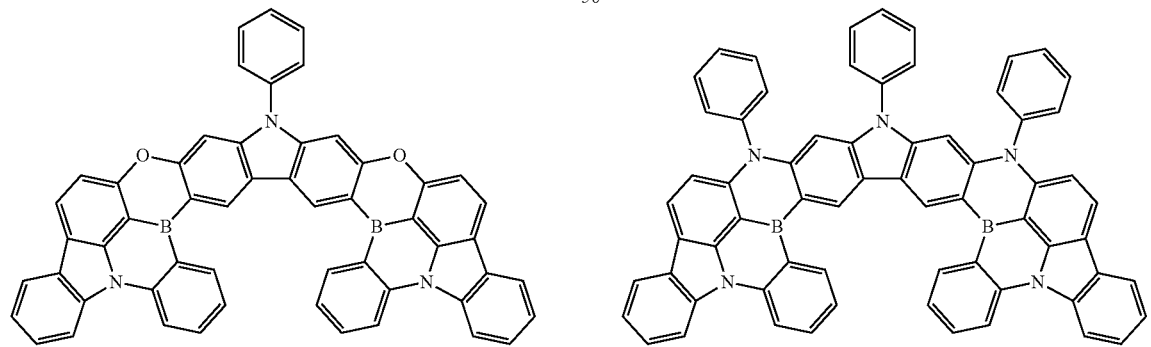
66
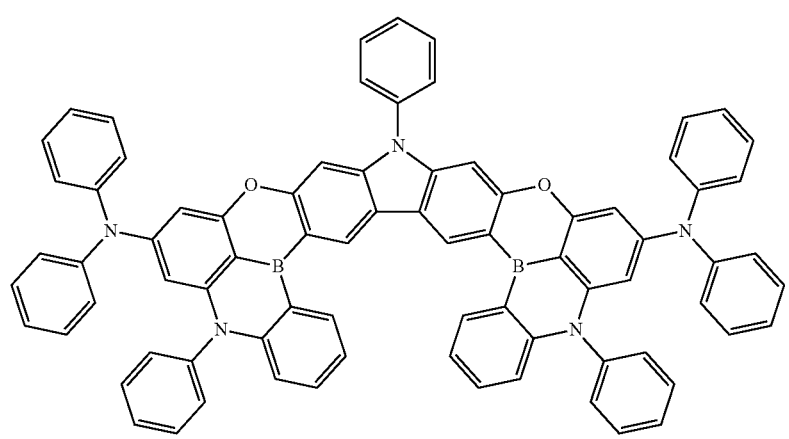

-continued
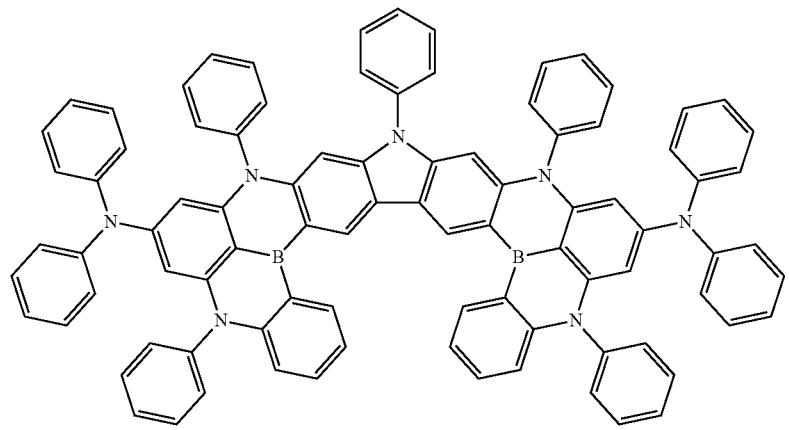
74
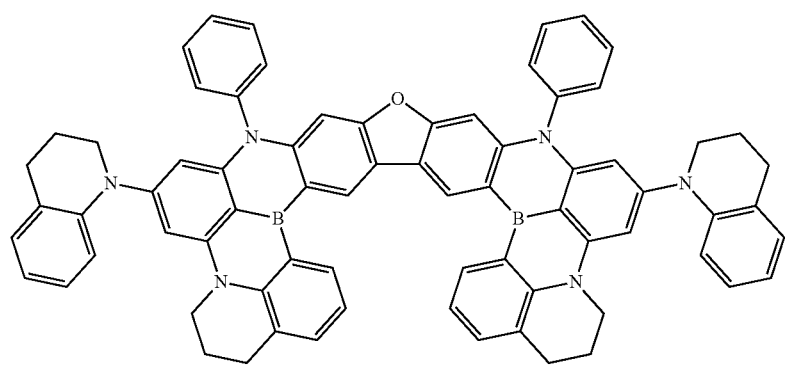
88
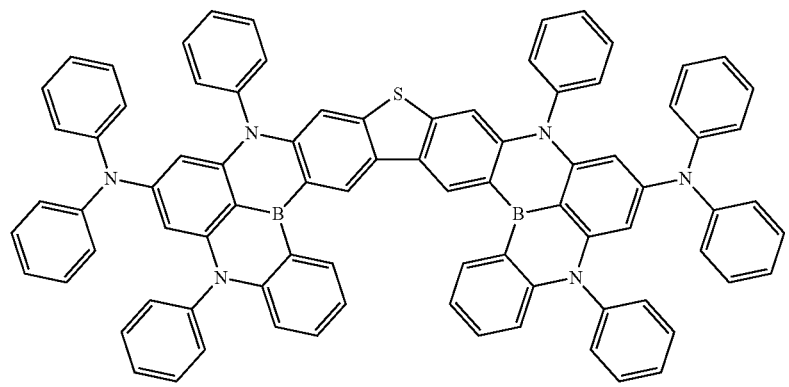
98
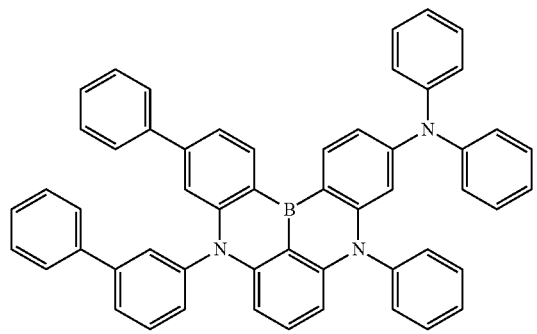
C2
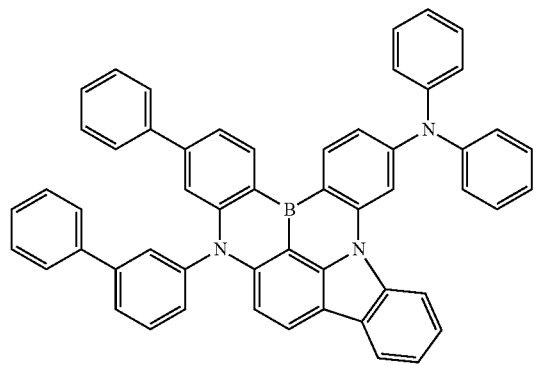
C3

-continued

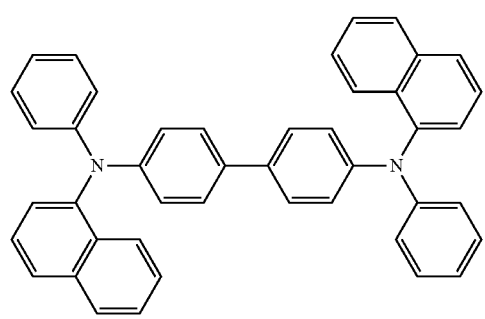

NPD

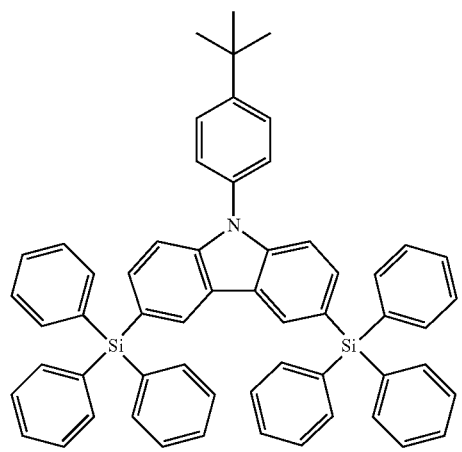

CzSi

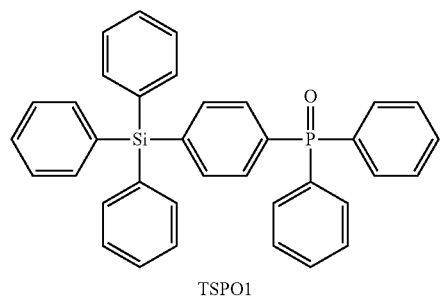

TSPO1

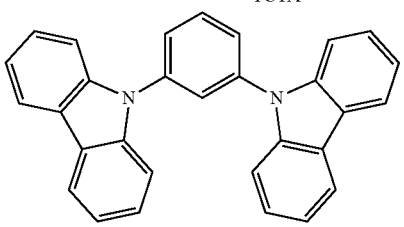

TCTA

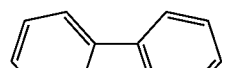

mCP

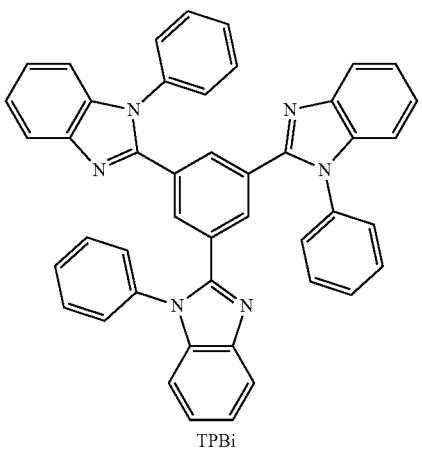

TPBi (Evaluation of Property of Organic Electroluminescence Device)

Evaluation results of the organic electroluminescence devices of Examples 1 to Examples 9, Comparative Example 1, and Comparative Example 2 are listed in Table 3. Drive voltage, luminous efficiency, and external quantum efficiency (EQE) of the manufactured organic electroluminescence devices are listed in Table 3 for comparison.

In the evaluation results of the Examples and Comparative Examples shown in Table 3, voltage and current density were measured using SourceMeter (2400 series, Keithley Instrument, Solon, Ohio, USA), and external quantum efficiency (EQE) was measured using an external quantum efficiency measurement system, C9920-12 from Hamamatsu Photonics (Hamamatsu, Shizuoka, Japan). The luminous efficiency represents a current efficiency value at a current density of 10 mA/cm$^2$.

TABLE 3

| Device manufactured examples | Emission layer dopant materials | Drive voltage (V) | Luminous efficiency (cd/A) | EQE (%) | Emitting color |
|---|---|---|---|---|---|
| Example 1 | Compound 3 | 4.4 | 22.3 | 21.8 | Blue |
| Example 2 | Compound 15 | 4.3 | 24.6 | 23.9 | Blue |
| Example 3 | Compound 24 | 4.6 | 23.0 | 21.5 | Blue |
| Example 4 | Compound 56 | 4.1 | 21.5 | 20.4 | Blue |
| Example 5 | Compound 58 | 4.2 | 21.9 | 20.6 | Blue |
| Example 6 | Compound 66 | 4.4 | 23.1 | 22.4 | Blue |
| Example 7 | Compound 74 | 4.5 | 25.5 | 24.1 | Blue |
| Example 8 | Compound 88 | 4.6 | 22.2 | 20.6 | Blue |
| Example 9 | Compound 98 | 4.2 | 23.4 | 22.6 | Blue |
| Comparative Example 1 | Comparative Compound C2 | 5.4 | 20.3 | 19.5 | Blue |
| Comparative Example 2 | Comparative Compound C3 | 5.3 | 19.9 | 18.7 | Blue |

Referring to the results of Table 3, it can be seen that the Examples of the organic luminescence devices using the fused polycyclic compound according to an embodiment of the present disclosure as an emission layer material each emit blue light and exhibit low drive voltage, relatively high brightness, and high luminous efficiency when compared with the devices of the Comparative Examples. Without being bound by the correctness of any theory or explanation, the example compounds exhibit TADF properties due to multiple resonance phenomena because of their structural properties, including an aromatic ring forming a fused ring, for example two polycyclic rings containing a nitrogen atom and a boron atom, and a fused polycyclic heterocyclic moiety, (such as carbazole, dibenzofuran, and/or dibenzothiophene), such that the Example compounds may exhibit multiple resonances in a broad planar skeleton compared to Comparative Compound C1 and C2. Accordingly, the organic electroluminescence devices of the Examples may exhibit improved luminous efficiency compared with those of the Comparative Examples.

The fused polycyclic compound of an embodiment includes two polycyclic rings containing a nitrogen atom and a boron atom, and has a fused polycyclic heterocyclic moiety in the compound to therefore have a high oscillator strength value and a low $\Delta E_{ST}$ value, and thus can be used as a delayed fluorescence emitting material. Further, the fused polycyclic compound of an embodiment may be used as a dopant material in the emission layer of the organic electroluminescence device to improve efficiency of the device.

The organic electroluminescence device of an embodiment may include the fused polycyclic compound of an embodiment to exhibit improved luminous efficiency. In addition, the organic electroluminescence device of an embodiment may achieve high luminous efficiency in the blue light wavelength region by including the fused polycyclic compound of an embodiment as an emission layer material.

The organic electroluminescence device according to an embodiment of the present disclosure may exhibit improved device properties such as low drive voltage and high efficiency.

The fused polycyclic compounds of an embodiment may be included in the emission layer of the organic electroluminescence device, thereby contributing to high efficiency of the organic electroluminescence device.

Although the foregoing has been described with reference to various embodiments of the present disclosure, it will be understood that various changes and modifications of the present disclosure may be made by one skilled in the art or one having ordinary knowledge in the art without departing from the spirit and technical field of the present disclosure as set forth in the following claims and their equivalents.

Hence, the technical scope of the present disclosure is not limited to the specification, but should be determined only by reference to the following claims and their equivalents.

What is claimed is:

1. An organic electroluminescence device comprising:
a first electrode;
a second electrode facing the first electrode; and
a plurality of organic layers between the first electrode and the second electrode,
wherein the first electrode and the second electrode each independently comprise at least one selected from Ag, Mg, Cu, Al, Pt, Pd, Au, Ni, Nd, Ir, Cr, Li, Ca, LiF/Ca, LiF/Al, Mo, Ti, In, Sn, and Zn, a compound of two or more thereof, a mixture of two or more thereof, and an oxide thereof,
wherein at least one organic layer selected from the plurality of organic layers comprises a fused polycyclic compound represented by Formula 1-1:

[Formula 1-1]

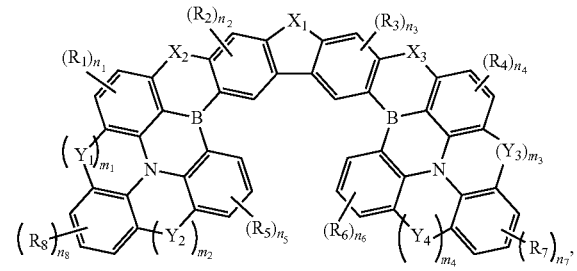

wherein in Formula 1-1,
$X_1$ to $X_3$ are each independently $NR_9$, O, or S,
$Y_1$ to $Y_4$ are each independently a direct linkage, O, or S,
$R_1$ to $R_6$ are each independently a hydrogen atom, a deuterium atom, a halogen atom, a boron group, a phosphine oxide group, a cyano group, a substituted or unsubstituted silyl group, a substituted or unsubstituted aryl group having 6 to 60 carbon atoms to form a ring, or a substituted or unsubstituted heteroaryl group having 2 to 60 carbon atoms to form a ring, or are combined with an adjacent group to form a ring,
$R_7$ and $R_8$ are each independently a hydrogen atom, a deuterium atom, a halogen atom, a boron group, a phosphine oxide group, a cyano group, a substituted or unsubstituted amine group, a substituted or unsubstituted silyl group, a substituted or unsubstituted alkyl group having 1 to 20 carbon atoms, a substituted or unsubstituted aryl group having 6 to 60 carbon atoms to form a ring, or a substituted or unsubstituted heteroaryl group having 2 to 60 carbon atoms to form a ring, or are combined with an adjacent group to form a ring,
$R_9$ is a substituted or unsubstituted alkyl group having 1 to 20 carbon atoms, a substituted or unsubstituted aryl group having 6 to 60 carbon atoms to form a ring, or a substituted or unsubstituted heteroaryl group having 2 to 60 carbon atoms to form a ring,
$n_1$ to $n_4$ are each independently an integer of 0 to 2,
$n_5$ and $n_6$ are each independently an integer of 0 to 3,
$n_7$ and $n_8$ are each independently an integer of 0 to 3, and
$m_1$ to $m_4$ are each independently 0 or 1.

2. The organic electroluminescence device of claim 1, wherein the organic layers comprise:

a hole transport region on the first electrode;

an emission layer on the hole transport region; and an electron transport region on the emission layer, wherein the emission layer comprises the fused polycyclic compound represented by Formula 1-1.

3. The organic electroluminescence device of claim 2, wherein the emission layer is to emit delayed fluorescence.

4. The organic electroluminescence device of claim 2, wherein:

the emission layer is a delayed fluorescence emission layer comprising a host and a dopant; and the dopant comprises the fused polycyclic compound represented by Formula 1-1.

5. The organic electroluminescence device of claim 2, wherein the emission layer comprises:

a host having a first lowest triplet exciton energy level;

a first dopant having a second lowest triplet exciton energy level lower than the first lowest triplet exciton energy level; and a second dopant having a third lowest triplet exciton energy level lower than the second lowest triplet exciton energy level, wherein the first dopant comprises the fused polycyclic compound represented by Formula 1-1.

6. The organic electroluminescence device of claim 5, wherein:

the first dopant is a delayed fluorescence dopant; and the second dopant is a fluorescence dopant.

7. The organic electroluminescence device of claim 1, wherein:

in Formula 1-1, at least one selected from $Y_1$ to $Y_4$ is a direct linkage;

when $Y_1$ is a direct linkage, $m_1$ is 1;

when $Y_2$ is a direct linkage, $m_2$ is 1;

when $Y_3$ is a direct linkage, $m_3$ is 1; and when $Y_4$ is a direct linkage, $m_4$ is 1.

8. The organic electroluminescence device of claim 1, wherein the fused polycyclic compound represented by Formula 1-1 is represented by Formula 2-1 or Formula 2-2:

[Formula 2-1]

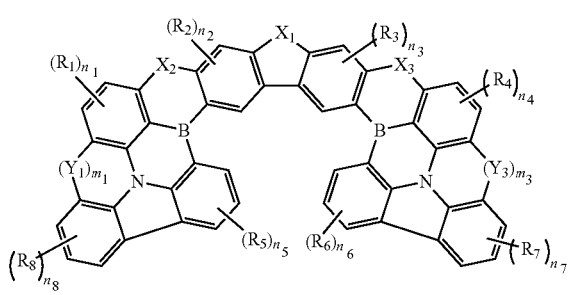

[Formula 2-2]

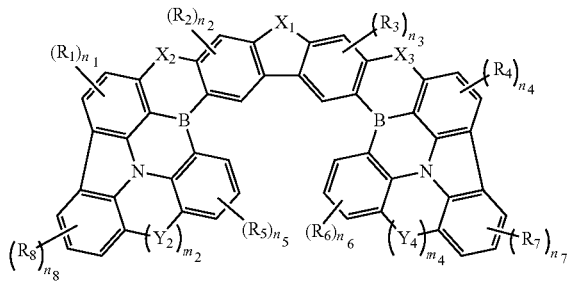

in Formula 2-1 and Formula 2-2, $X_1$ to $X_3$, $Y_1$ to $Y_4$, $R_1$ to $R_8$, $n_1$ to $n_8$, and $m_1$ to $m_4$ are each independently the same as defined in Formula 1-1.

9. The organic electroluminescence device of claim 1, wherein the fused polycyclic compound represented by Formula 1-1 is represented by Formula 3-1 or Formula 3-2:

[Formula 3-1]

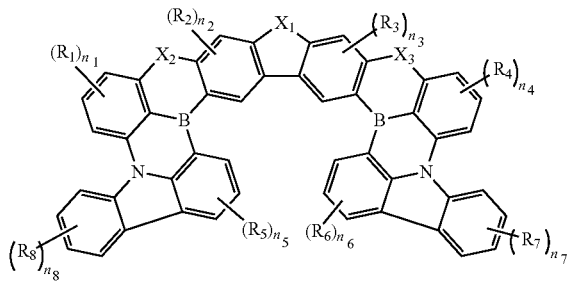

[Formula 3-2]

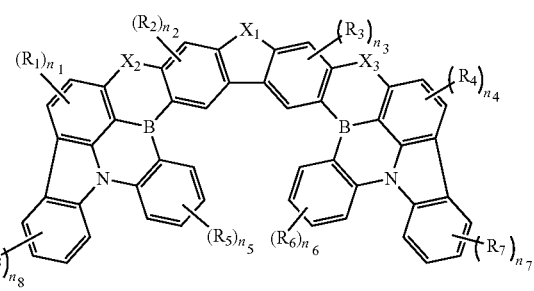

in Formula 3-1 and Formula 3-2, $X_1$ to $X_3$, $R_1$ to $R_8$, and $n_1$ to $n_8$ are each independently the same as defined in Formula 1-1.

10. The organic electroluminescence device of claim 1, wherein the fused polycyclic compound represented by Formula 1-1 is represented by Formula 4:

[Formula 4]

in Formula 4,
X$_1$ to X$_3$, Y$_1$ to Y$_4$, R$_1$, R$_4$, and m$_1$ to m$_4$ are each independently the same as defined in Formula 1-1.

11. The organic electroluminescence device of claim 1, wherein, in Formula 1-1, X$_2$ and X$_3$ are the same, Y$_1$ and Y$_3$ are the same, Y$_2$ and Y$_4$ are the same, m$_1$ and m$_3$ are the same, and m$_2$ and m$_4$ are the same.

12. The organic electroluminescence device of claim 1, wherein, in Formula 1-1, when X$_1$ to X$_3$ are each NR$_9$, R$_9$ is a substituted or unsubstituted phenyl group.

13. The organic electroluminescence device of claim 1, wherein the at least one organic layer comprises at least one selected from compounds of Compound Group 1 and Compound Group 2:

-continued
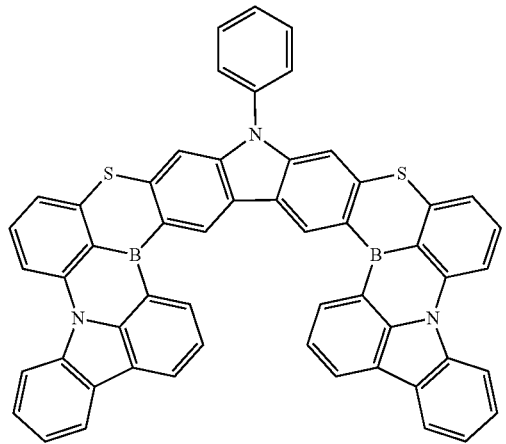
7
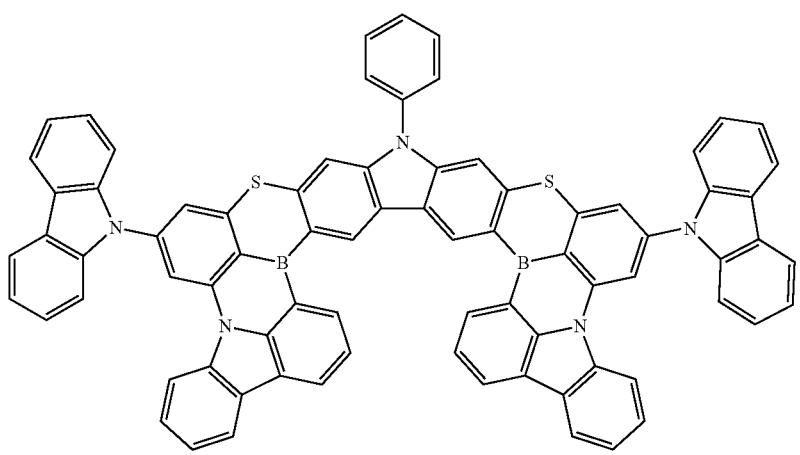
8
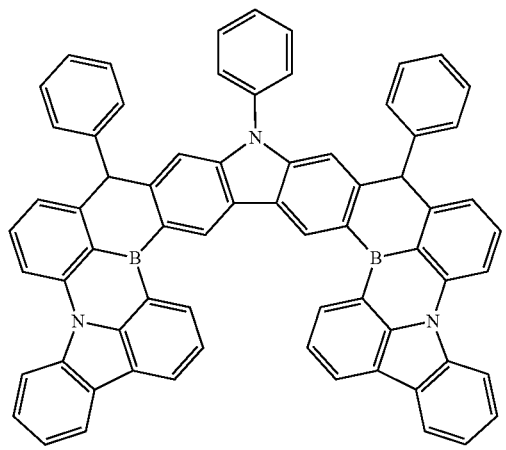
13

-continued
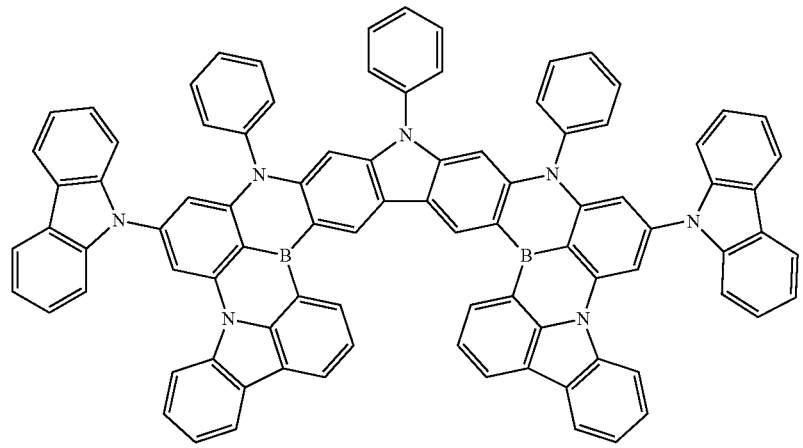
14
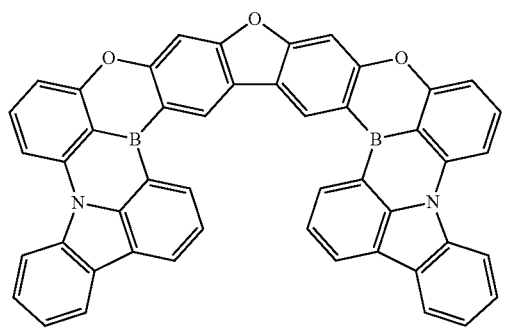
19
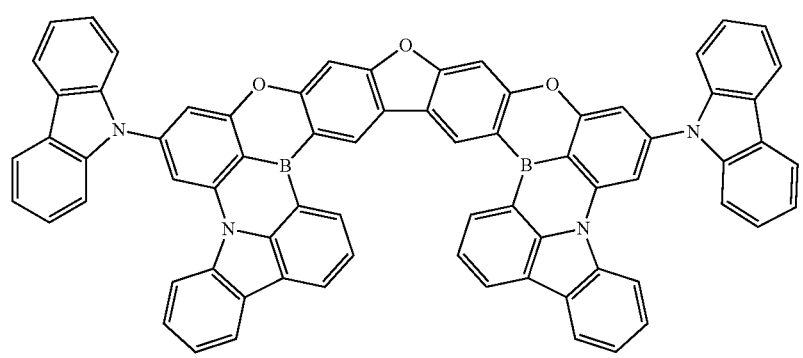
20
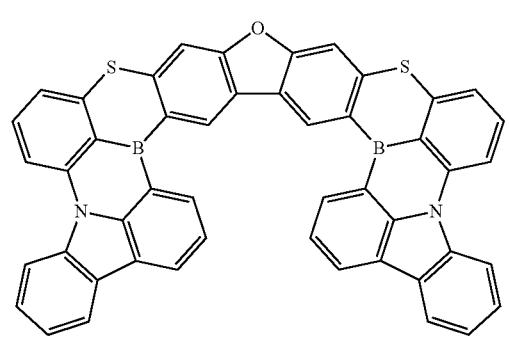
25

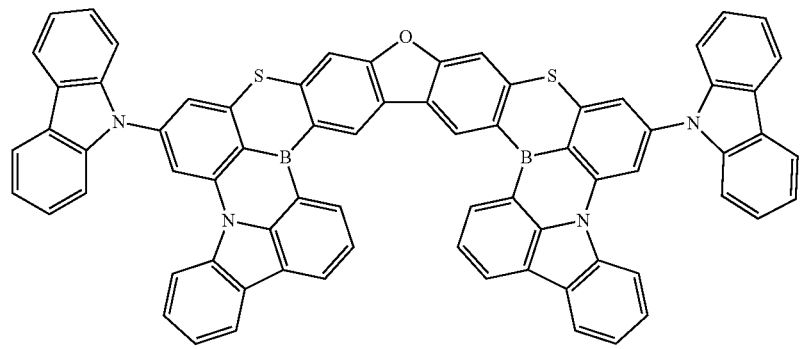
26
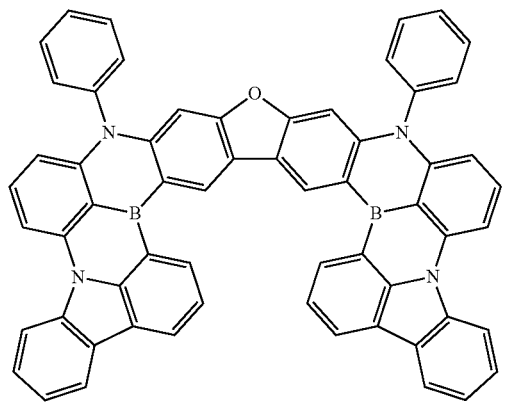
31
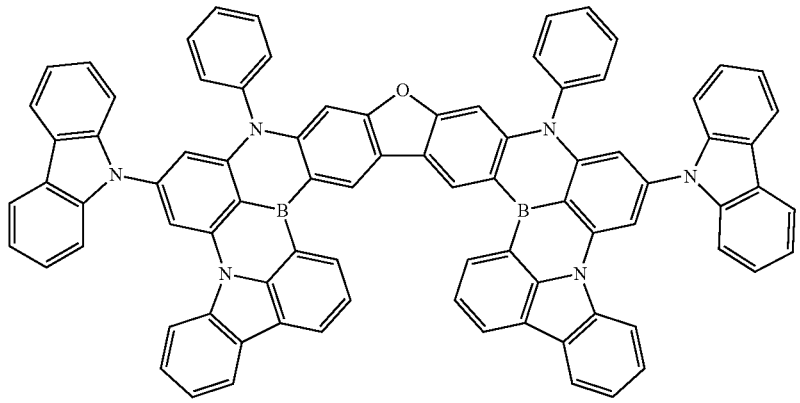
32
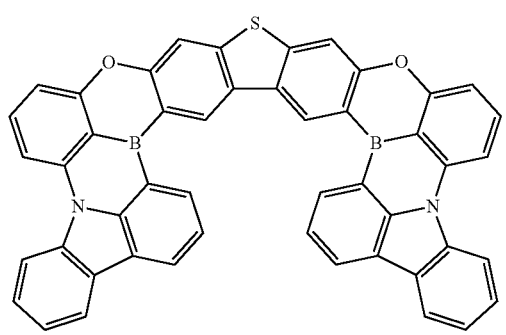
37

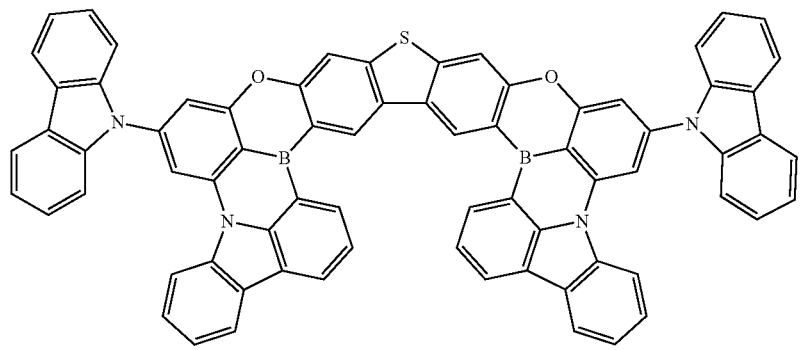
38
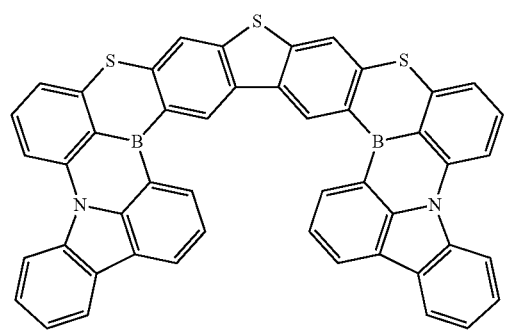
43
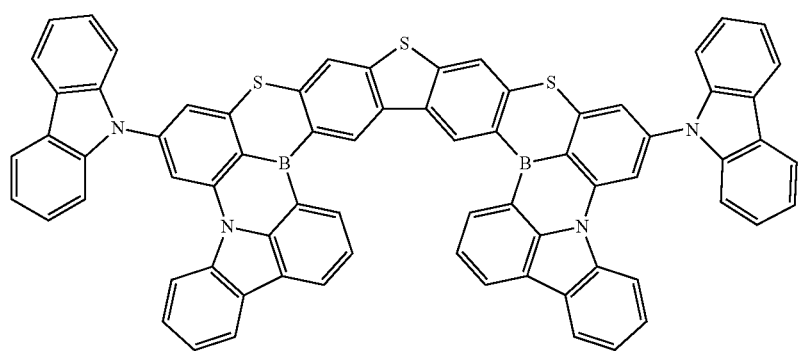
44
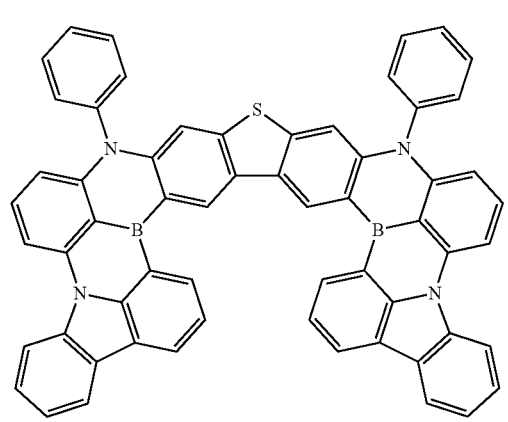
49

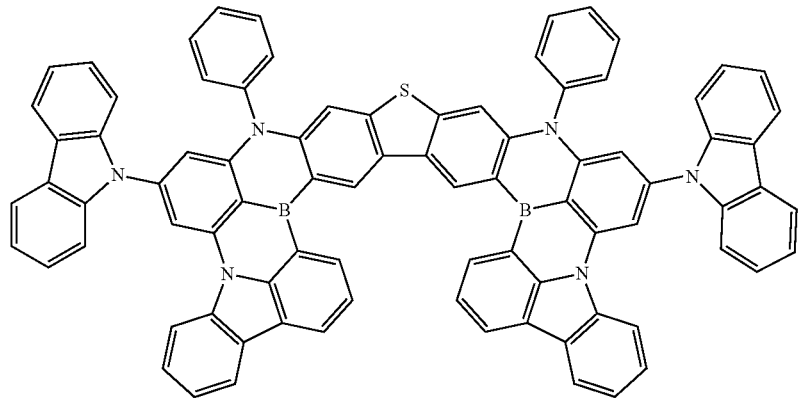
50
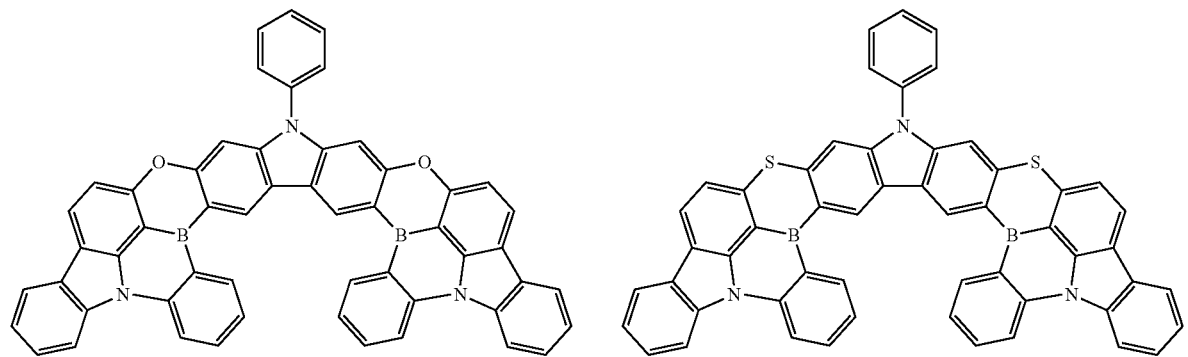
56 57
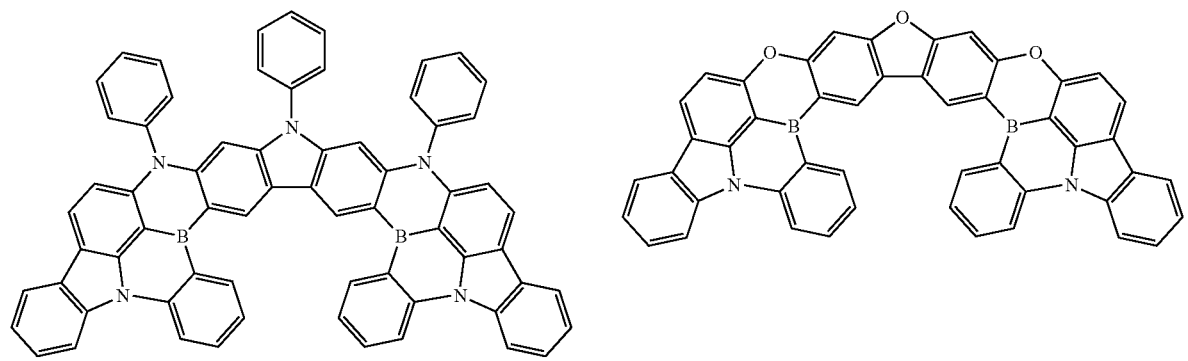
58 59
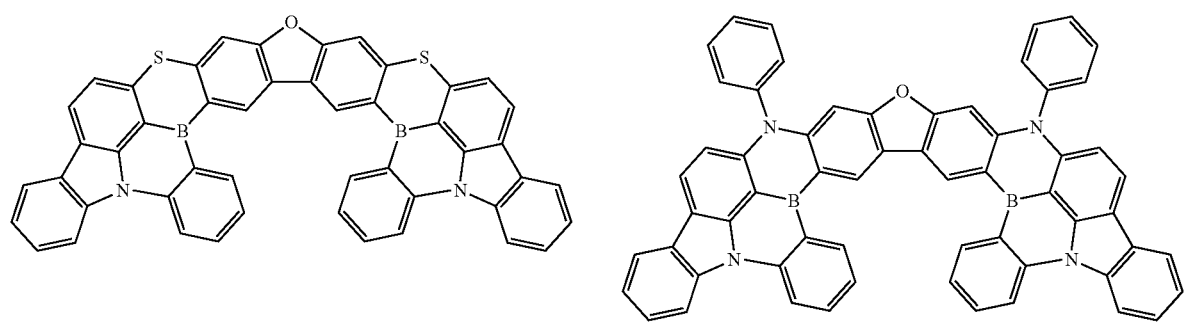
60 61

-continued
62
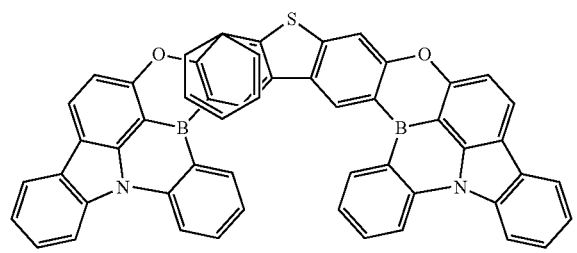
63
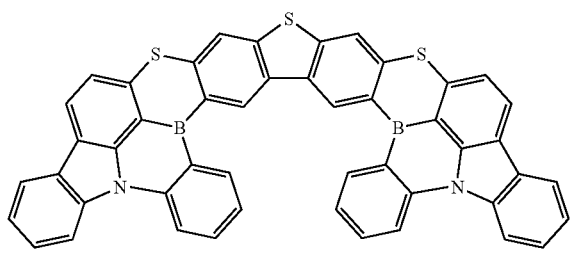
64
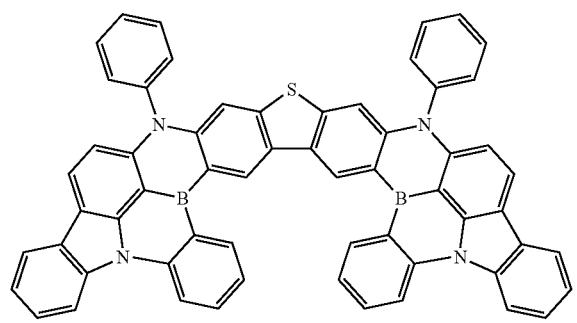
[Compound Group 2]
65
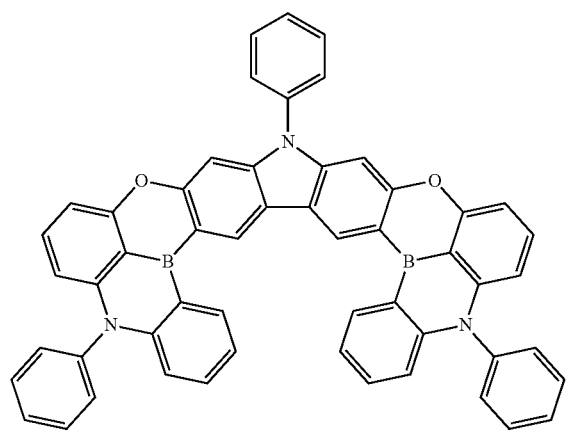
69
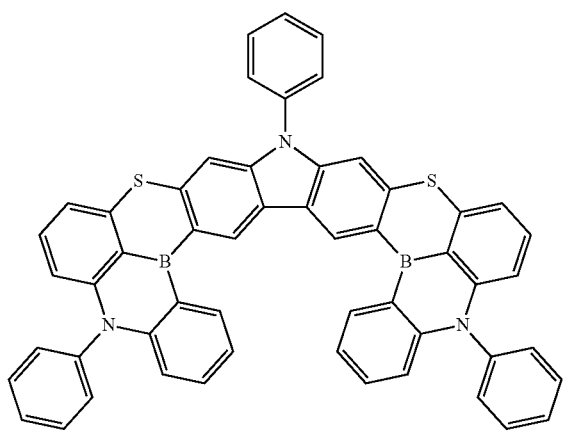
73
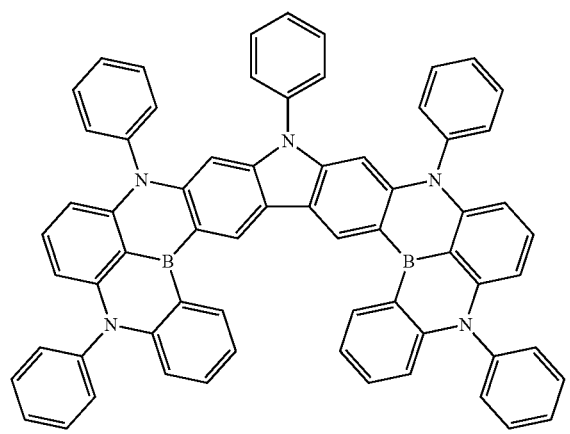
77
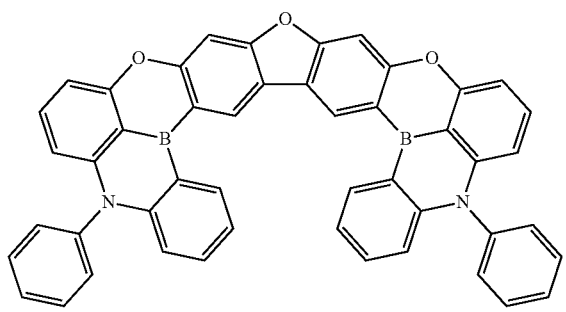

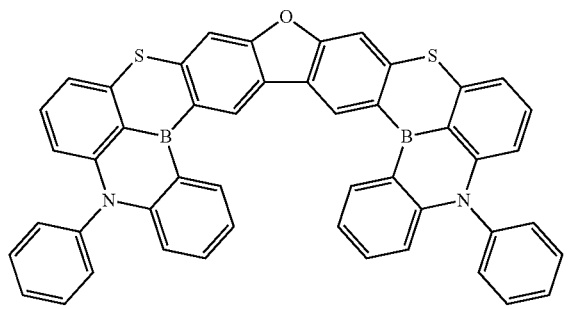

81

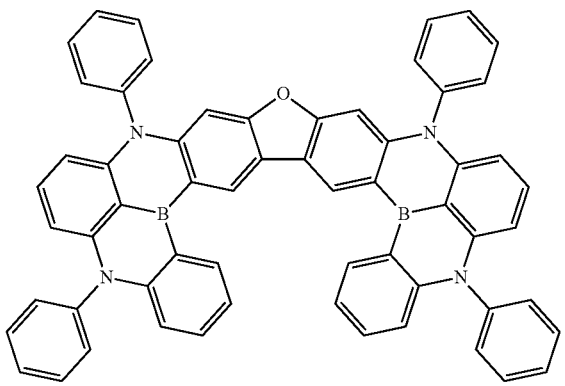

85

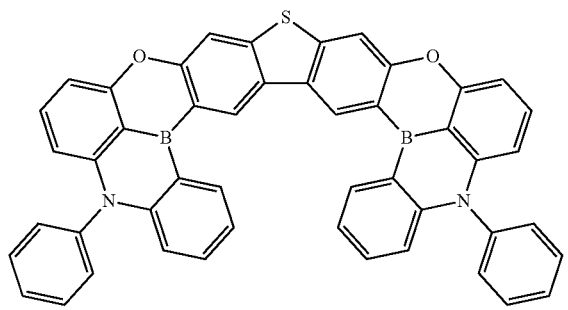

89

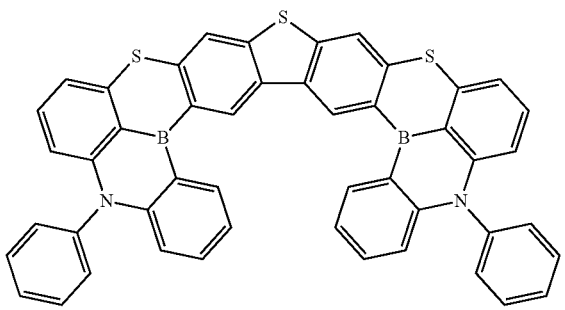

93

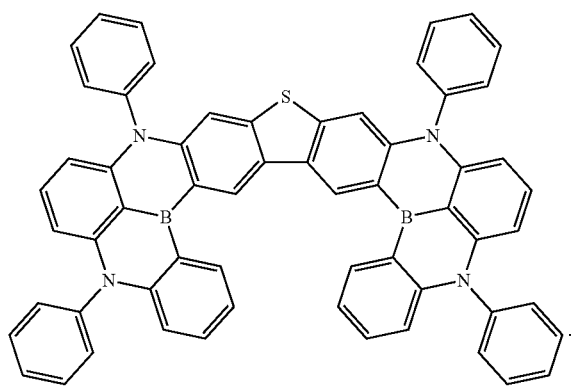

97

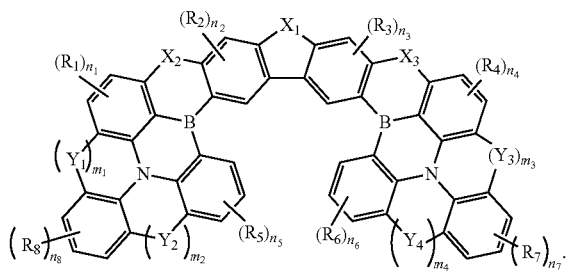

14. A fused polycyclic compound represented by Formula 1-1:

[Formula 1-1]

wherein in Formula 1-1,
$X_1$ to $X_3$ are each independently $NR_9$, O, or S,
$Y_1$ to $Y_4$ are each independently a direct linkage, O, or S, $R_1$ to $R_6$ are each independently a hydrogen atom, a deuterium atom, a halogen atom, a boron group, a phosphine oxide group, a cyano group, a substituted or unsubstituted silyl group, a substituted or unsubstituted aryl group having 6 to 60 carbon atoms to form a ring, or a substituted or unsubstituted heteroaryl group having 2 to 60 carbon atoms to form a ring, or are combined with an adjacent group to form a ring, $R_7$ and $R_8$ are each independently a hydrogen atom, a deuterium atom, a halogen atom, a boron group, a phosphine oxide group, a cyano group, a substituted or unsubstituted amine group, a substituted or unsubstituted silyl group, a substituted or unsubstituted alkyl group having 1 to 20 carbon atoms, a substituted or unsubstituted aryl group having 6 to 60 carbon atoms to form a ring, or a substituted or unsubstituted heteroaryl group having 2 to 60 carbon atoms to form a ring, or are combined with an adjacent group to form a ring, $R_9$ is a substituted or unsubstituted alkyl group having 1 to 20 carbon atoms, a substituted or unsubstituted aryl group having 6 to 60 carbon atoms to form a ring, or a substituted or unsubstituted heteroaryl group having 2 to 60 carbon atoms to form a ring, $n_1$ to $n_4$ are each independently an integer of 0 to 2, $n_5$ and $n_6$ are each independently an integer of 0 to 3, $n_7$ and $n_8$ are each independently an integer of 0 to 3, and $m_1$ to $m_4$ are each independently 0 or 1.

15. The fused polycyclic compound of claim 14, wherein the absolute value of a difference between a lowest singlet exciton energy level (S1) of the fused polycyclic compound represented by Formula 1-1, and a lowest triplet exciton energy level (T1) of the fused polycyclic compound represented by Formula 1-1 is 0.33 eV or less.

16. The fused polycyclic compound of claim 14, wherein, in Formula 1-1, at least one selected from $Y_1$ to $Y_4$ is a direct linkage, when $Y_1$ is a direct linkage, $m_1$ is 1, when $Y_2$ is a direct linkage, $m_2$ is 1, when $Y_3$ is a direct linkage, $m_3$ is 1, and when $Y_4$ is a direct linkage, $m_4$ is 1.

17. The fused polycyclic compound of claim 14, wherein the fused polycyclic compound represented by Formula 1-1 is represented by Formula 2-1 or Formula 2-2:

[Formula 2-1]

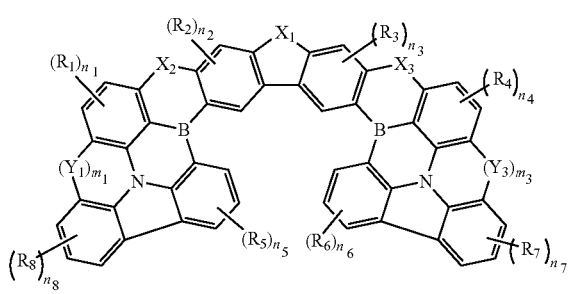

[Formula 2-2]

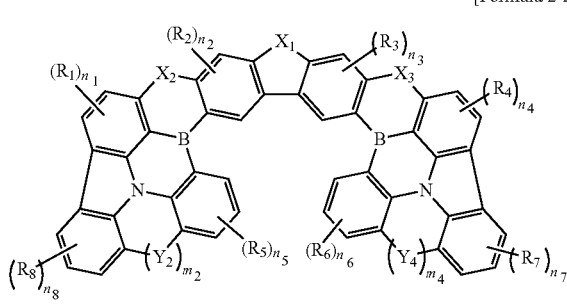

in Formula 2-1 and Formula 2-2, $X_1$ to $X_3$, $Y_1$ to $Y_4$, $R_1$ to $R_8$, $n_1$ to $n_8$, and $m_1$ to $m_4$ are each independently the same as defined in Formula 1-1.

18. The fused polycyclic compound of claim 14, wherein the fused polycyclic compound represented by Formula 1-1 is represented by Formula 3-1 or Formula 3-2:

[Formula 3-1]

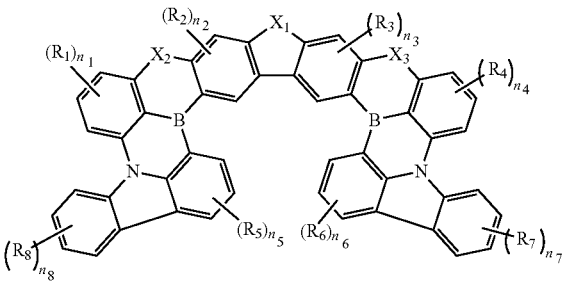

[Formula 3-2]

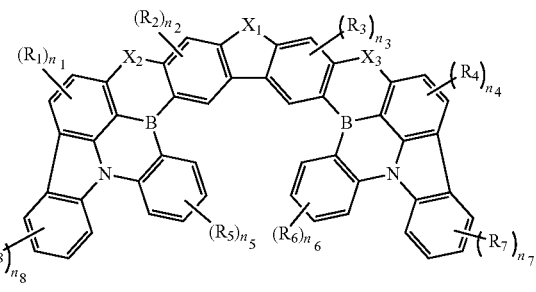

in Formula 3-1 and Formula 3-2, $X_1$ to $X_3$, $R_1$ to $R_8$, and $n_1$ to $n_8$ are each independently the same as defined in Formula 1-1.

19. The fused polycyclic compound of claim 14, wherein the fused polycyclic compound represented by Formula 1-1 is represented by Formula 4:

[Formula 4]

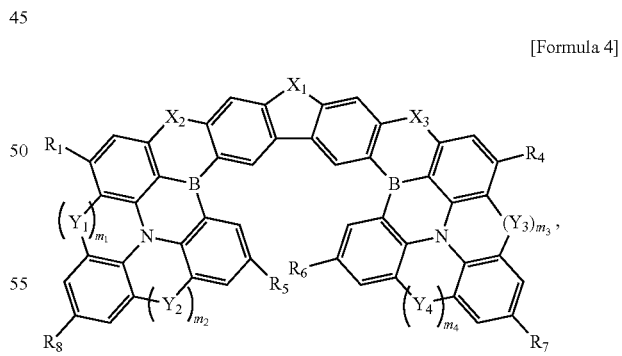

in Formula 4, $X_1$ to $X_3$, $Y_1$ to $Y_4$, $R_1$, $R_4$, $R_7$, $R_8$, and $m_1$ to $m_4$ are each independently the same as defined in Formula 1-1.

20. The fused polycyclic compound of claim 14, wherein, in Formula 1-1, $X_2$ and $X_3$ are the same, $Y_1$ and $Y_3$ are the same, $Y_2$ and $Y_4$ are the same, $m_1$ and $m_3$ are the same, and $m_2$ and $m_4$ are the same.

21. A fused polycyclic compound, wherein the fused polycyclic compound is selected from compounds of Compound Group 1 and Compound Group 2:
[Compound Group 1]
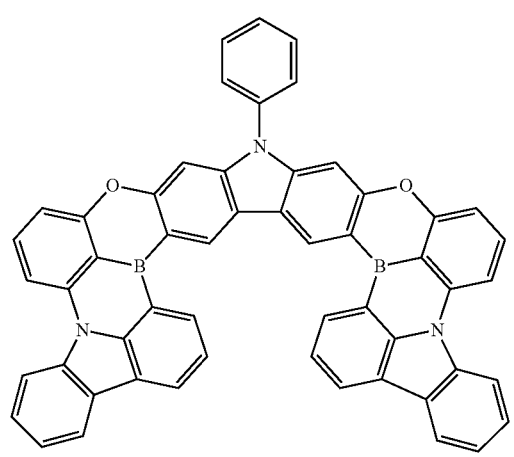
1
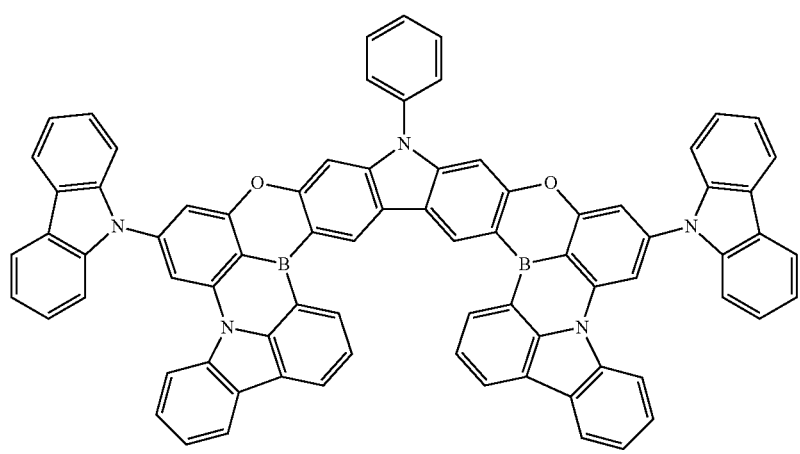
2
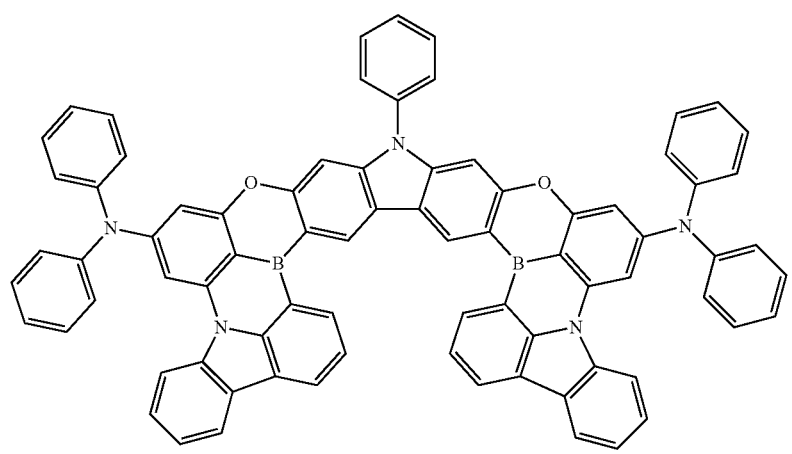
3

-continued
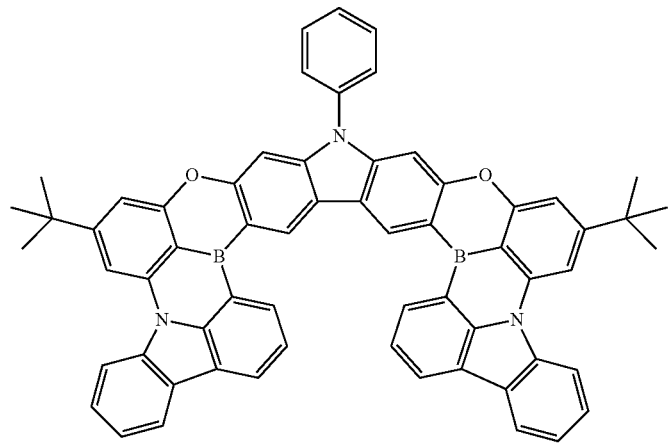
4
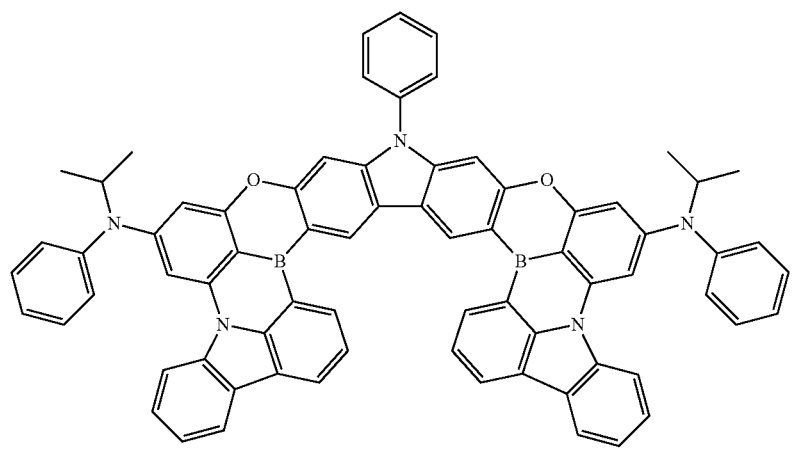
5
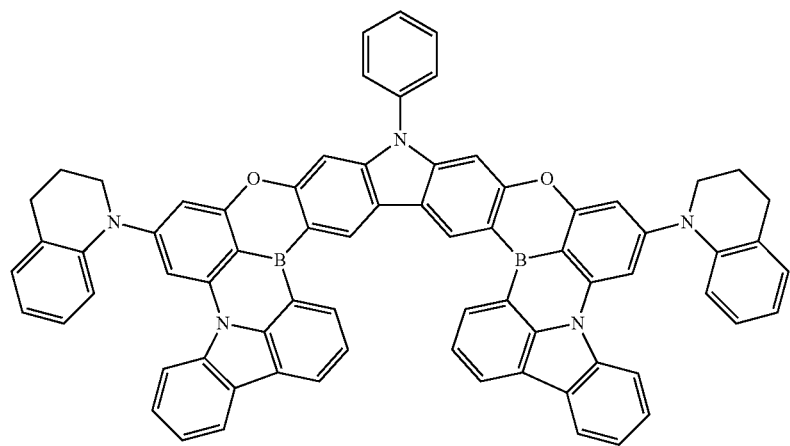
6

-continued
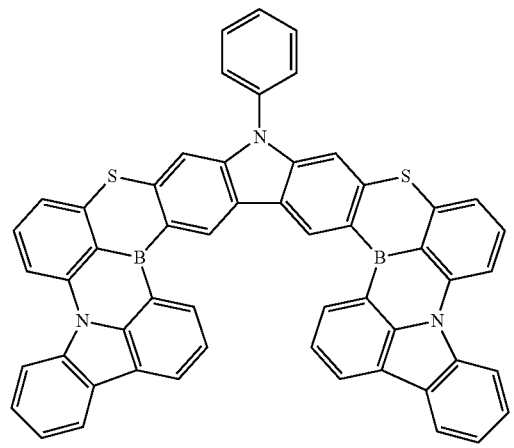
7
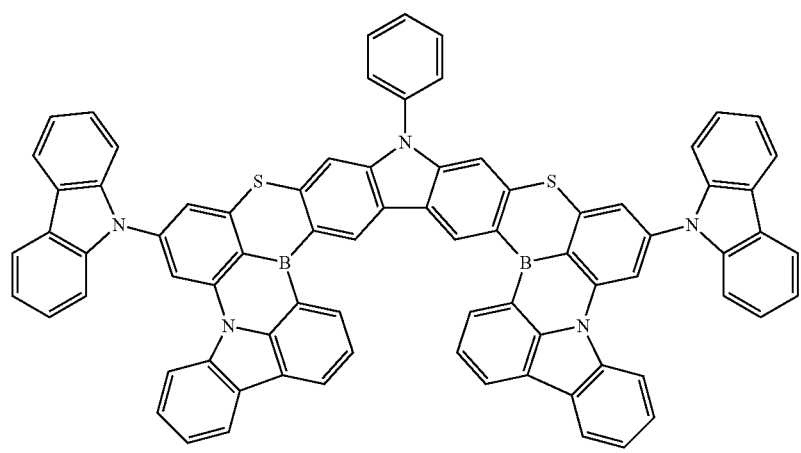
8
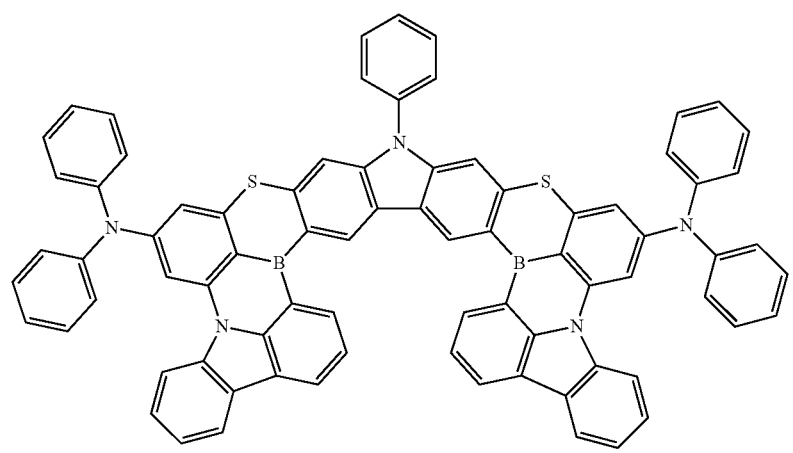
9

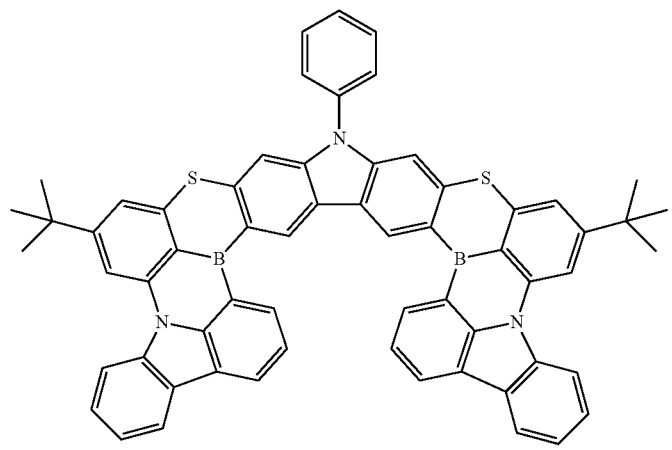
10
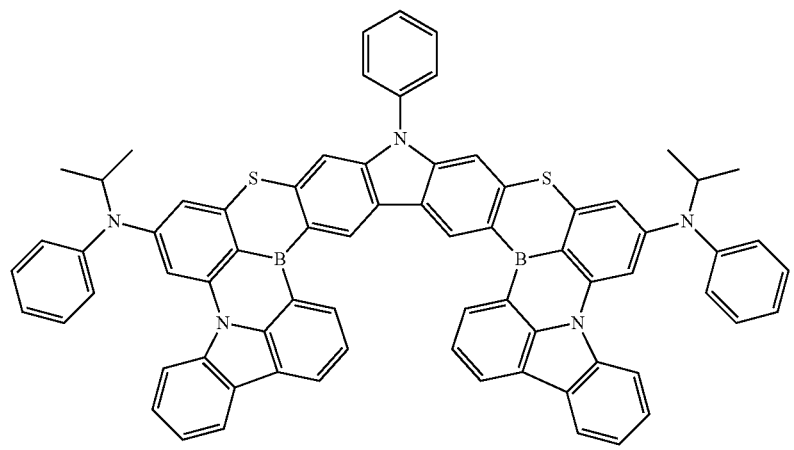
11
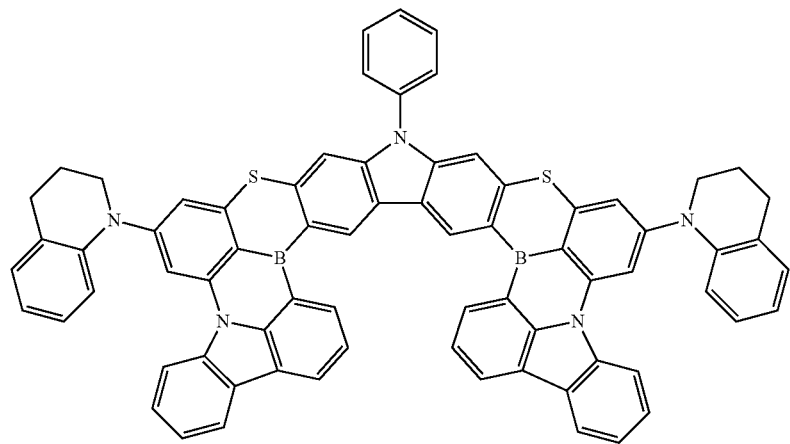
12

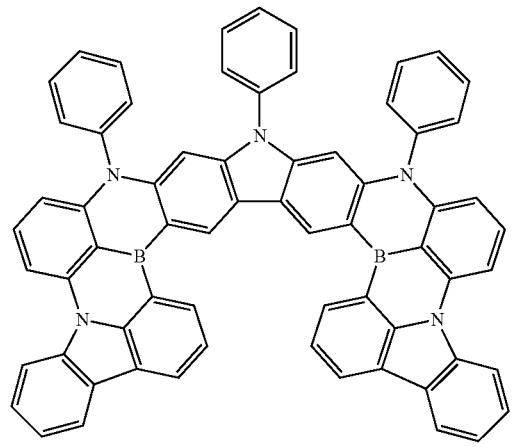
13
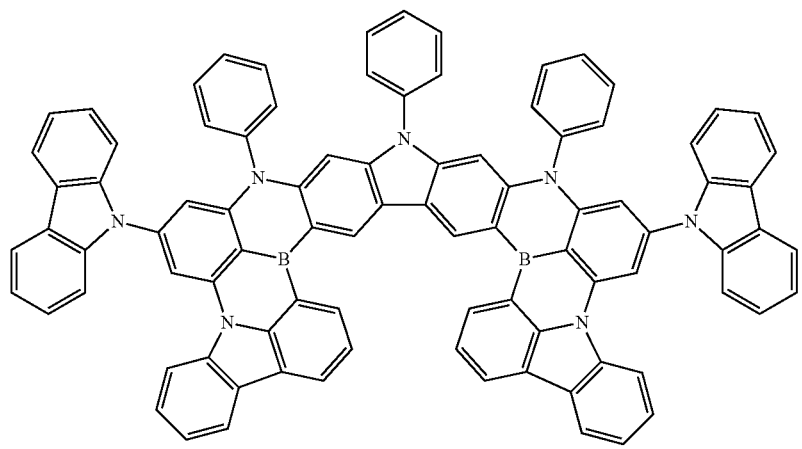
14
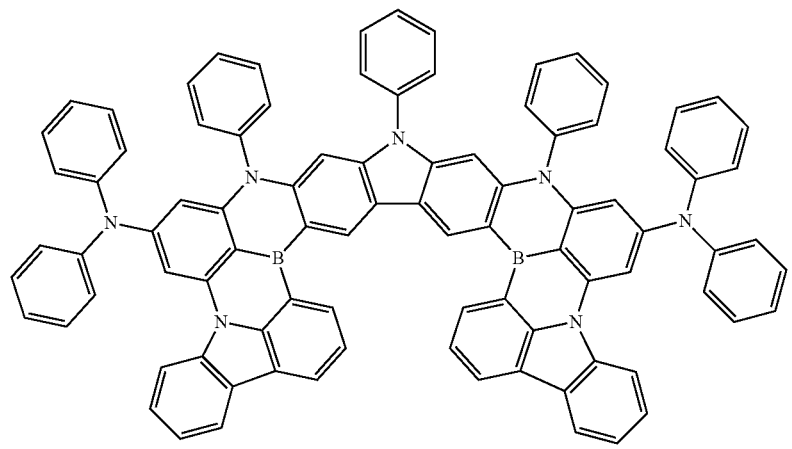
15

-continued
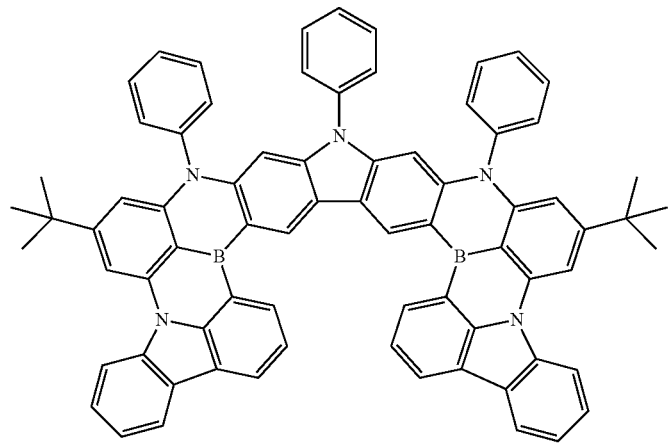
16
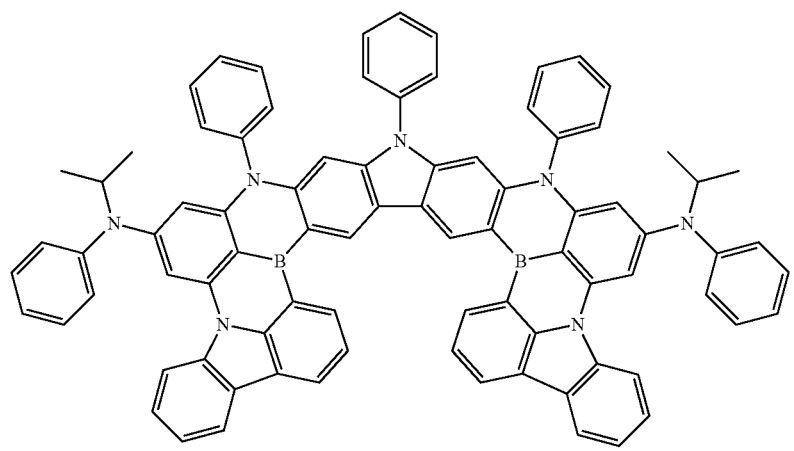
17
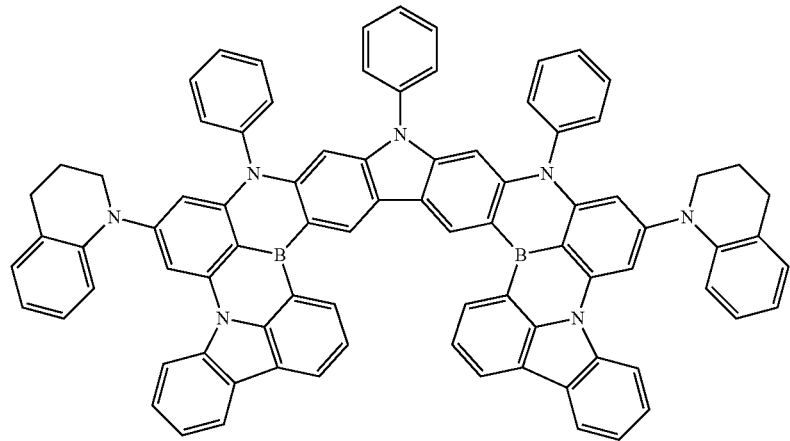
18

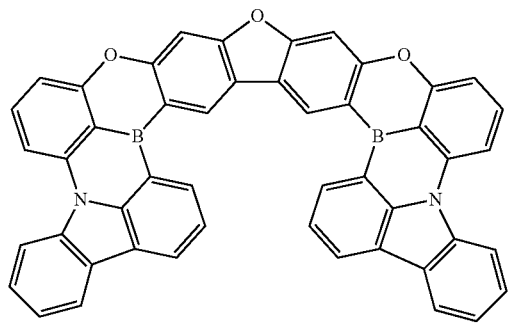
19
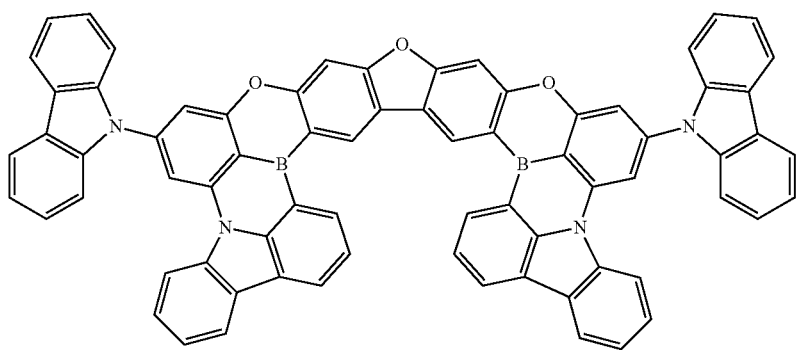
20
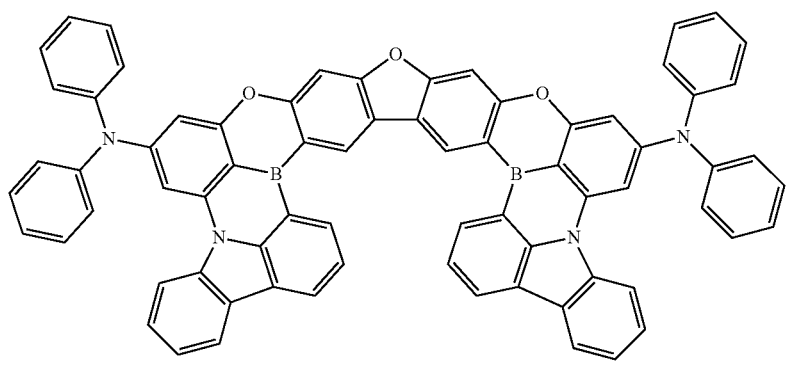
21
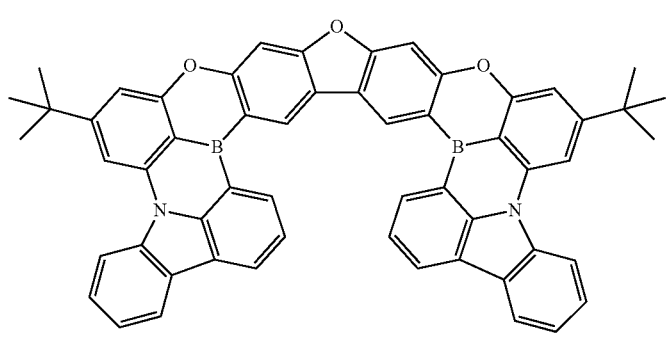
22

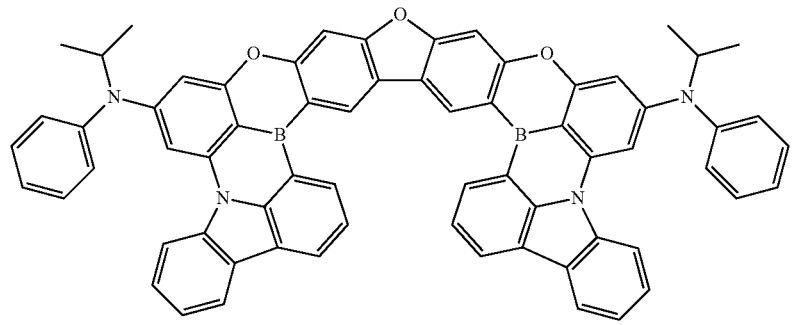
23
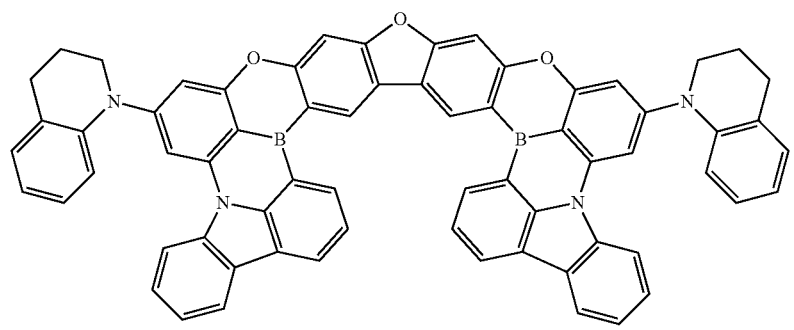
24
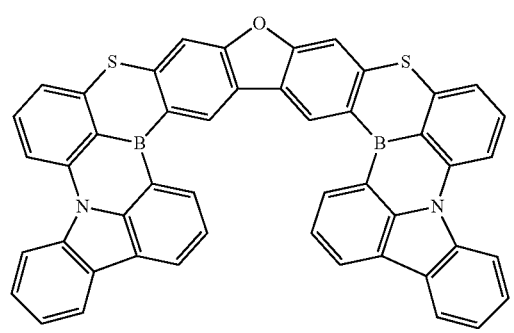
25
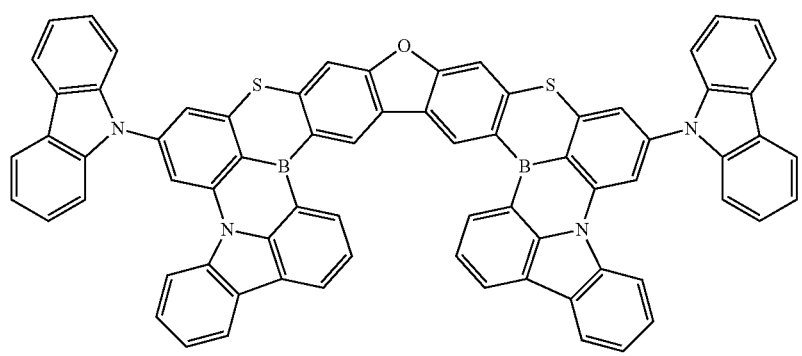
26

-continued
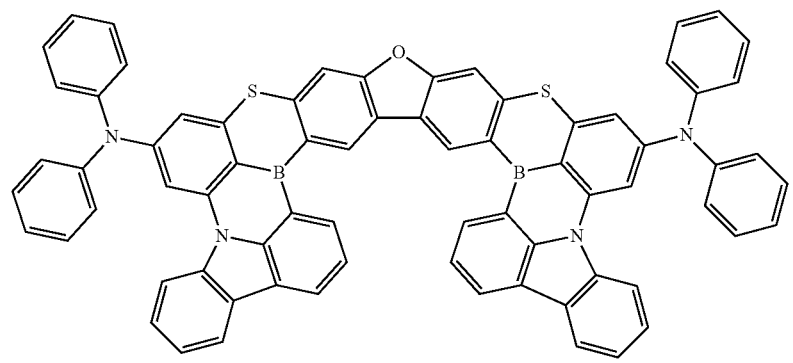
27
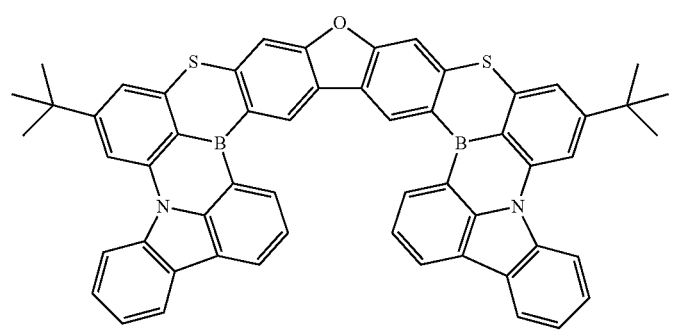
28
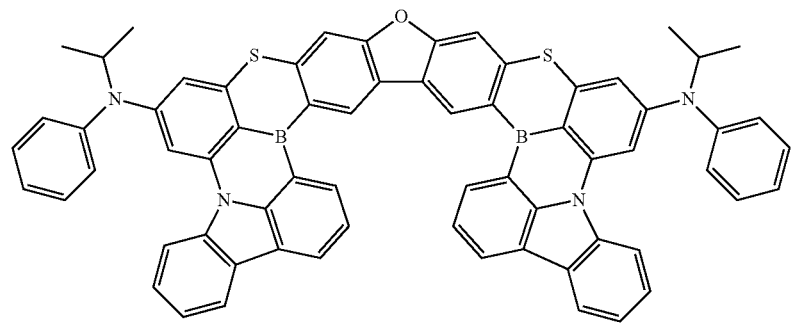
29
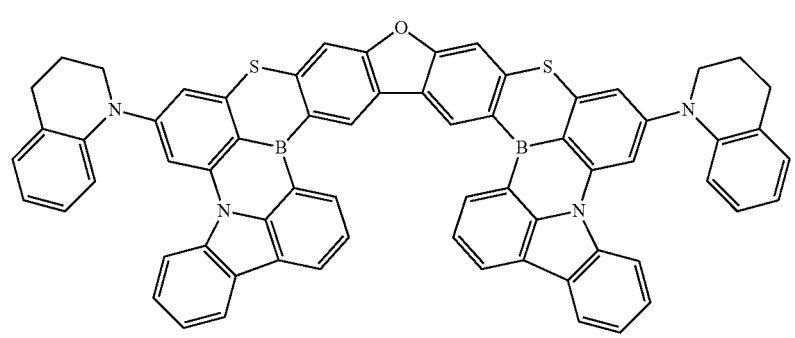
30

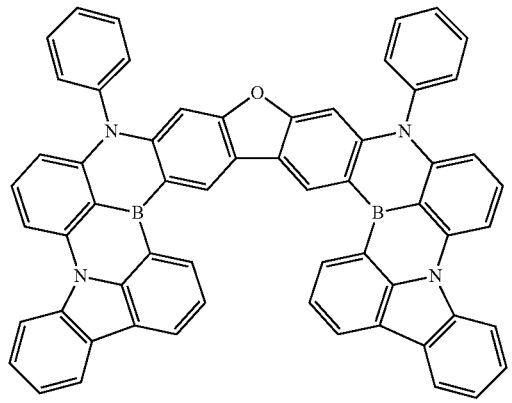
31
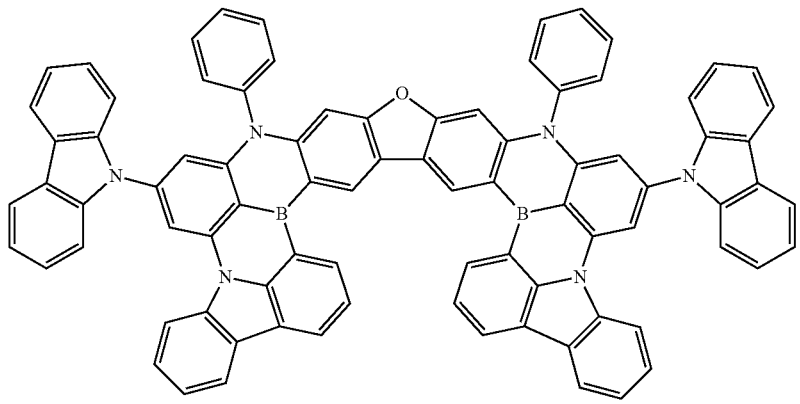
32
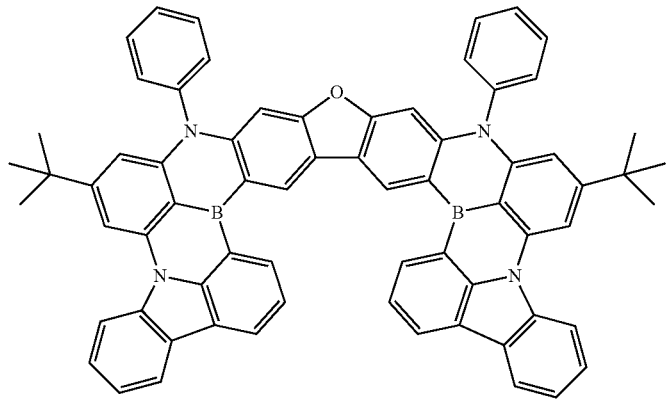
34
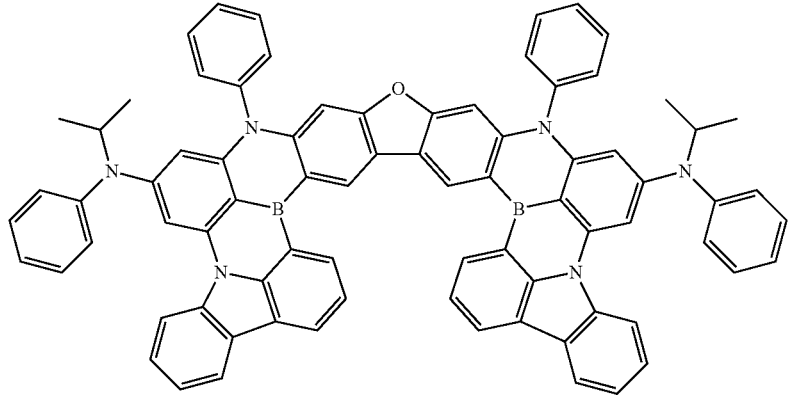
35

-continued
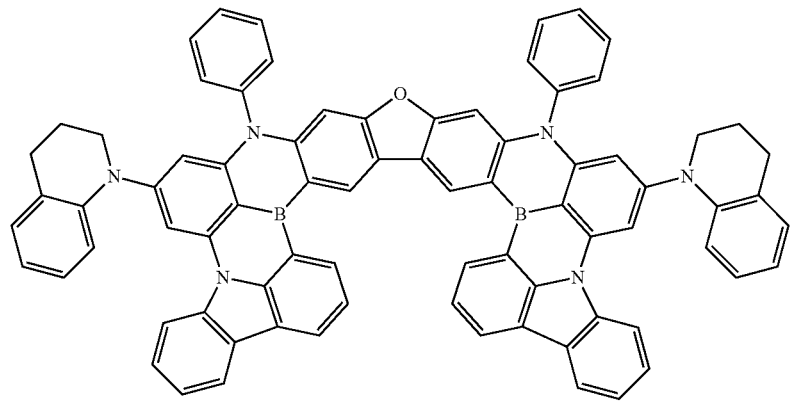
36
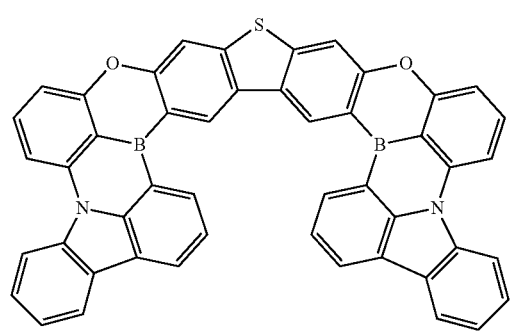
37
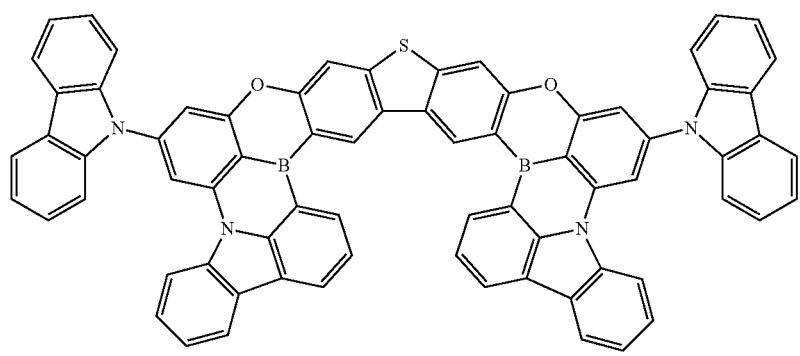
38
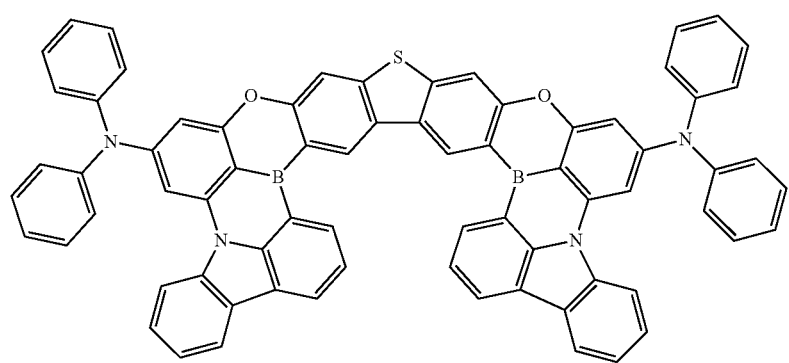
39

-continued
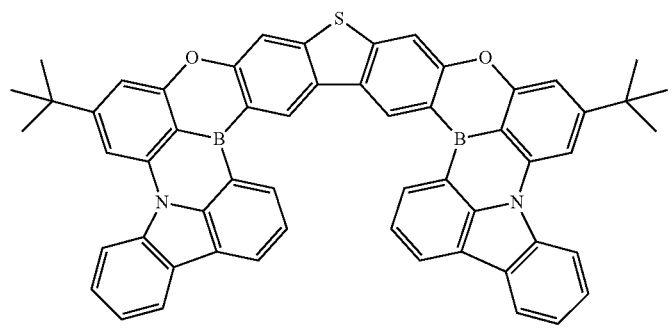
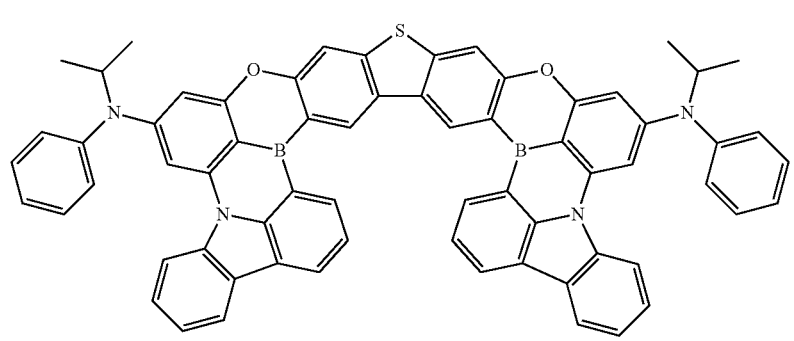
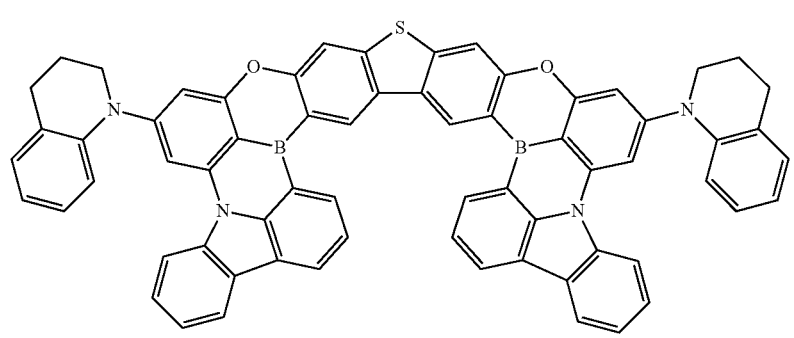
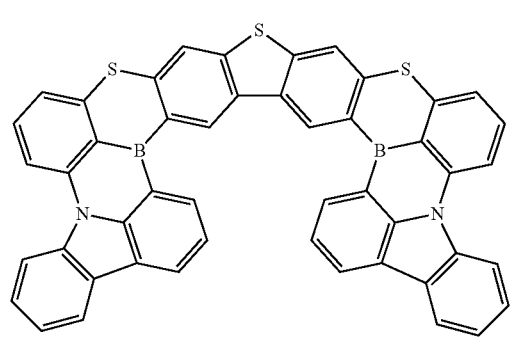
40
41
42
43

-continued
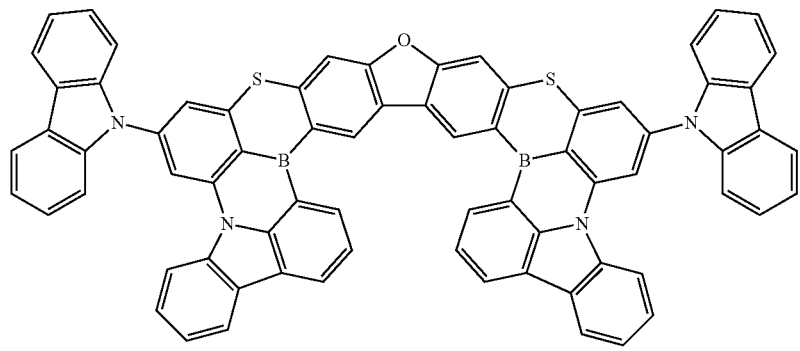
44
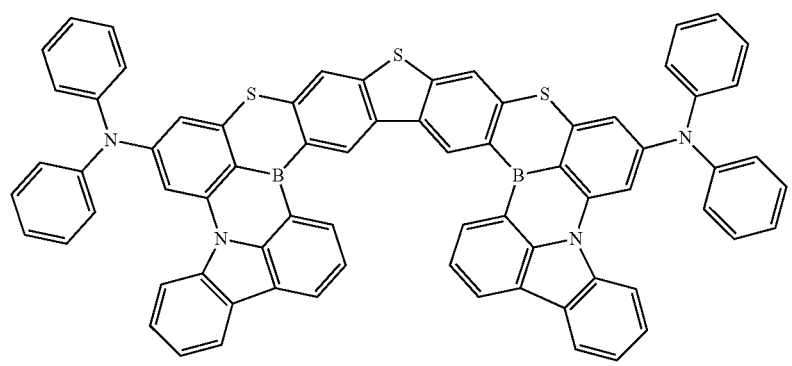
45
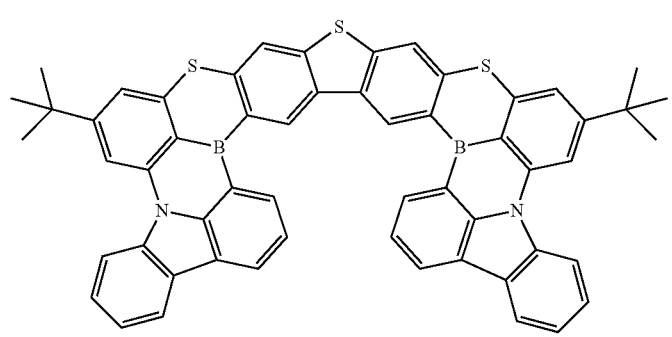
46
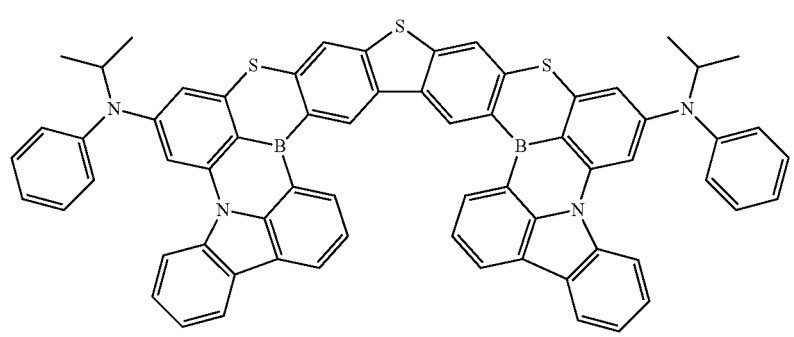
47

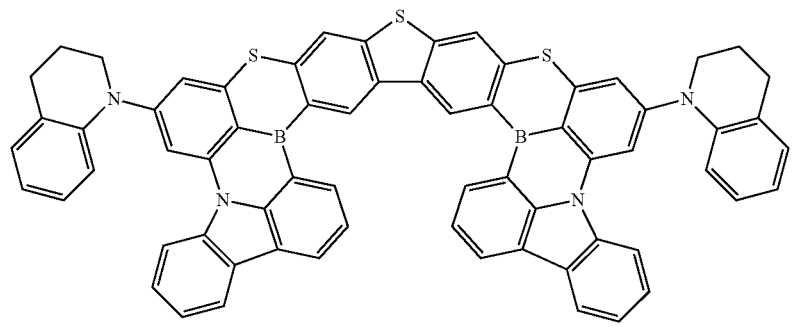
48
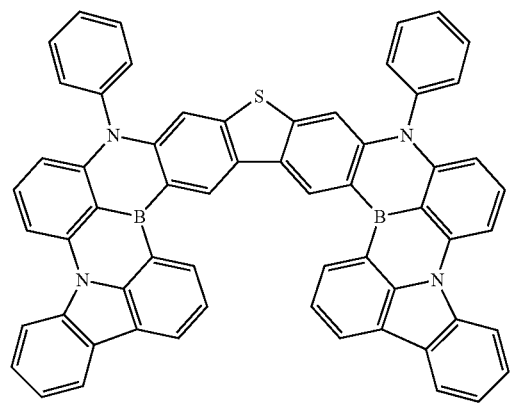
49
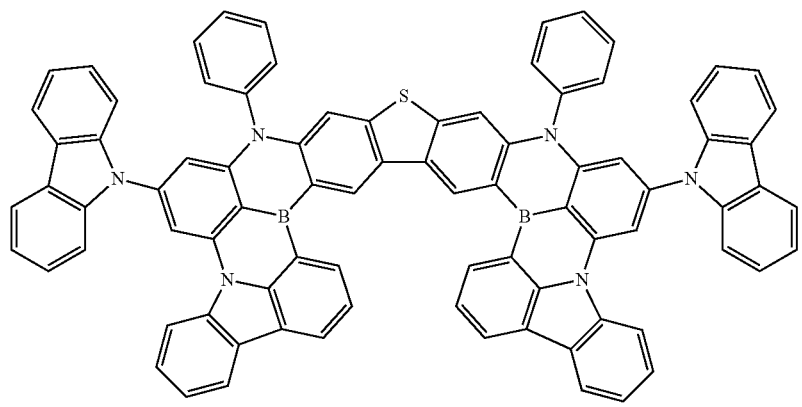
50
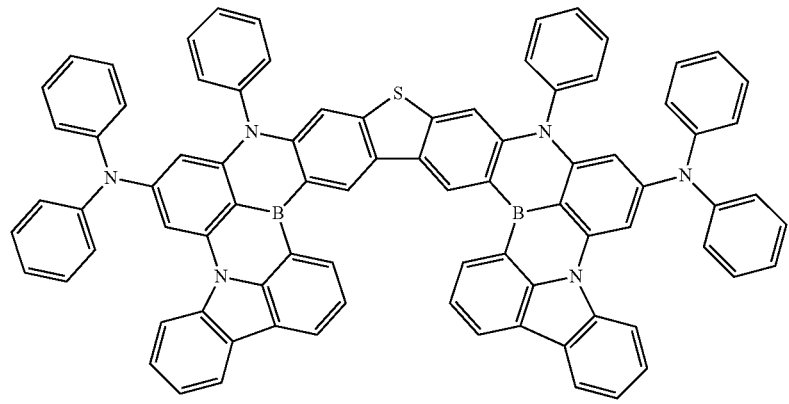
51

-continued
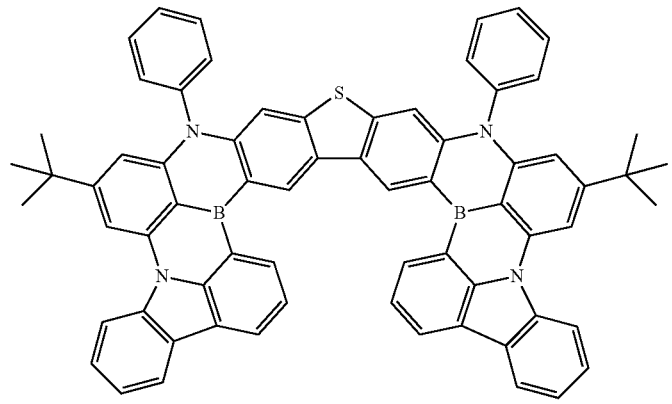
52
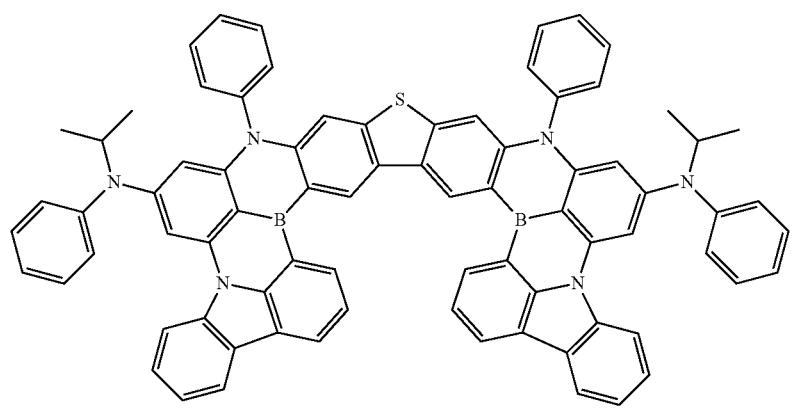
53
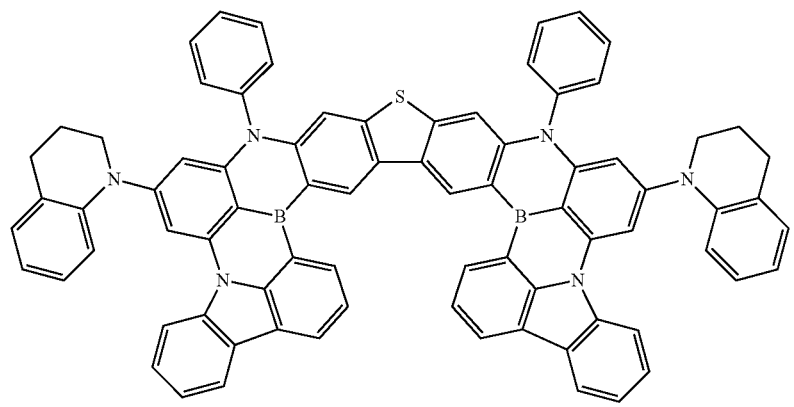
54

-continued
55
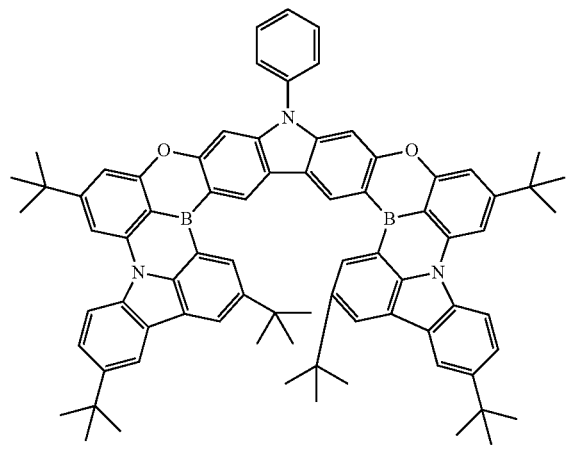
56
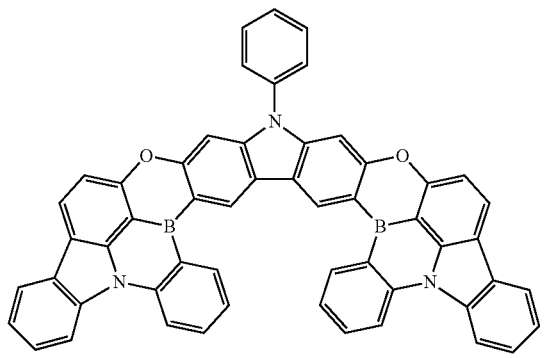
57
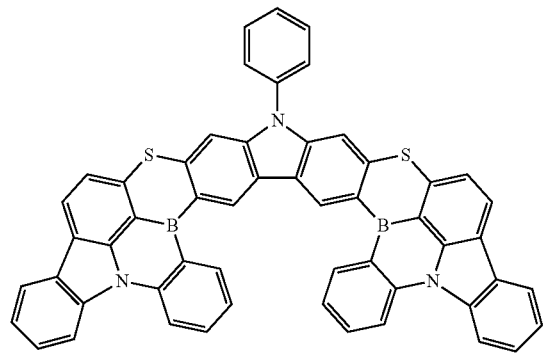
58
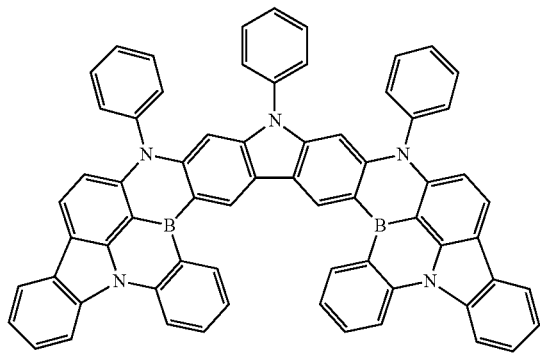
59
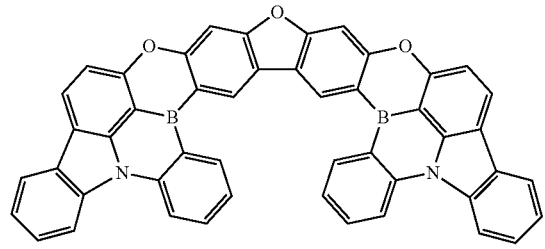
60
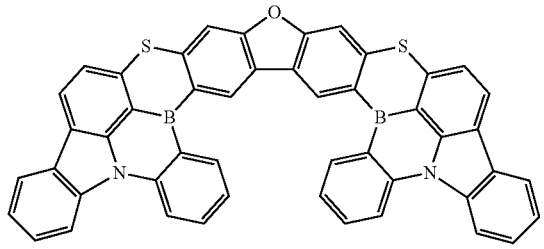
61
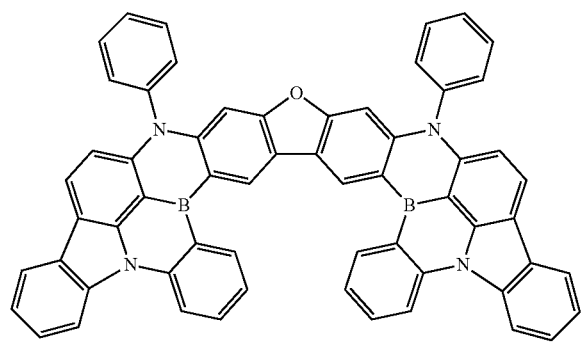
62
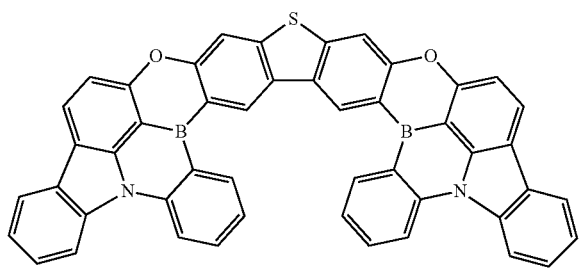

-continued
63
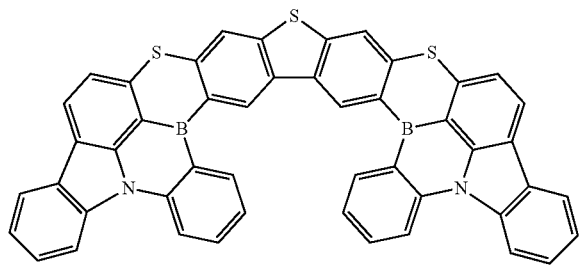
64
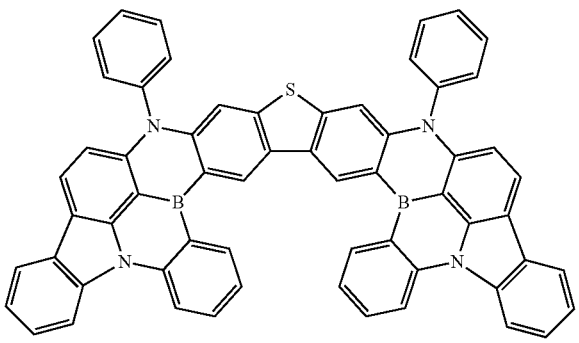
[Compound Group 2]
65
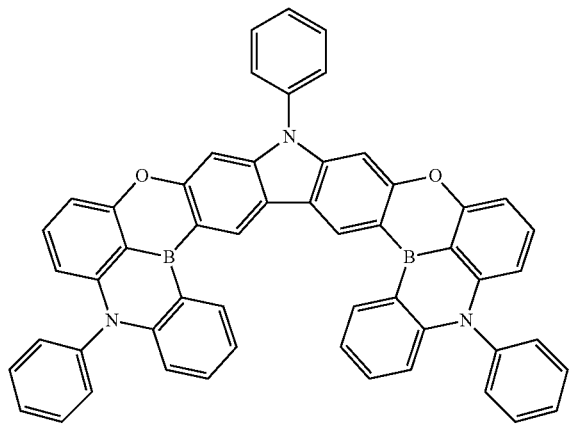
66
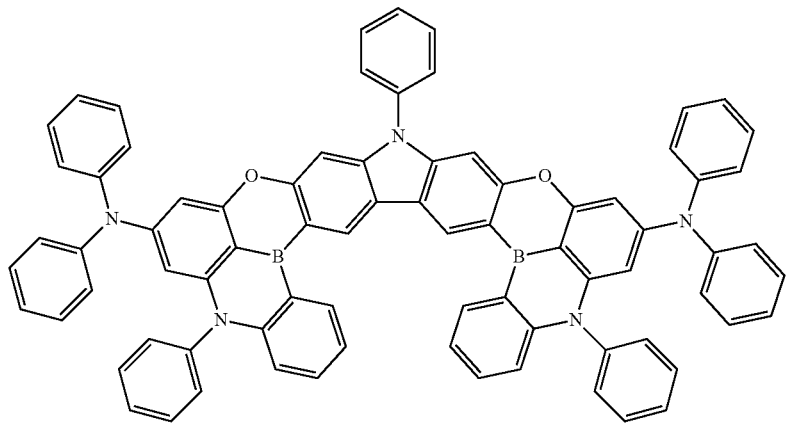
67
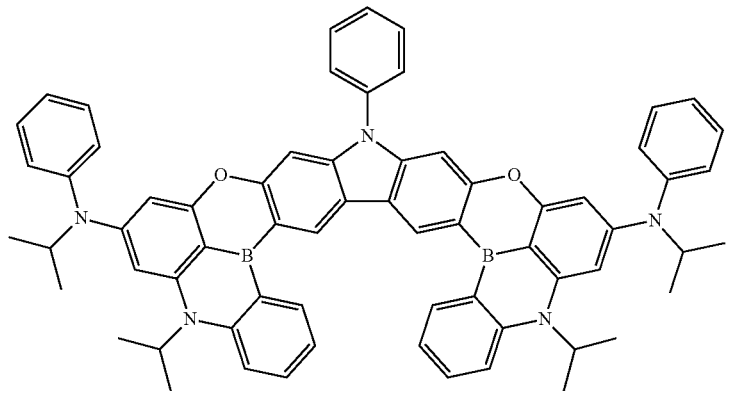

-continued
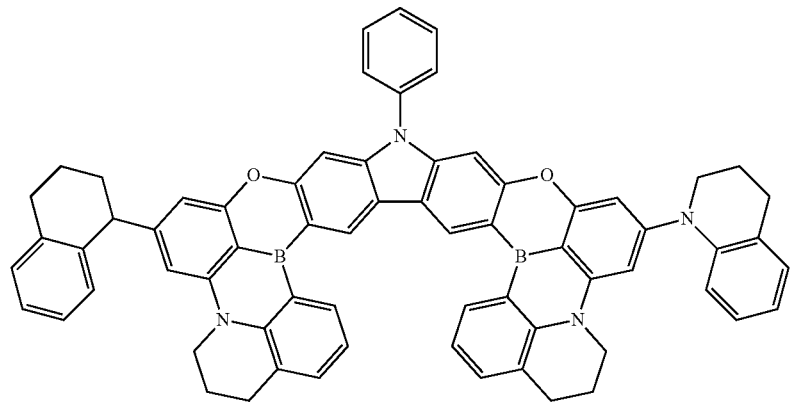
68
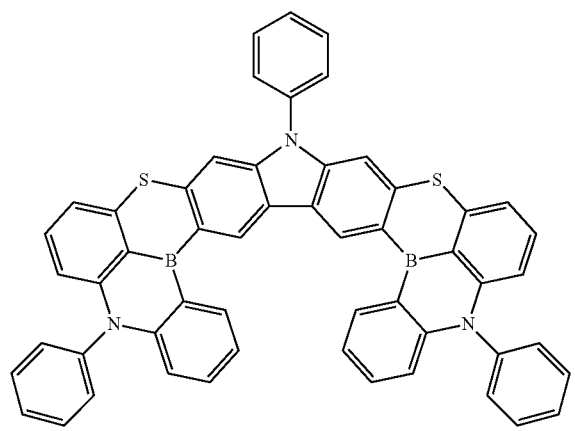
69
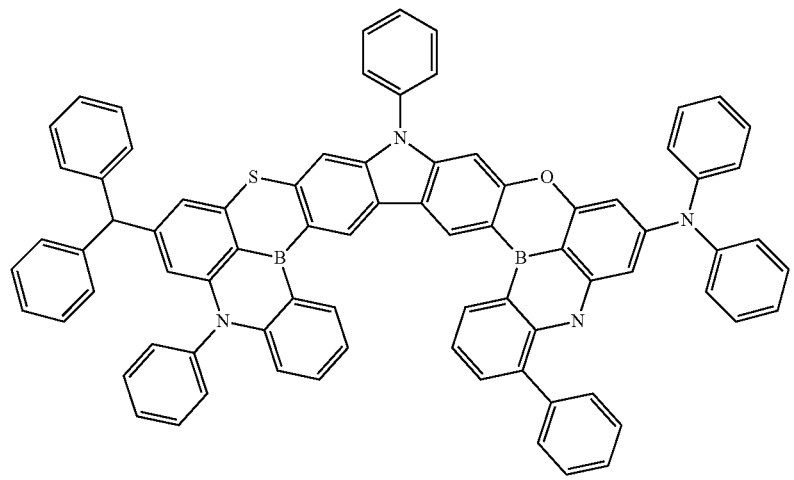
70

-continued
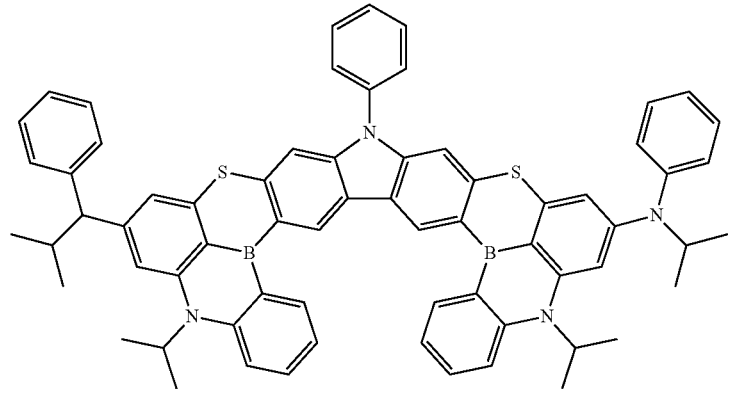
71
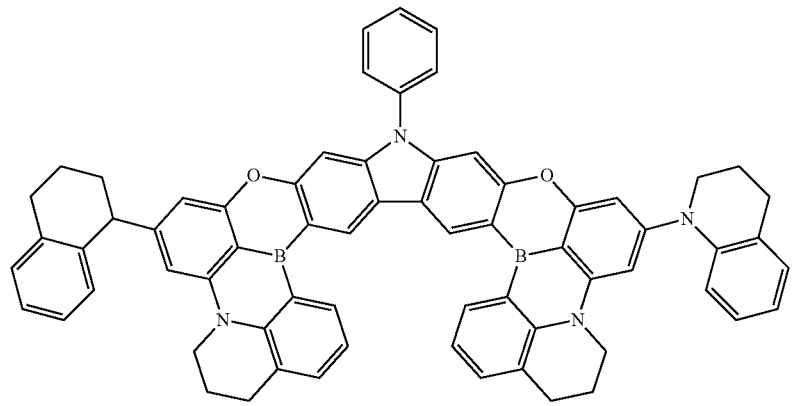
72
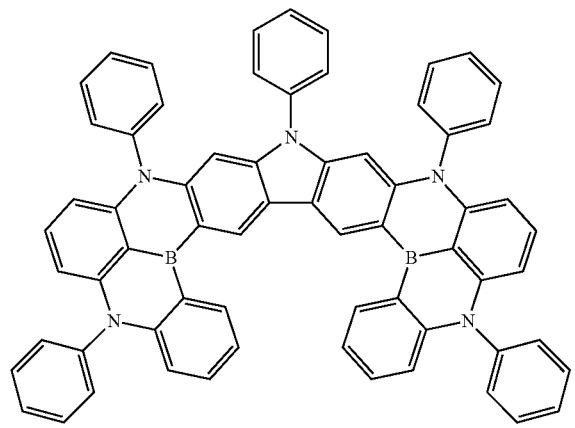
73
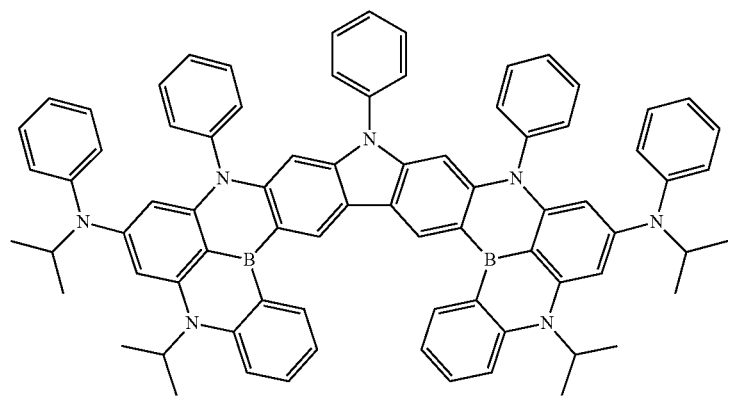
75

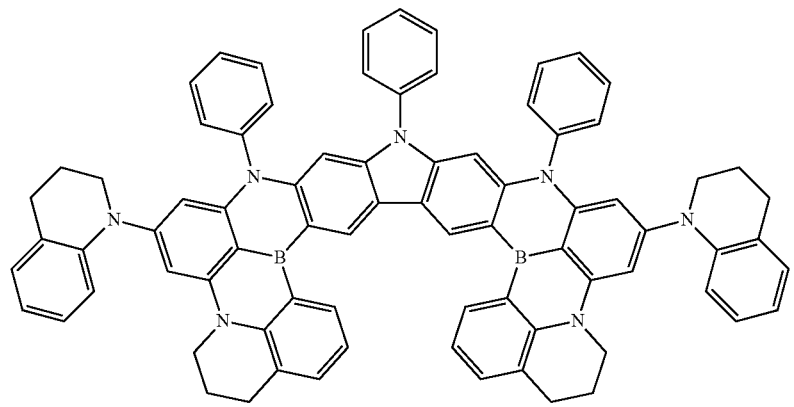
76
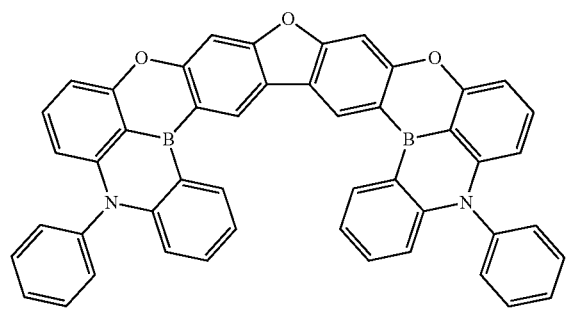
77
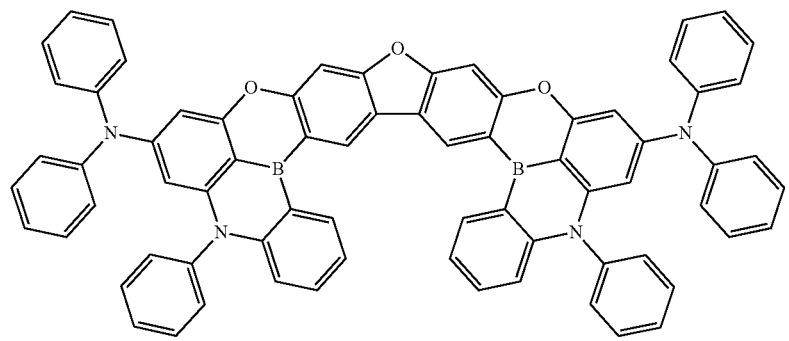
78
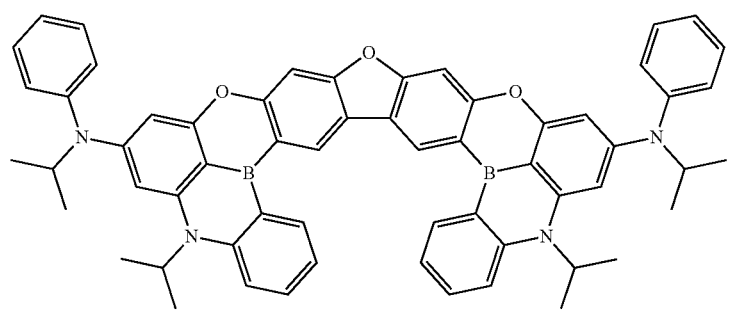
79
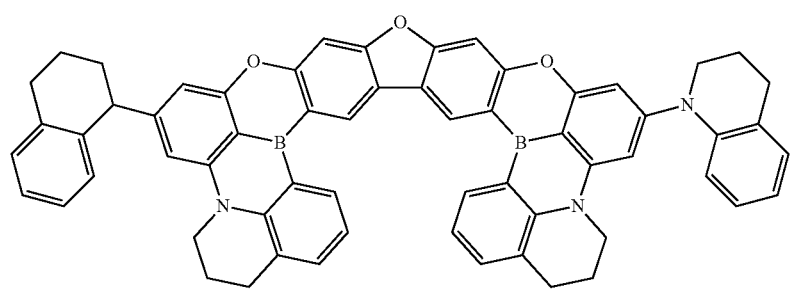
80

-continued
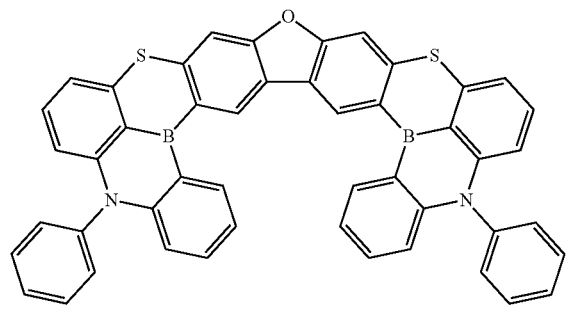
81
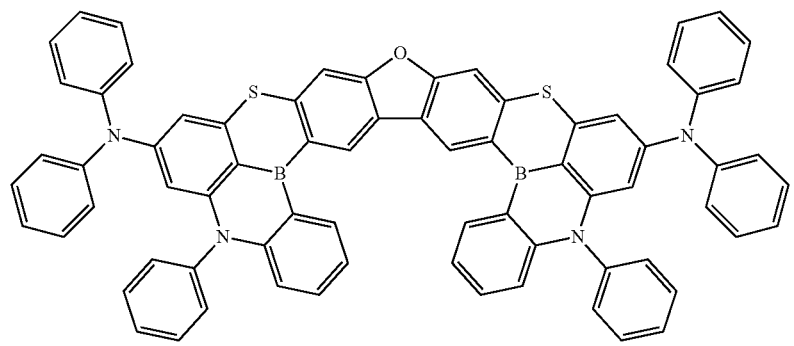
82
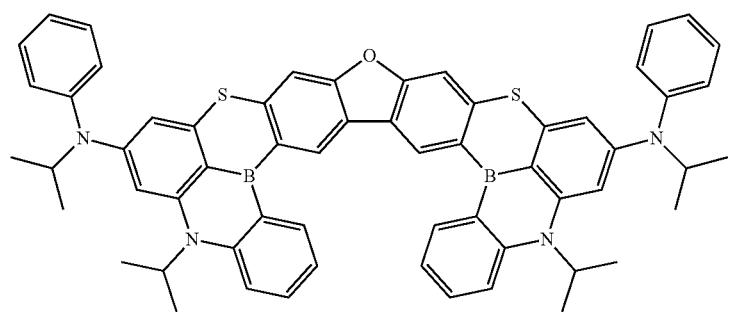
83
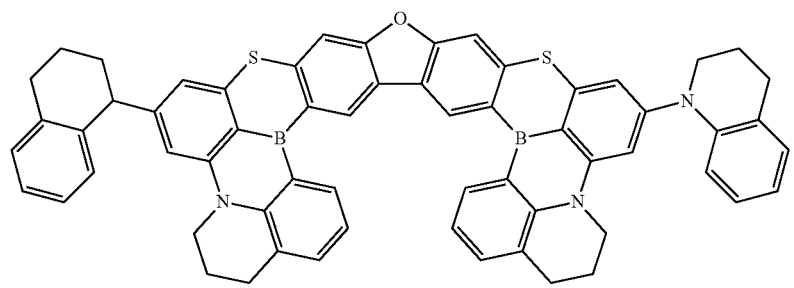
84
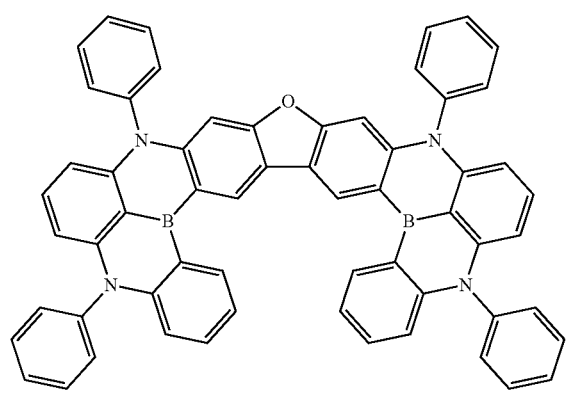
85

-continued
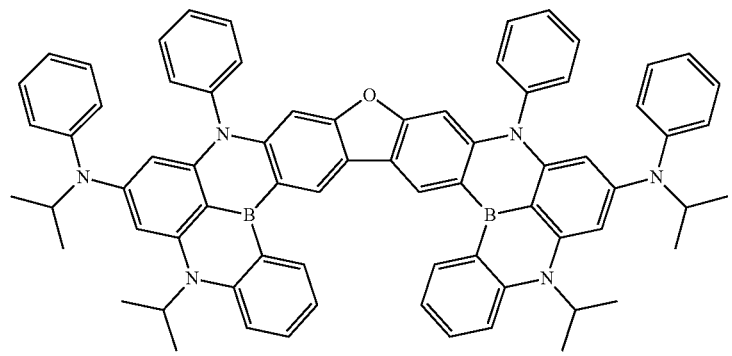
87
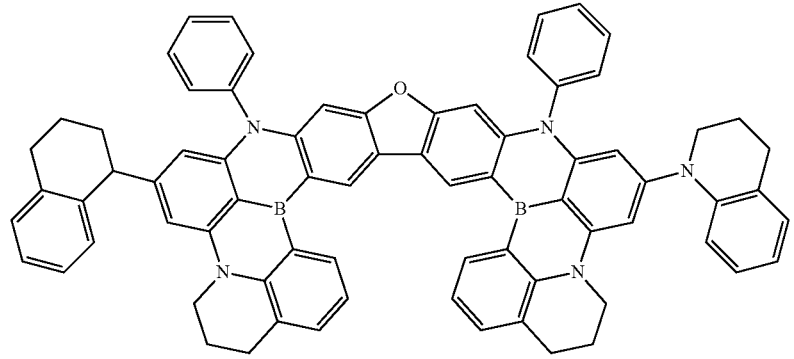
88
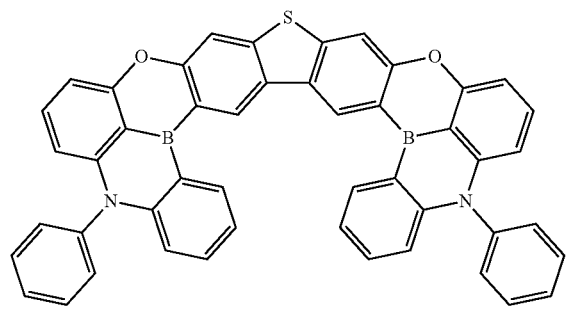
89
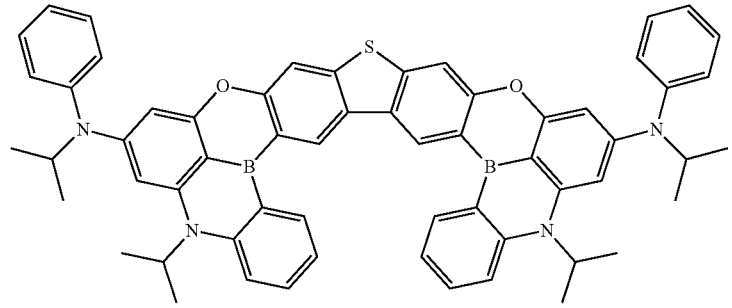
91
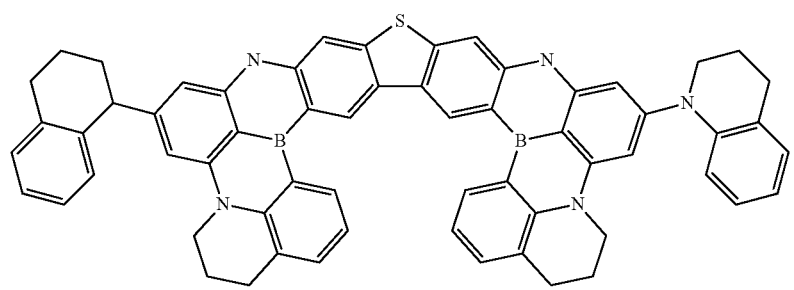
92

-continued
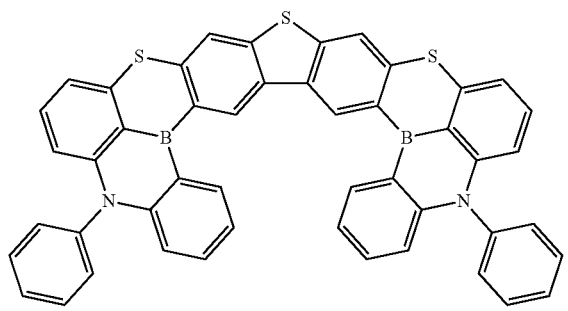
93
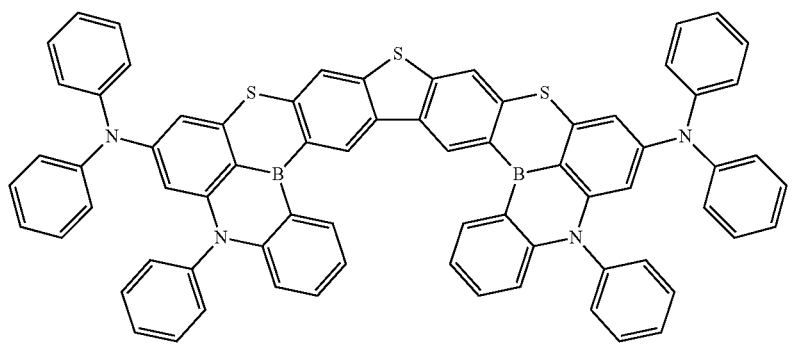
94
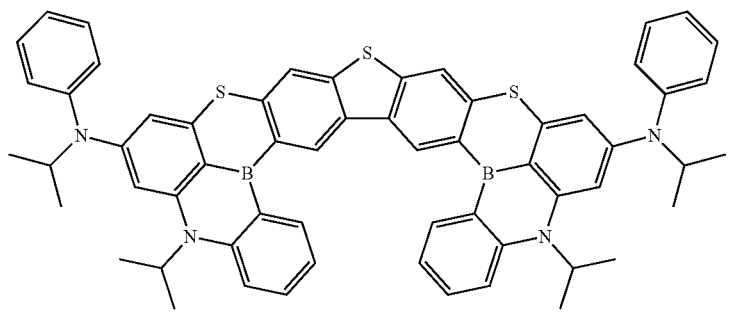
95
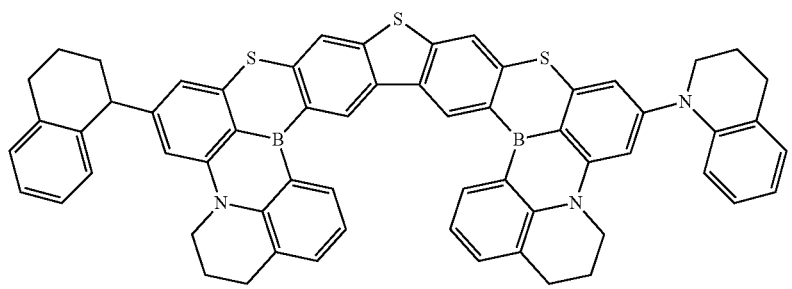
96
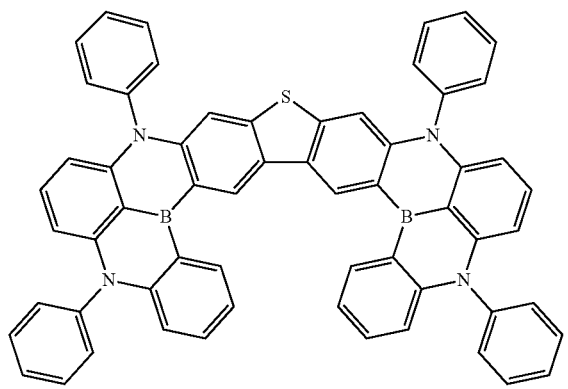
97

-continued
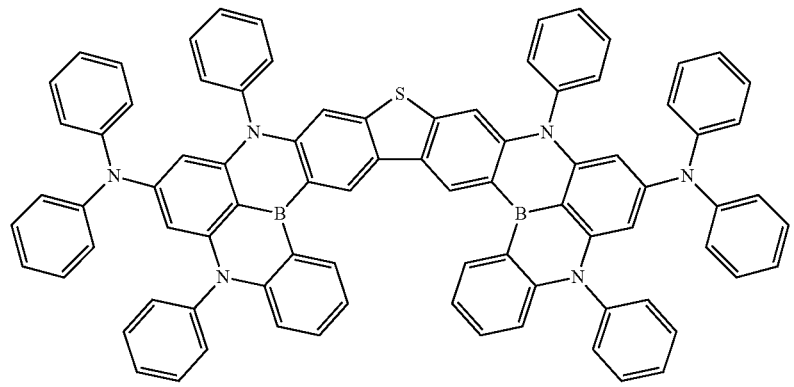
98
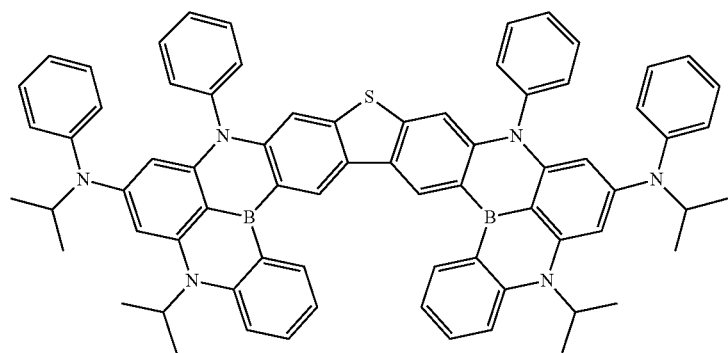
99
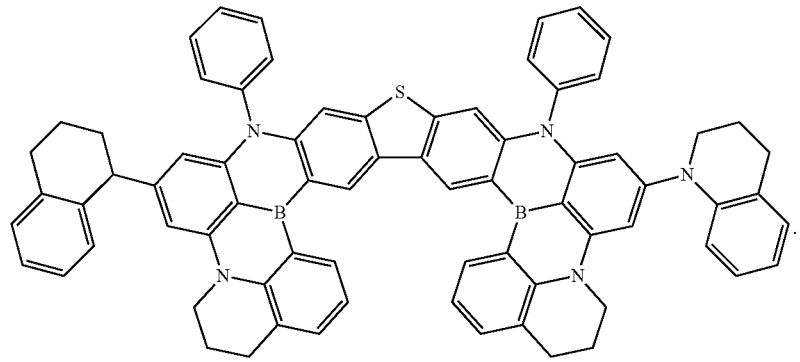
100
* * * * *